US012660407B2

(12) United States Patent
Pan et al.

(10) Patent No.: US 12,660,407 B2
(45) Date of Patent: Jun. 16, 2026

(54) POLYMERS, FORMULATIONS, ORGANIC OPTOELECTRONIC DEVICES, AND APPLICATIONS THEREOF

(71) Applicant: Zhejiang Brilliant Optoelectronic Technology Co.,Ltd., Taizhou (CN)

(72) Inventors: Junyou Pan, Taizhou (CN); Hong Huang, Taizhou (CN)

(73) Assignee: Zhejiang Brilliant Optoelectronics Technology Co., Ltd., Taizhou (CN)

( * ) Notice: Subject to any disclaimer, the term of this patent is extended or adjusted under 35 U.S.C. 154(b) by 704 days.

(21) Appl. No.: 18/301,893

(22) Filed: Apr. 17, 2023

(65) Prior Publication Data

US 2023/0320112 A1 Oct. 5, 2023

Related U.S. Application Data

(63) Continuation of application No. PCT/CN2021/123841, filed on Oct. 14, 2021.

(30) Foreign Application Priority Data

Apr. 7, 2021 (CN) ......................... 202110370854.9

(51) Int. Cl.

| | |
|---|---|
| ***H10K 50/10*** | (2023.01) |
| ***C08F 112/32*** | (2006.01) |
| ***C08F 130/06*** | (2006.01) |
| ***C08F 230/06*** | (2006.01) |

(52) U.S. Cl.

CPC ............ *H10K 50/10* (2023.02); *C08F 112/32* (2013.01); *C08F 130/06* (2013.01); *C08F 230/06* (2013.01)

(58) Field of Classification Search

CPC ..... H10K 50/10; C08F 112/32; C08F 130/06; C08F 230/06

USPC ..................................................... 252/301.16

See application file for complete search history.

(56) References Cited

U.S. PATENT DOCUMENTS

| | | | |
|---|---|---|---|
| 2009/0134784 A1 | 5/2009 | Lin et al. |
| 2014/0246657 A1 | 9/2014 | Kim et al. |
| 2015/0021586 A1 | 1/2015 | Lecloux et al. |
| 2018/0069182 A1 | 3/2018 | Hatakeyama et al. |

FOREIGN PATENT DOCUMENTS

| | | | |
|---|---|---|---|
| CN | 100471827 C | 3/2009 |
| CN | 1914293 B | 12/2010 |
| CN | 102224614 B | 4/2014 |
| CN | 102428158 B | 6/2014 |
| CN | 102369256 B | 2/2015 |
| CN | 102639671 B | 12/2015 |
| CN | 107266484 A | 10/2017 |
| CN | 111205313 A | 5/2020 |
| CN | 113698519 A | 11/2021 |
| WO | 2010135519 A1 | 11/2010 |
| WO | 2011110277 A1 | 9/2011 |
| WO | 2011141110 A2 | 11/2011 |
| WO | 2015033559 A1 | 3/2015 |
| WO | 2016117848 A1 | 7/2016 |
| WO | 2016117861 A1 | 7/2016 |
| WO | 2016171429 A2 | 10/2016 |
| WO | 2019128875 A1 | 7/2019 |

OTHER PUBLICATIONS

CN107266484 A—English translation (Year: 2017).*

Boyle et al., Composites, ASM Handbook, 2001, 21, Chapter Epoxy Resins, pp. 78-89, dated Dec. 31, 2001.

Bulovic et al., Transparent light-emitting devices, Nature, 1996, 380, p. 29, dated Mar. 7, 1996.

Gu et al., Transparent organic light emitting devices, Applied Physics Letters, 1996, 68(19), p. 2606, dated May 6, 1996.

Helmut Kipphan et al., Handbook of Print Media Technologies and Production Methods, Springer-Verlag Berlin Heidelberg New York, 2001, ISBN 3-540-67326-1, Section 1.5, pp. 117-144, dated Dec. 31, 2001.

Newkome et al., Dendrimers and Dendrons: Concepts, Syntheses, Applications, Wiley-VCH Verlag GmbH & Co. KGaA, 2002, ISBN 3-527-29997-1, Section 3-4, pp. 51-190, dated Sep. 13, 2001.

Hatakeyama et al., Ultrapure Blue Thermally Activated Delayed Fluorescence Molecules: Efficient HOMO-LUMO Separation by the Multiple Resonance Effect, Advanced Materials, 2016, 28, pp. 2777-2781, dated Feb. 11, 2016.

* cited by examiner

*Primary Examiner* — Anita Nassiri-Motlagh

(74) *Attorney, Agent, or Firm* — Westbridge IP LLC

(57) ABSTRACT

Polymers including a repeating unit of the following formula I are disclosed. A repeating structural unit E is selected from a structural unit of the following formula (1) or (2). Mixtures and formulations containing the polymers are also disclosed.

9 Claims, No Drawings

POLYMERS, FORMULATIONS, ORGANIC OPTOELECTRONIC DEVICES, AND APPLICATIONS THEREOF

CROSS-REFERENCE TO RELATED APPLICATIONS

This application is a continuation of International Application No. PCT/CN2021/123841, filed on Oct. 14, 2021, which claims priority to Chinese Patent Application No. 202110370854.9, filed on Apr. 7, 2021. All of the aforementioned applications are incorporated herein by reference in their entireties.

TECHNICAL FIELD

The present disclosure relates to the field of electroluminescent materials, and in particular to polymers, mixtures, formulations, organic optoelectronic devices and applications thereof, especially in the field of organic photoluminescent and electroluminescent devices. The present disclosure also relates to organic optoelectronic devices comprising polymers of the present disclosure, and preparation methods therefor.

BACKGROUND

Due to the diversity of synthesis, realizability in large-area flexible devices, low manufacturing costs, and excellent optical and electrical properties, organic light-emitting diodes (OLEDs) have great potential for the realization of novel optoelectronic devices, such as in flat-panel displays and lighting applications. In order to improve the luminescence efficiency of the OLEDs, various light-emitting material systems based on fluorescent and phosphorescent materials have been developed. The organic light-emitting diodes based on phosphorescent materials have achieved quite great performance, e.g., almost 100% internal luminescence quantum efficiency has been achieved. The phosphorescent materials of practical value to date are iridium complexes and platinum complexes, however such complexes are costly because of rare and expensive raw materials and complex synthesis. In addition, although high luminous efficiency may be attained with iridium complexes and platinum complexes have high luminous efficiency, the low color purity remains an issue due to their wide emission spectrums. Hatakeyama et al. in 2016 found a class of BN compounds (see Hatakeyama et al., Adv. Mater. 2016, DOI: 10.1002/adma.201505491) that have high luminescence efficiency with a very narrow FWHM.

In order to fully utilize the advantages of organic materials, it is desired to prepare OLEDs by printing in large area and at low cost. The existing reported BN compounds and their analogues are not suitable for the printing process because of their relatively low molecular weight and structural rigidity.

Therefore, new material systems suitable for printing are yet to be developed.

SUMMARY

In one aspect, the present disclosure provides a polymer, comprising a repeating unit of formula I:

I

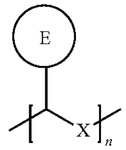

wherein n is an integer greater than or equal to 1, X is selected from O, S, $CR^1R^2$, $SiR^1R^2$, or $NR^3$, and the repeating structural unit E is selected from a structural unit of formula (1) or (2)

(1)

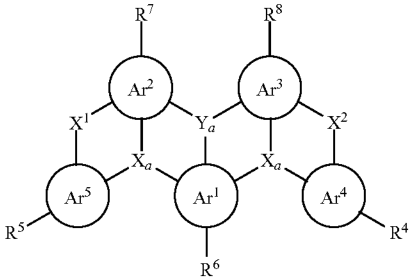

(2)

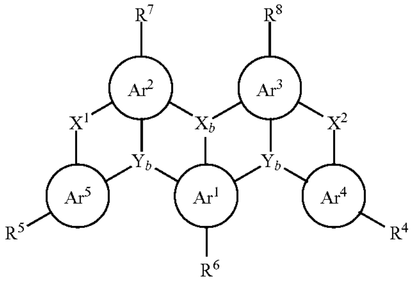

wherein:

each of $Ar^1$, $Ar^2$, and $Ar^3$ is independently an aromatic group containing 5 to 24 ring atoms, or a heteroaromatic group containing 5 to 24 ring atoms;

each of $Ar^4$ and $Ar^5$ is independently null, an aromatic group containing 5 to 24 ring atoms, or a heteroaromatic group containing 5 to 24 ring atoms;

each of $Y_a$ and $Y_b$ is independently B, P═O, $C(R^9)$, or $Si(R^9)$;

when neither $Ar^4$ nor $Ar^5$ is null, each of $X_a$ and $X_b$ is independently selected from the group consisting of N. $C(R^9)$, and $Si(R^9)$;

when $Ar^4$ and/or $Ar^5$ is null, each of the corresponding $X_a$ and $Y_b$ is independently selected from the group consisting of $N(R^9)$, $C(R^9R^{10})$, $Si(R^9R^{10})$, C═O, O, C═N$(R^9)$, C═$C(R^9R^{10})$, $P(R^9)$, P(═O)$R^9$, S, S═O, and $SO_2$;

each of $X^1$ and $X^2$ is independently null or a bridging group;

$R^1$ to $R^{10}$ are independently selected from the group consisting of —H, -D, —F, —Cl, —Br, —I, —CN, —$NO_2$, —$CF_3$, a $C_1$-$C_{20}$ linear alkyl group, a $C_1$-$C_{20}$ linear haloalkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic haloalkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ ketone group, a $C_2$-$C_{20}$ alkoxycarbonyl group, a $C_1$-$C_{20}$ aryloxycarbonyl group, a cyano group (—CN), a carbamoyl group (—C(═O)$NH_2$), a haloformyl group (—C(═O)—X where X represents a halogen atom), a formyl group (—C(═O)—H), an isocyano group, an isocyanate group, a thiocyanate group, an isothiocyanate group, a hydroxyl group, a nitro group, a $CF_3$ group, Cl, Br, F, a crosslinkable group, a substituted/unsubstituted aromatic/heteroaromatic group containing 5 to 40 ring atoms, an aryloxy/heteroaryloxy group containing 5 to 40 ring atoms, an arylamine/heteroarylamine group containing 5 to 40 ring atoms, and a disubstituted unit in any position of the above substituents and any combination thereof, wherein one or more of the substituent groups can form a monocyclic or polycyclic aliphatic or aromatic ring system with each other and/or with the ring bonded to the groups.

In another aspect, the present disclosure also provides a mixture, comprising the polymer as described herein, and at least one other organic functional material.

In yet another aspect, the present disclosure further provides a formulation, comprising the polymer as described herein, at least one organic solvent and/or an organic resin.

In yet another aspect, the present disclosure further provides an organic optoelectronic device, comprising a polymer as described herein.

Beneficial effects: the polymer as described herein has good solubility in organic solvents and good film-forming properties, meanwhile also maintaining a narrow emission spectral inherited from the monomer, thus providing a better material solution for printed OLEDs.

DETAILED DESCRIPTION OF THE EMBODIMENTS

The present disclosure provides a polymer, an organic electroluminescent device and the applications thereof, an organic optoelectronic device and a preparation method therefor. In order to make the objects, technical solutions, and effects of the present disclosure more clear and definite, the present disclosure is further described in details below. It should be understood that the embodiments described herein are only intended to explain the present disclosure, and are not intended to limit the present disclosure.

In one aspect, the present disclosure provides a polymer, comprising a repeating unit of formula I:

I

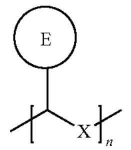

wherein n is an integer greater than or equal to 1, X is selected from O, S, $CR^1R^2$, $SiR^1R^2$, or $NR^3$, and a repeating structural unit E is selected from a structural unit of formula (1) or (2):

(1)

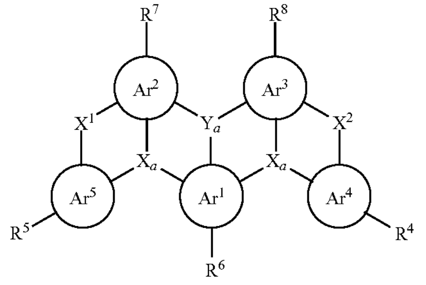

(2)

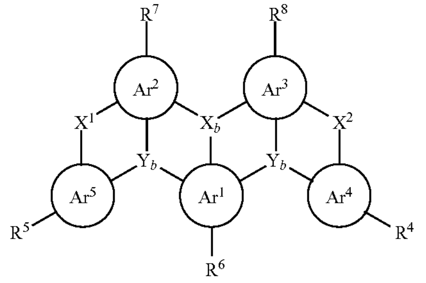

wherein:

each of $Ar^1$, $Ar^2$, and $Ar^3$ is independently an aromatic group containing 5 to 24 ring atoms, or a heteroaromatic group containing 5 to 24 ring atoms;

each of $Ar^4$ and $Ar^5$ is independently null, an aromatic group containing 5 to 24 ring atoms, or a heteroaromatic group containing 5 to 24 ring atoms;

each of $Y_a$ and $Y_b$ is independently B, P═O, C($R^9$), or Si($R^9$);

when neither $Ar^4$ nor $Ar^5$ is null, each of $X_a$, $X_b$ is independently selected from the group consisting of N, C($R^9$), and Si($R^9$);

when $Ar^4$ and/or $Ar^5$ is null, each of the corresponding $X_a$ and $Y_b$ is independently selected from the group consisting of N($R^9$), C($R^9R^{10}$), Si($R^9R^{10}$), C═O, O, C═N ($R^9$), C═C($R^9R^{10}$), P($R^9$), P(═O) $R^9$, S, S═O, and $SO_2$;

each of $X^1$ and $X^2$ is independently null or a bridging group;

$R^1$ to $R^{10}$ are independently selected from the group consisting of —H, -D, —F, —$C_1$, —Br, —I, —CN, —$NO_2$, —$CF_3$, a $C_1$-$C_{20}$ linear alkyl group, a $C_1$-$C_{20}$ linear haloalkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic haloalkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ ketone group, a $C_2$-$C_{20}$ alkoxycarbonyl group, a $C_7$-$C_{20}$ aryloxycarbonyl group, a cyano group (—CN), a carbamoyl group (—C(═O)$NH_2$), a haloformyl group (—C(═O)—X where X represents a halogen atom), a formyl group (—C(═O)—H), an isocyano group, an isocyanate group, a thiocyanate group, an isothiocyanate group, a hydroxyl group, a nitro group, a $CF_3$ group, Cl, Br, F, a crosslinkable group, a substituted/unsubstituted aromatic/heteroaromatic group containing 5 to 40 ring atoms, an aryloxy/heteroaryloxy group containing 5 to 40 ring atoms, an arylamine/heteroarylamine group containing 5 to 40 ring atoms, and a disubstituted unit in any position of the above substituents and any combination thereof, wherein one or more of the substituent groups can form a monocyclic or polycyclic aliphatic or aromatic ring system with each other and/or with the ring bonded to the groups.

In some embodiments, X is $CR^1R^2$; particularly preferably, X is $CH_2$.

In some embodiments, at least one of $X^1$ or $X^2$ is null; particularly preferably both are null, and the repeating structural unit E comprises a structural unit of formula (1b) or (2b):

(1b)

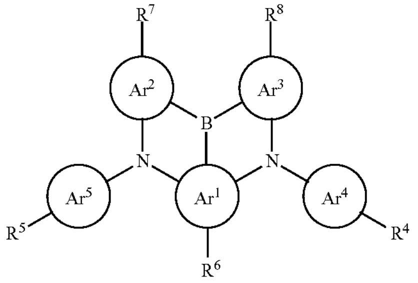

(2b)

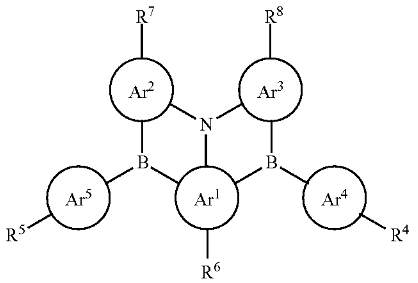

In some embodiments, at least one of $X^1$ or $X^2$ is a single bond; particularly preferably, both are single bonds, and the repeating structural unit E comprises a structural unit of formula (1c) or (2c):

(1c)

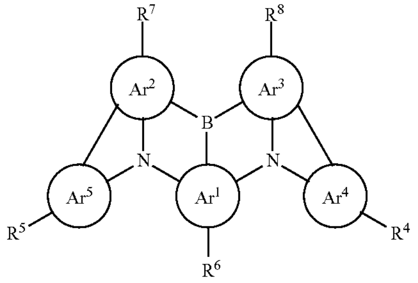

(2c)

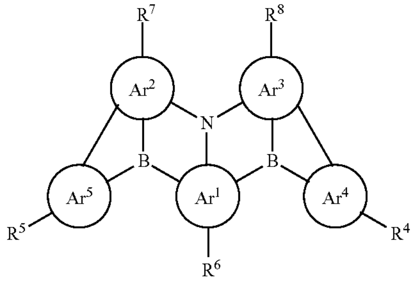

In some embodiments, $X^1$, $X^2$ at each occurrence are the same or different di-bridging group; the preferred di-bridging groups are represented by the following formulas:

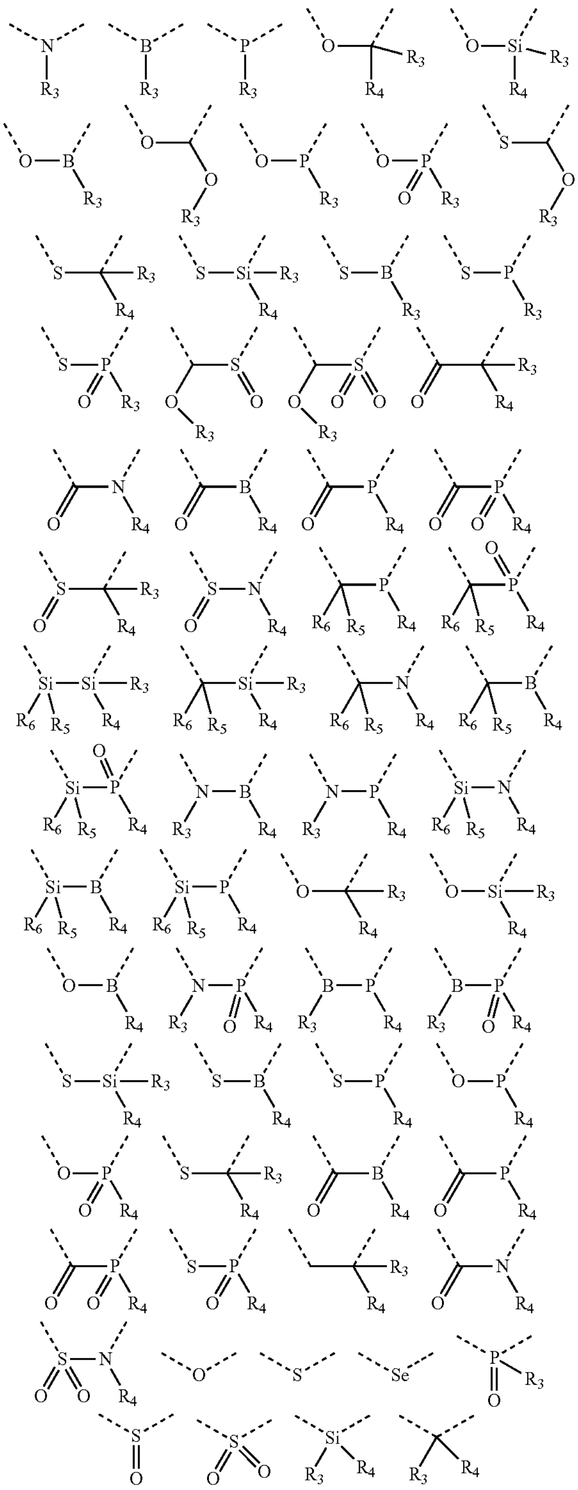

wherein $R_3$, $R_4$, $R_5$ and $R_6$ are identically defined as the above-mentioned $R^1$, and the dashed bonds refer to the covalent bonds connecting to the adjacent structural units.

For the purposes of the present disclosure, the aromatic ring systems contain 5 to 10 carbon atoms in the ring systems, and the heteroaromatic ring systems contain 1 to 10 carbon atoms and at least one heteroatom in the ring systems, while the total number of the carbon atoms and the heteroatoms is at least 4. The heteroatoms are preferably selected from Si, N, P, O, S and/or Ge, particularly preferably selected from Si, N, P, O and/or S. For the purposes of the present disclosure, the aromatic or heteroaromatic ring systems contain not only aromatic or heteroaromatic systems, but also a plurality of aromatic or heteroaromatic groups are interconnected by short non-aromatic units (<10% of non-H atoms, more specifically 5% of non-H atoms, such as C, N or O atoms). Therefore, systems such as 9,9'-spirobifluorene, 9,9-diarylfluorene, triarylamine, diaryl ether, and the like are also considered to be aromatic ring systems for the purpose of this disclosure.

For the purposes of the present disclosure, the any H atom in the structural unit of formulas (1)-(1e) or (2)-(2e) may be optionally substituted with a $R^1$ group, wherein $R^1$ may be selected from (1) a C1 to C10 alkyl group, particularly preferably as the following groups: methyl, ethyl, n-propyl, isopropyl, cyclopropyl, n-butyl, isobutyl, sec-butyl, t-butyl, cyclobuty, 2-methylbutyl, n-amyl, n-hexyl, cyclohexy, n-heptyl, cycloheptyl, n-octyl, cyclooctyl, 2-ethylhexyl, trifluoromethyl, pentafluoromethyl, 2,2,2-trifluoroethyl, vinyl, propenyl, butenyl, pentenyl, cyclopentenyl, hexenyl, cyclohexenyl, heptenyl, cyclohept enyl, octenyl, cyclooctenyl, ethynyl, propynyl, butynyl, pentynyl, hexynyl, and octynyl; (2) a C1 to C10 alkoxy group, particularly preferably methoxy, ethoxy, n-propoxy, isopropoxy, n-butoxy, isobutoxy, sec-butoxy, tert-butoxy, and 2-methylbutoxy; (3) a C2 to C10 aryl or heteroaryl group, which may be monovalent or divalent depending on the application, and in each case can also optionally substituted with the group $R^1$ mentioned above and may be linked to an aromatic or heteroaromatic ring at any desired position, particularly preferably selected from: benzene, naphthalene, anthracene, pyrene, dihydropyrene, chrysene, fluoranthene, naphthacene, pentacene, benzopyrene, furan, benzofuran, isobenzofuran, dibenzofuran, thiophene, benzothiophene, isobenzothiophene, thiofluorene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthromidazole, pyridoimidazole, pyrazine-imidazole, quinoxaline-imidazole, oxazole, benzoxazole, naphthoxazole, anthracenazole, phenoxazole, isoxazole, 1,2-thiazole, 1,3-thiazole, benzothiazole, pyridazine, benzopyridazine, pyrimidine, benzopyrimidine, quinoxaline, pyrazine, phenazine, 1,5-naphthyridine, carbazole, benzocholine, phenanhroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thinadiazole, 1,2,4-thiadiazole, 1,2,5-thiadiazole, 1,3,4-thiadiazole, 1,3,5-triazine, 1,2,4-triazine, 1,2,3-triazine, tetrazole. 1,2,4,5-tetrazine, 1,2,3,4-tetrazine, 1,2,3,5-tetrazine, purine, pteridine, indolizine, or benzothiadiazole. For the purposes of the present disclosure, aromatic and heteroaromatic ring systems are particularly considered to be, in addition to the above-mentioned aryl and heteroaryl groups, also refer to biphenylene, terphenylene, fluorene, spirobifluorene, dihydrophenanthrene, tetrahydropyrene, cis-indenofluorene, or trans-indenofluorene.

In some embodiments, in the structural unit of formulas (1)-(1e) or (2)-(2e), $Ar^1$ to $Ar^5$ may be same or different, at each occurrence, are independently selected from the group consisting of aromatic/heteroaromatic groups containing 5 to 20 ring atoms; preferably from the aromatic/heteroaromatic groups containing 5 to 18 ring atoms; more preferably from the aromatic/heteroaromatic groups containing 5 to 15 ring atoms; and most preferably from the aromatic/heteroaromatic groups containing 5 to 10 ring atoms; they may be unsubstituted or further substituted by one or two $R^1$ groups. Preferred aromatic/heterearomatic groups include benzene, naphthalene, anthracene, phenanthrene, pyridine, pyrene, and thiophene.

In some embodiments, $Ar^1$ to $Ar^5$ comprise the following structural formulas, which may each be substituted by one or more $R^1$ groups.

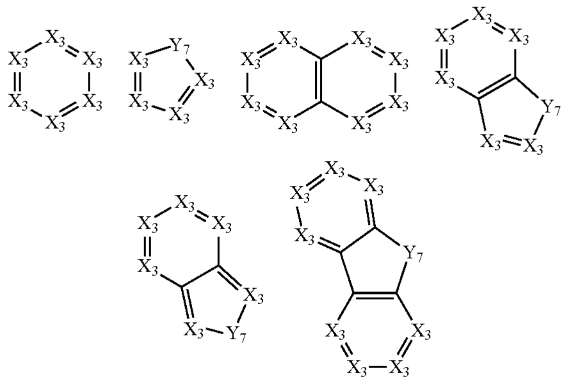

Each $X_3$ is $CR^6$ or N; each $Y_7$ is $CR^7R^8$, $SiR^9R^{10}$, $NR^6$, C(=O), S, or O.

Further, each of $Ar^1$, $Ar^2$, $Ar^3$, $Ar^4$, $Ar^5$ can be independently selected from one of the following structural formulas or any combination thereof, which can be further arbitrarily substituted:

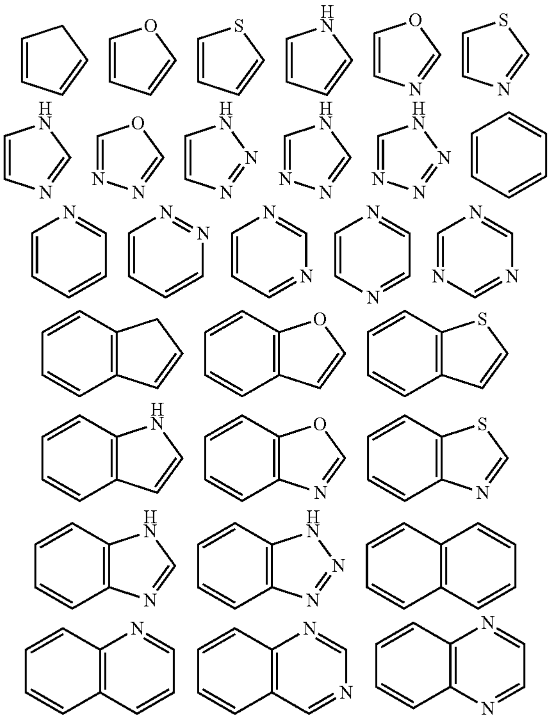

-continued

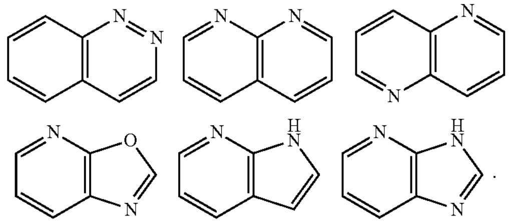

For the purposes of the present disclosure, in some embodiments, each of $Ar^1$ to $Ar^5$ is phenyl group in the structural units of formulas (1)-(1e) or (2)-(2e).

In some embodiments, in the polymer as described herein, the repeating structural unit E comprises a structural unit of formula (1a) or (2a):

(1a)

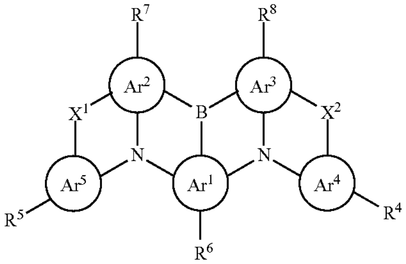

(2a)

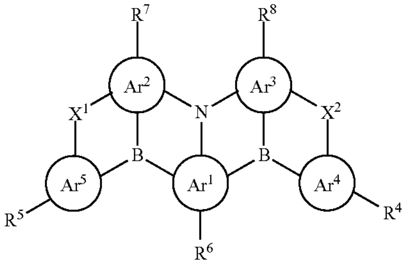

wherein each of $X^1$ and $X^2$ is O or S; and particularly preferably is O.

In some embodiments, the compound as described herein comprises a structural unit represented by one of the formulas (1d), (2d), (1e), (2e):

(1d)

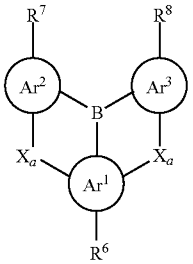

-continued (2d)

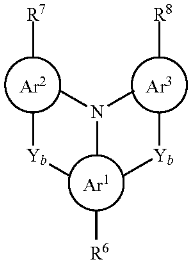

(1e)

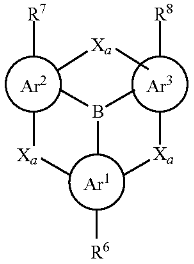

(2e)

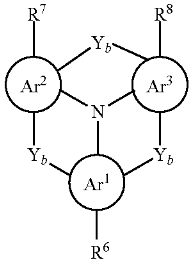

Preferably, each $Y_b$ in the formulas (2d) and (2e) is independently C═O, O, P(═O)$R^9$, S═O, or $SO_2$; and particular preferably is C═O.

Preferably, each $X_a$ in the formulas (1d) and (1e) is independently N($R^9$), C(R'$R^{10}$), Si(R'$R^{10}$), O, or S.

In some embodiments, in the structural units of formulas (1), (2), (1a)-(1e), (2a)-(2e), wherein $R^4$ to $R^8$ may be same or different, at each occurrence, comprising the following structural units or any combination thereof:

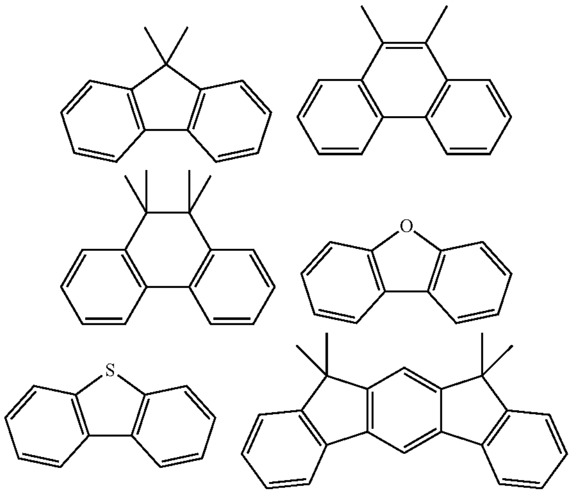

-continued

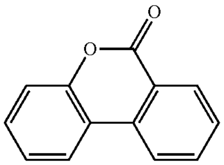
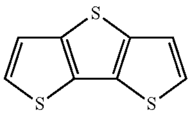
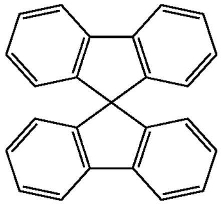
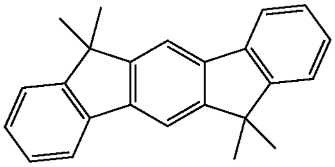
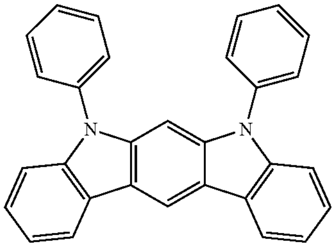
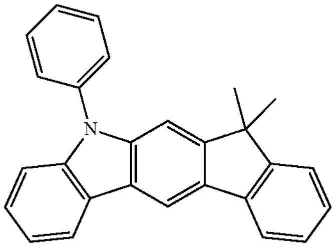
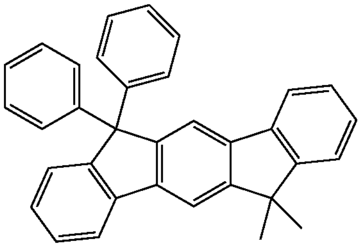
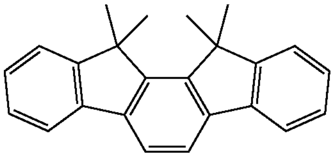
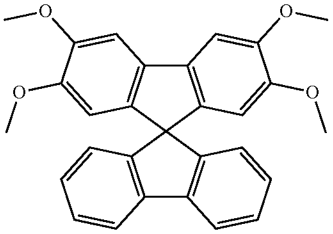
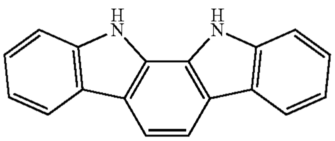
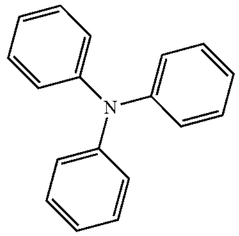

-continued

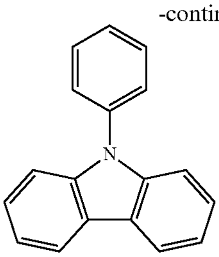
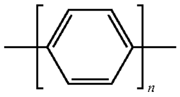
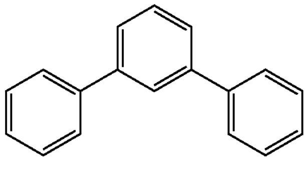
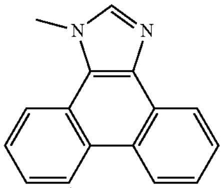
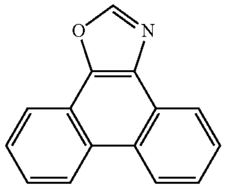
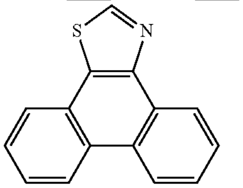
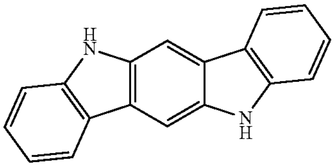
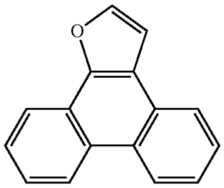
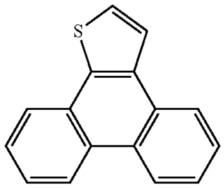
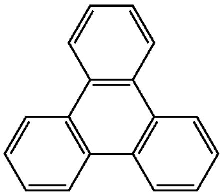
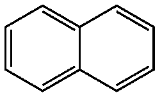
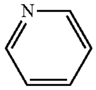
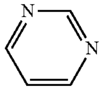
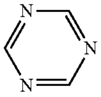
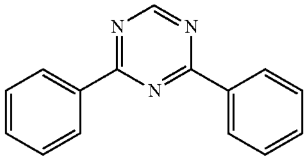
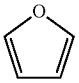
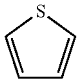
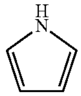
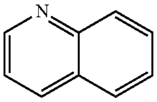
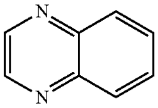
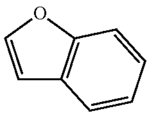
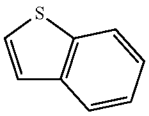

wherein n is 1, or 2, or 3, or 4.

In the embodiments of the present disclosure, triplet energy level (T1), singlet energy level (S1), highest occupied molecular orbital (HOMO), and lowest unoccupied molecular rrbital (LUMO) play key roles in the energy level structure of the organic material. The determination of these energy levels is introduced as follows.

HOMO and LUMO energy levels can be measured by photoelectric effects, for example by XPS (X-ray photoelectron spectroscopy) and UPS (ultraviolet photoelectron spectroscopy), or by cyclic voltammetry (hereinafter referred to as CV). Recently, quantum chemical methods, such as density functional theory (hereinafter referred to as DFT), are becoming effective methods for calculating the molecular orbital energy levels.

The triplet energy level Tl of an organic material can be measured by low-temperature time-resolved spectroscopy, or calculated by quantum simulation (for example, by Time-dependent DFT), for instance with the commercial software Gaussian 03W (Gaussian Inc.), the specific simulation method can be found in WO2011141110.

The singlet energy level S1 of an organic material can be determined by the absorption spectrum or the emission spectrum, and can also be obtained by quantum simulation calculation (such as Time-dependent DFT).

It should be noted that the absolute values of HOMO, LUMO, T1 and S1 may varies depend on the measurement method or calculation method used. Even for the same method, different ways of evaluation, for example using either the onset or peak value of a CV curve as reference, may result in different (HOMO/LUMO) values. Therefore, a reasonable and meaningful comparison should be carried out by using the same measurement and evaluation methods. In the embodiments of the present disclosure, the values of HOMO, LUMO, T1, and S1 are based on Time-dependent DFT simulation, which however should not exclude the applications of other measurement or calculation methods.

One advantage of the polymer as described herein is that the repeating units E are connected by the non-conjugated polymer backbones, such that high molecular weights are achieved while maintaining the energy structure of individual repeating unit, i.e., the HOMO, LUMO, S1 and T1 of the individual repeating unit remain essentially unchanged.

In some embodiments. (S1 (E)-T1 (E))≤0.30 eV, preferably ≤0.25 eV, more preferably ≤0.20 eV, even more preferably ≤0.15 eV, and most preferably ≤0.10 eV.

In the polymer as described herein, E is an emitter. Generally, the concentration of the emitter in the light-emitting layer has a certain range. In some embodiments, the content of the repeating unit E in the polymer is 0.1 mol % to 90 mol %.

In some embodiments, the content of the repeating unit E in the polymer is 1 mol % to 80 mol %, preferably 2 mol % to 70 mol %, more preferably 3 mol % to 50 mol %, and most preferably 3 mol % to 30 mol %.

In the embodiments of the present disclosure, the terms “host material”, “matrix material” have the same meaning, and they are interchangeable with each other.

The term “small molecule” herein refers to a molecule that is no one of following: a polymer, an oligomer, a dendrimer, or a mixture. In particular, there are no repeating structures in the small molecule. The molecular weight of a small molecule is ≤3000 g/mol, preferably ≤2000 g/mol, and most preferably ≤1500 g/mol.

The term of polymer comprises homopolymer, copolymer, and block copolymer. Also in the present disclosure, the term of polymer comprises dendrimer. For the synthesis and application of the dendrimers please refer to [Dendrimers and Dendrons, Wiley-VCH Verlag GmbH & Co. KGaA, 2002, Ed. George R. Newkome, Charles N. Moorefield, Fritz Vogtle.].

The term “conjugated polymer” refers to a polymer with backbone mainly comprising sp2 hybrid orbitals of C atoms, for example, polyacetylene and poly(phenylene vinylene). The C atoms on the backbones can also be substituted by other non-C atoms. Moreover, the above-mentioned structure should still be considered as a conjugated polymer when the sp2 hybridization on the backbone is interrupted by natural defects. Also in the present disclosure, the backbone of conjugated polymer comprises aryl amines, aryl phosphines and other heteroarmotics, organometallic complexes, etc.

In the present disclosure, the repeating structural unit E can be independently selected from the same or different structural groups in multiple occurrences.

In some embodiments, the FWHM of the emission spectrum of the polymer is ≤55 nm, preferably ≤45 nm, more preferably ≤40 nm, particularly preferably ≤35 nm, and most preferably ≤30 nm.

The following are given as suitable examples of repeating structural units as described herein, which can be further arbitrarily substituted:

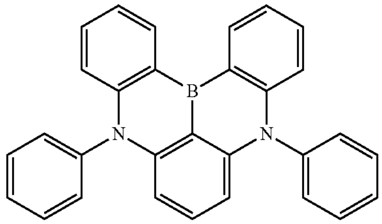

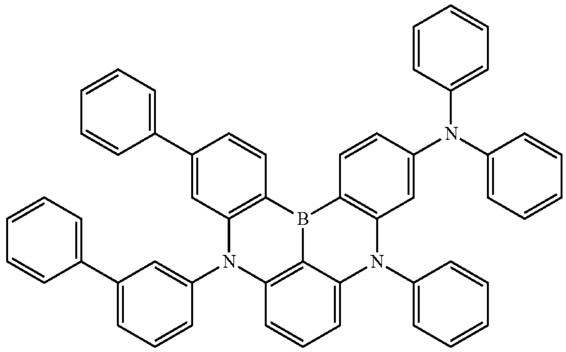

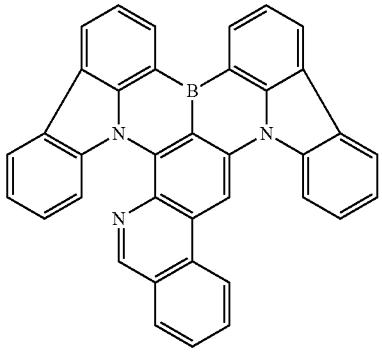

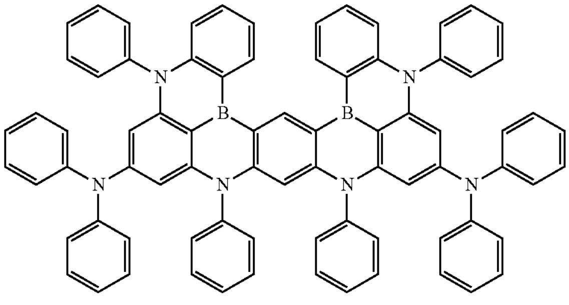

-continued
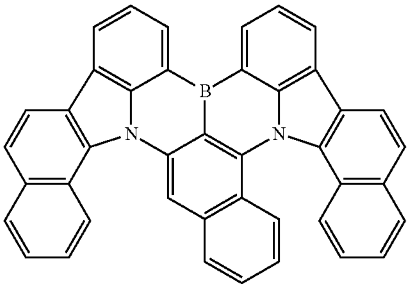
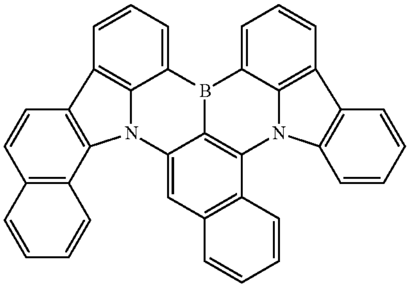
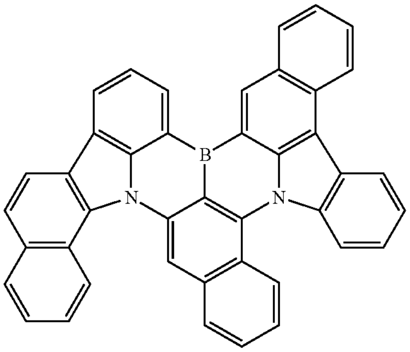
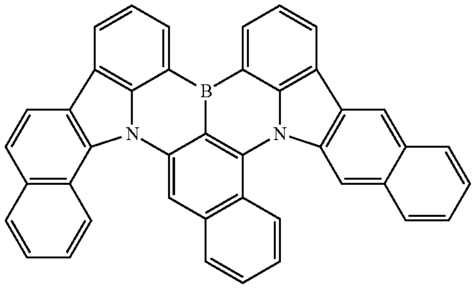
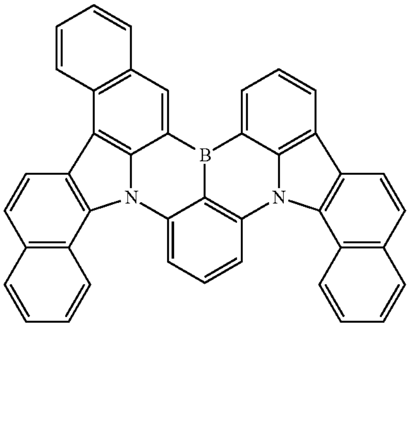
-continued
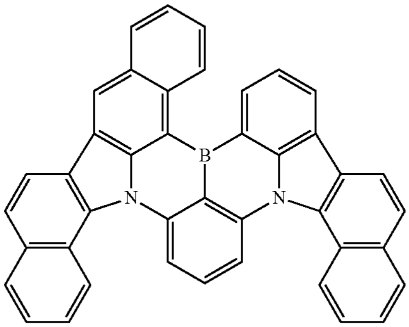
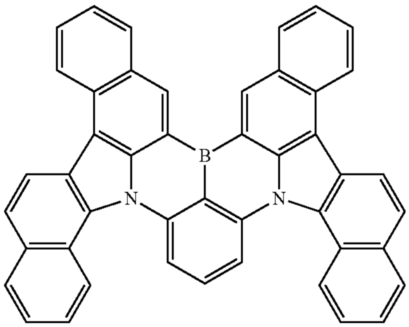
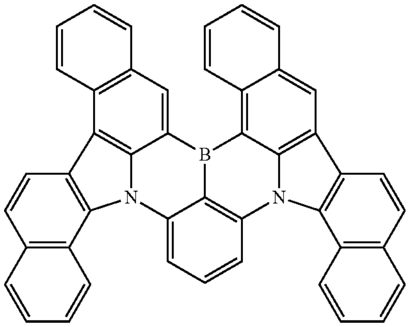
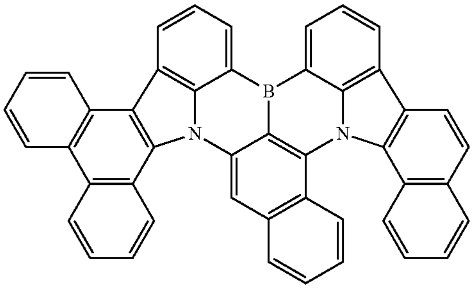
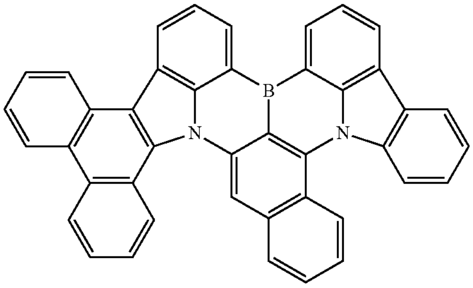

-continued
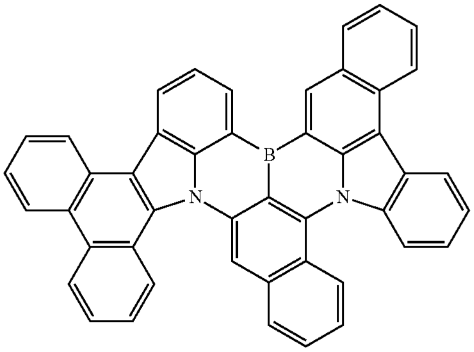
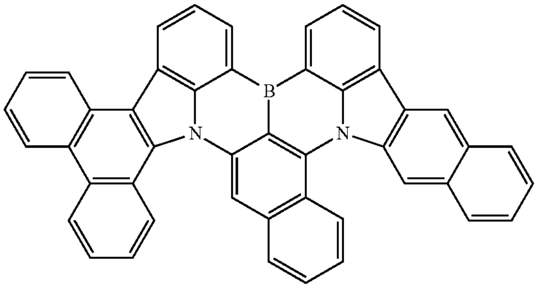
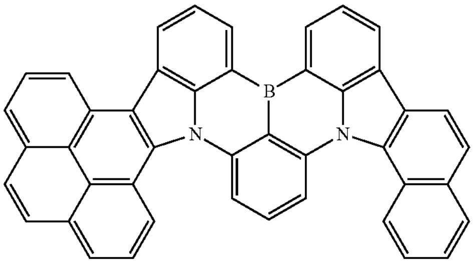
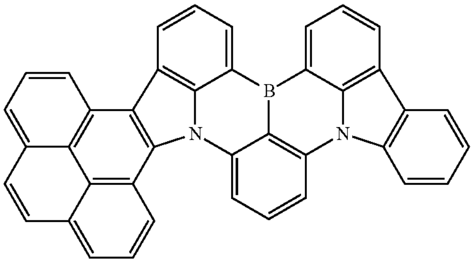
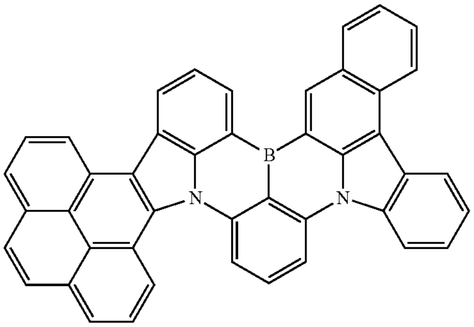
-continued
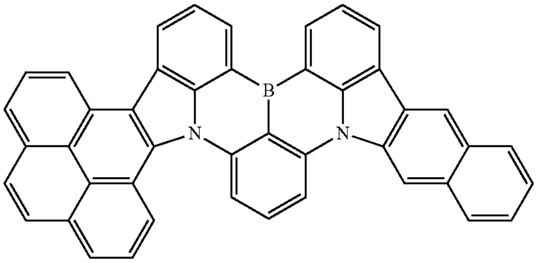
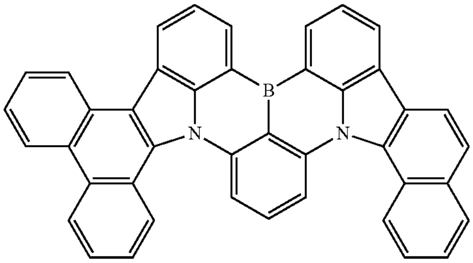
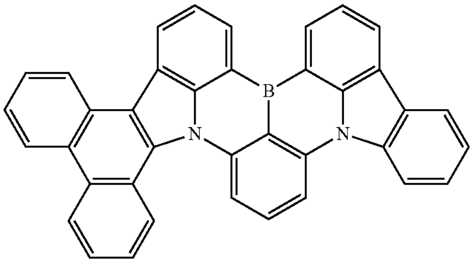
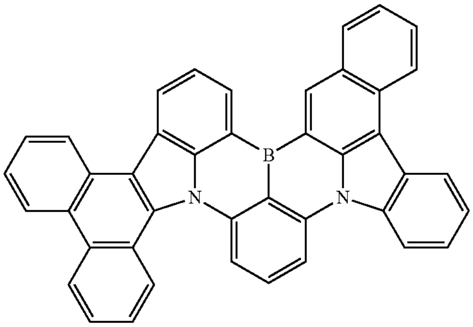
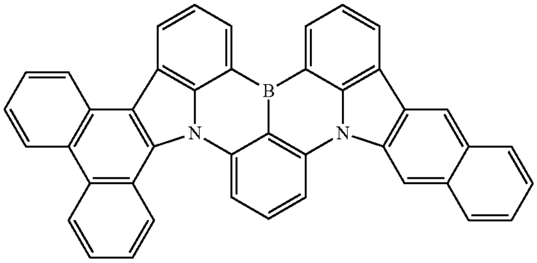

-continued
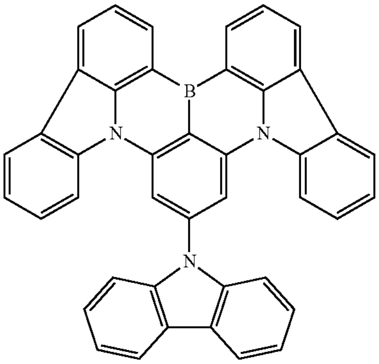
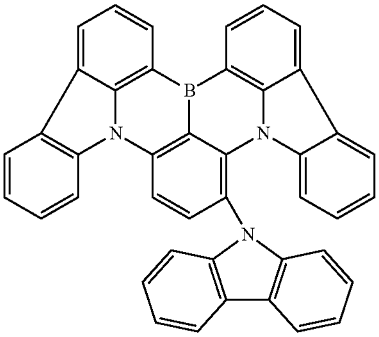
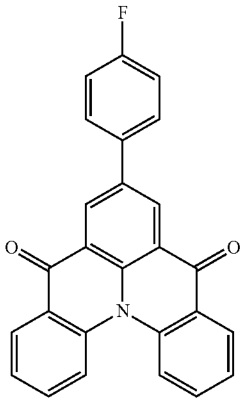
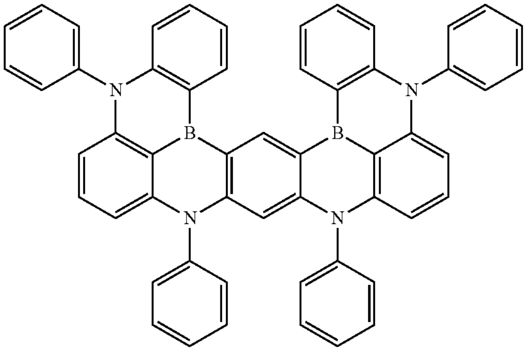
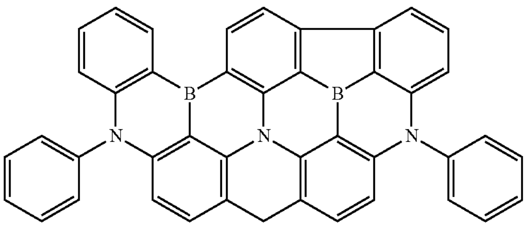
-continued
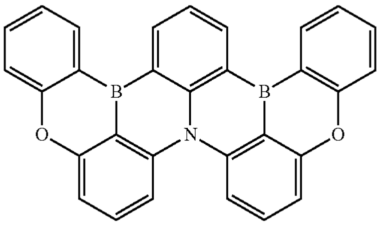
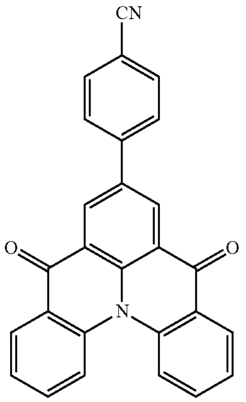
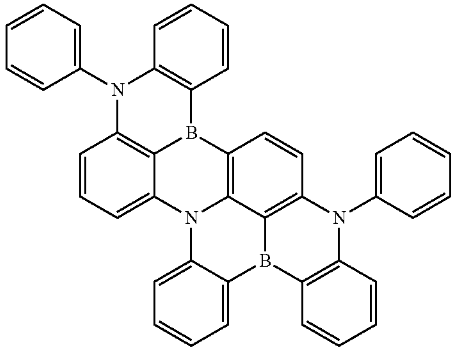
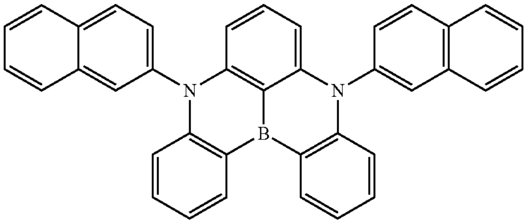
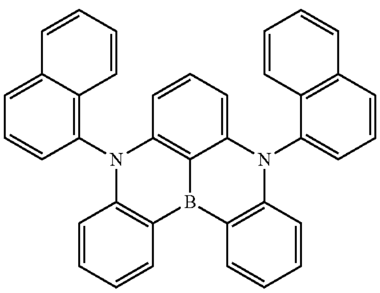

-continued
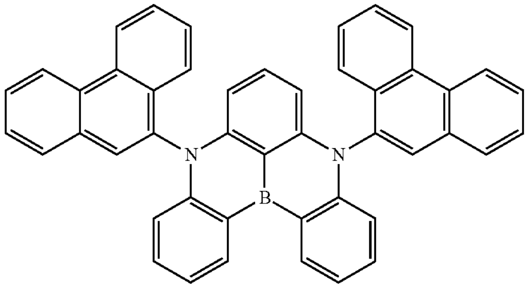
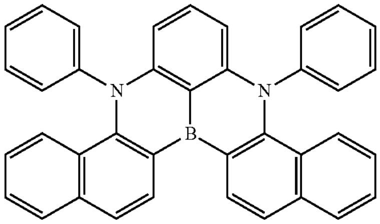
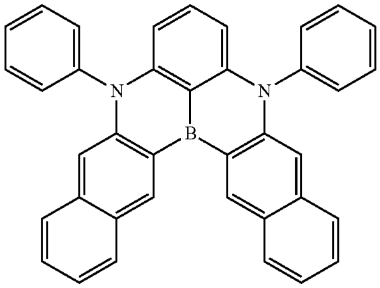
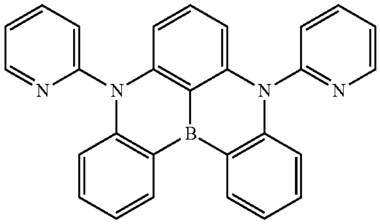
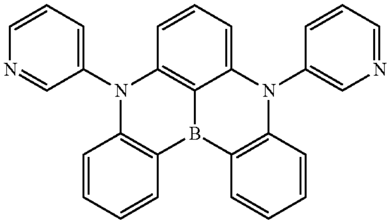
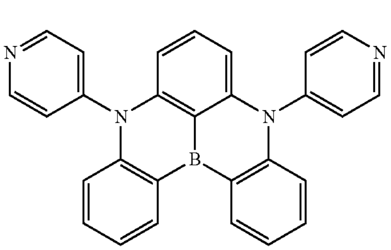
-continued
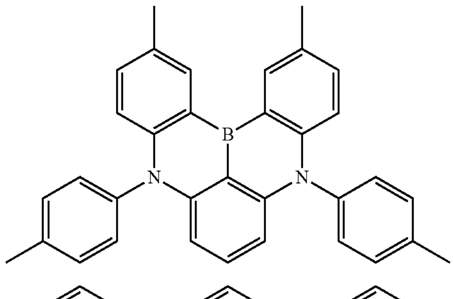
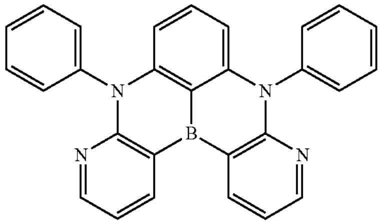
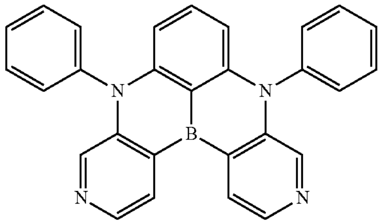
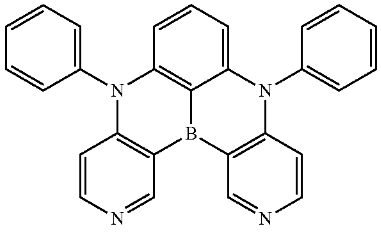
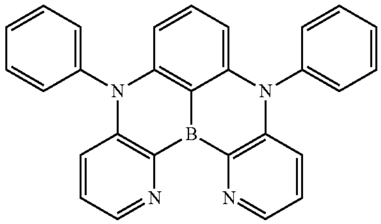
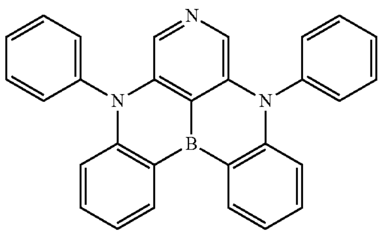
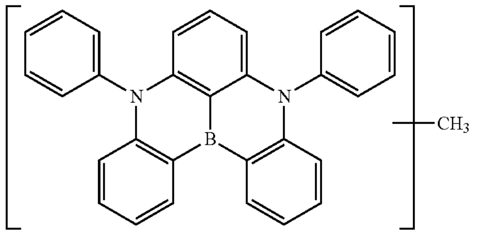

-continued
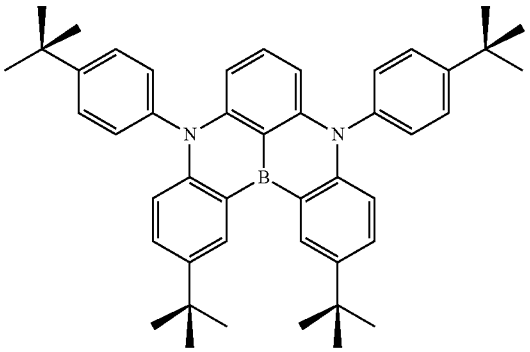
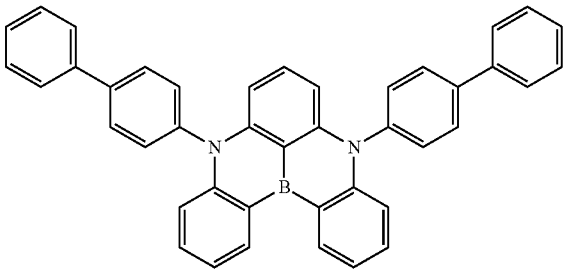
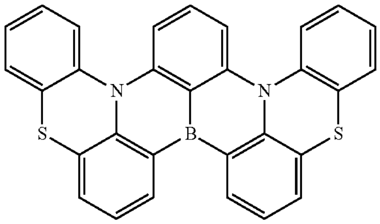
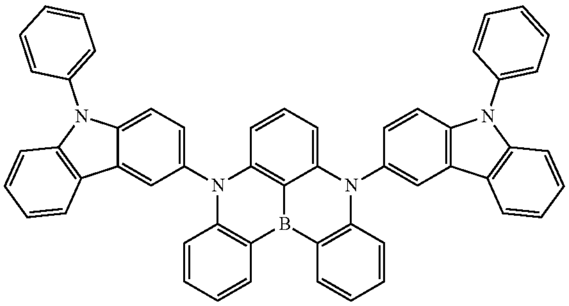
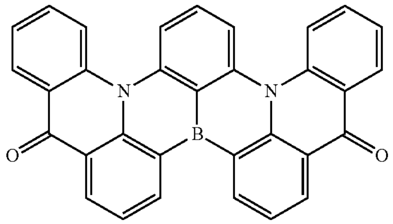
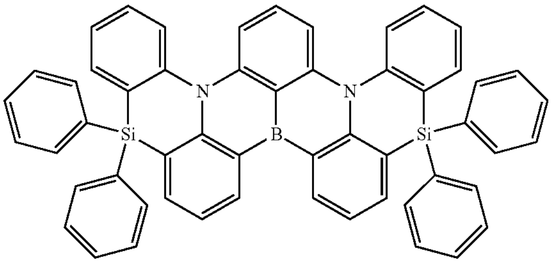
-continued
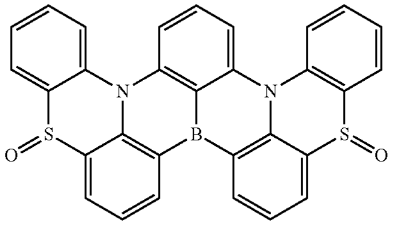
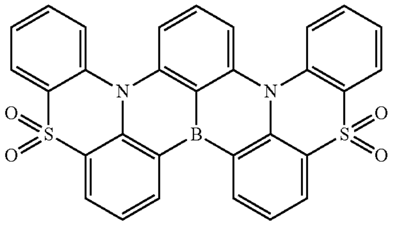
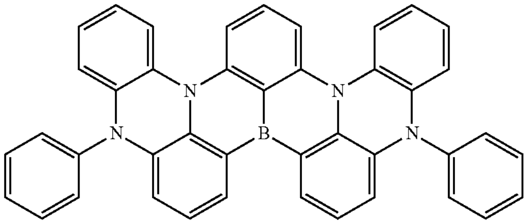
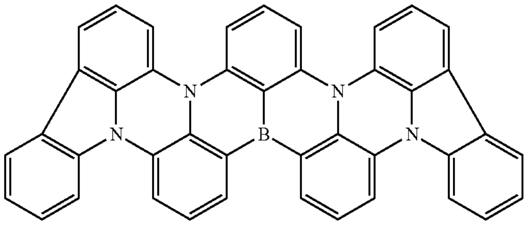
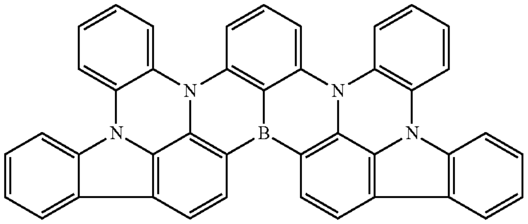
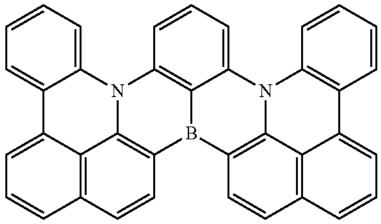
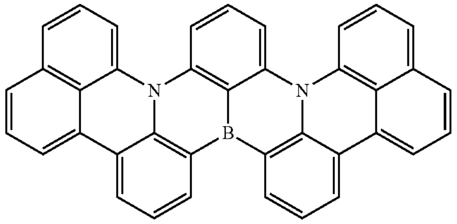

-continued
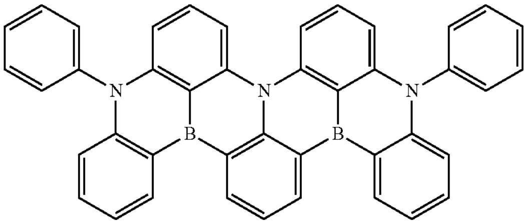
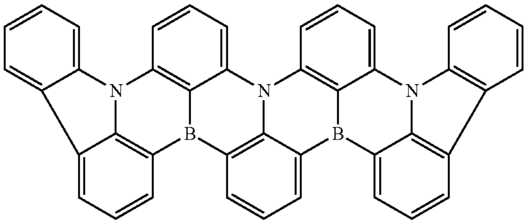
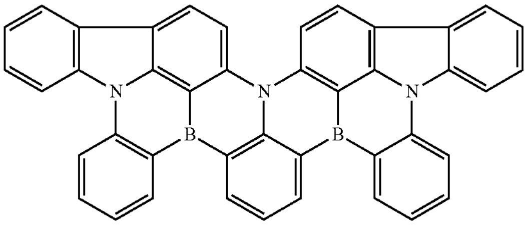
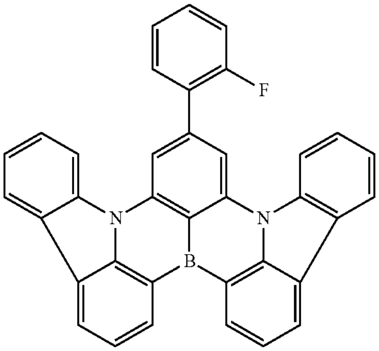
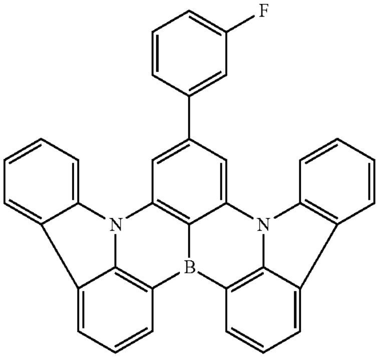
-continued
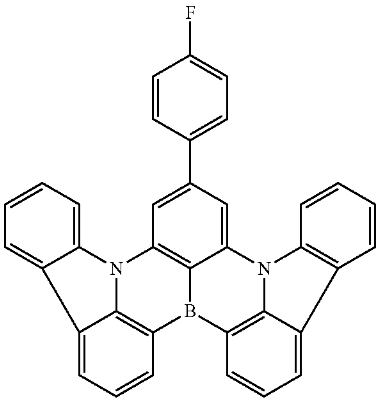
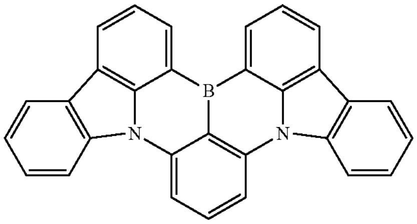
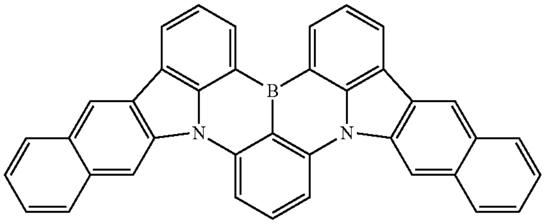
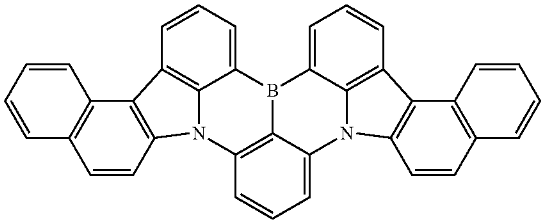
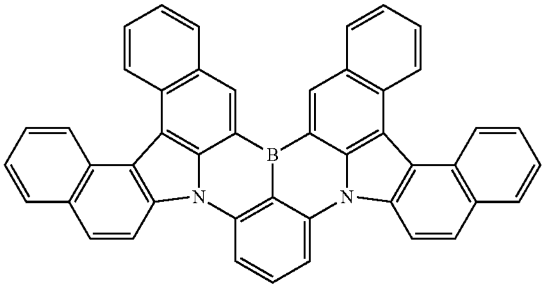
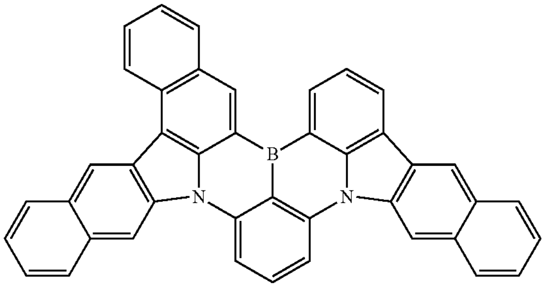

-continued
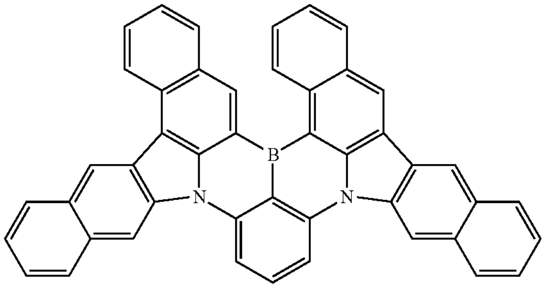
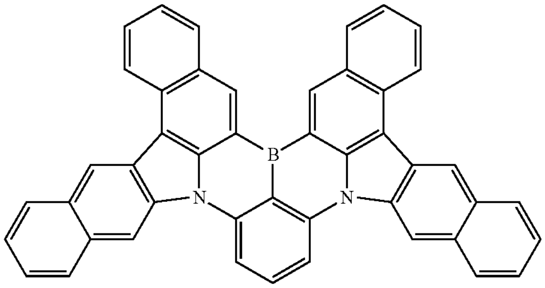
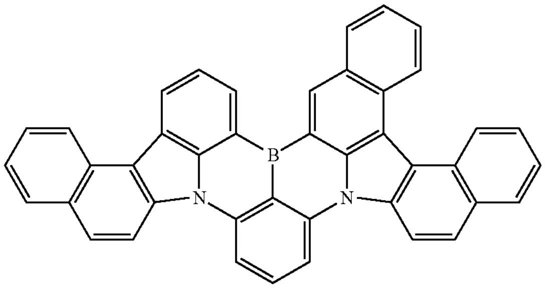
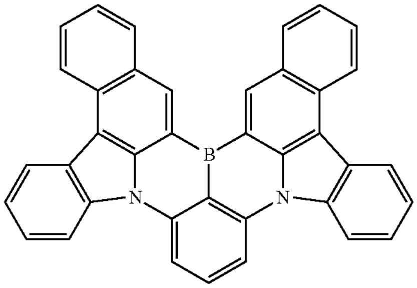
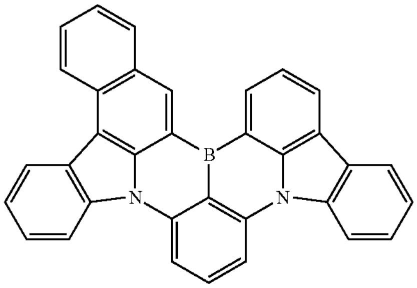
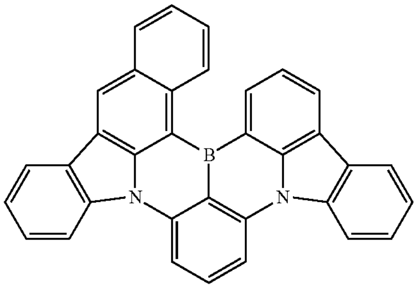
-continued
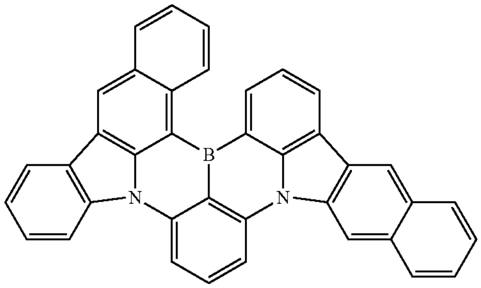
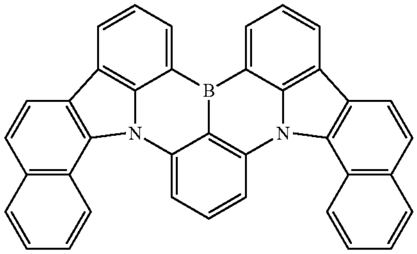
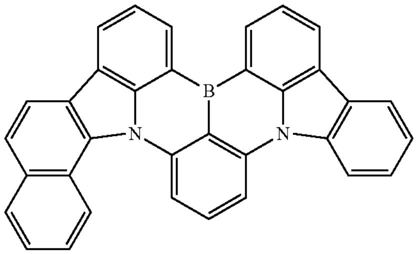
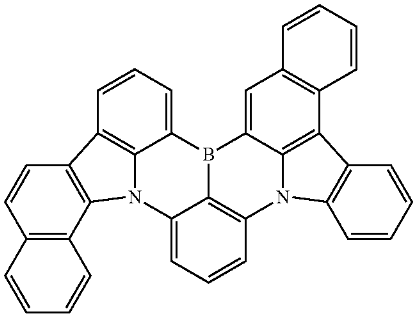
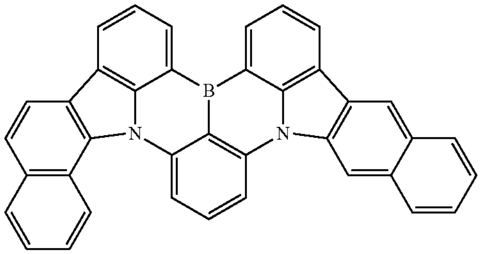
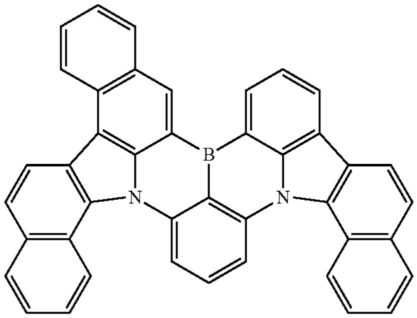

-continued
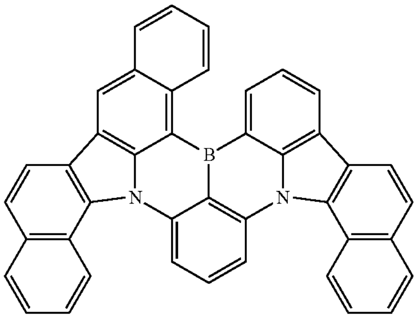
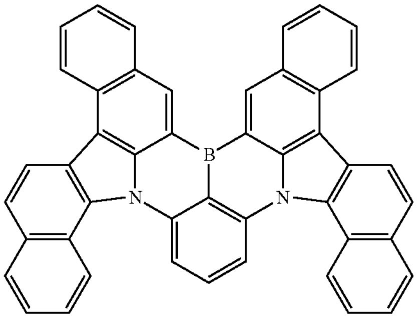
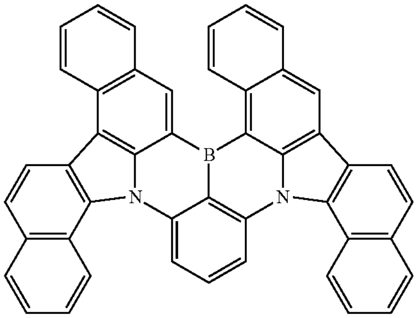
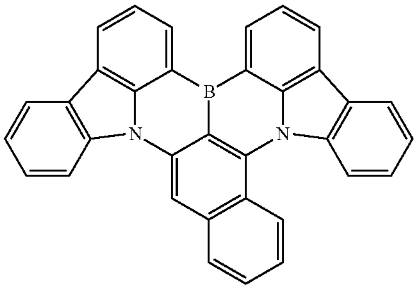
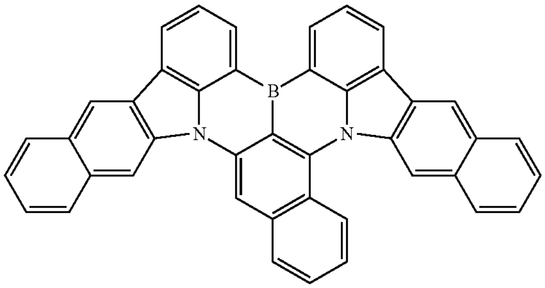
-continued
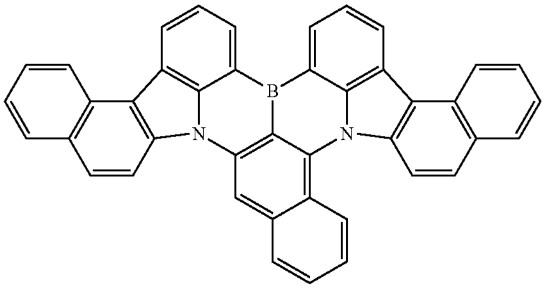
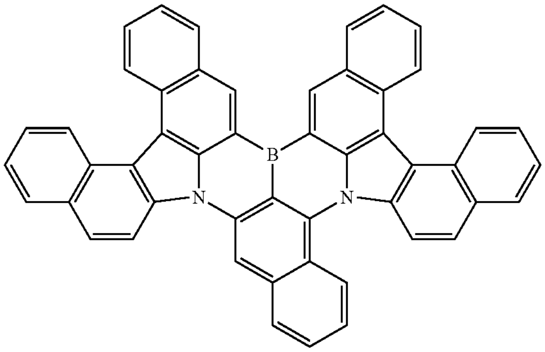
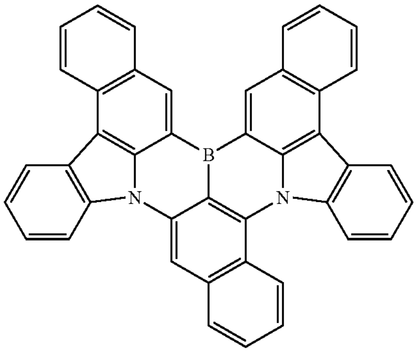
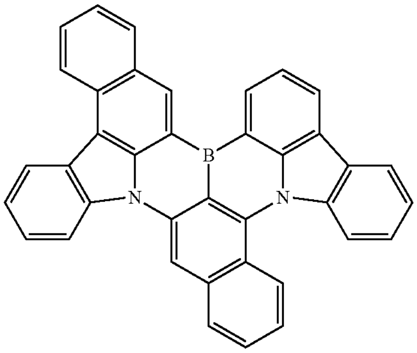
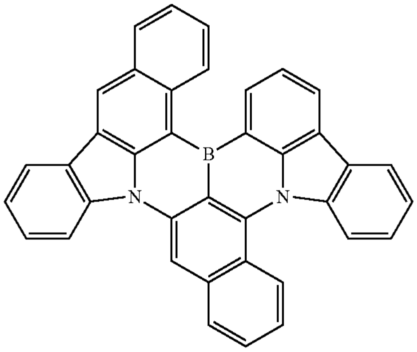

-continued
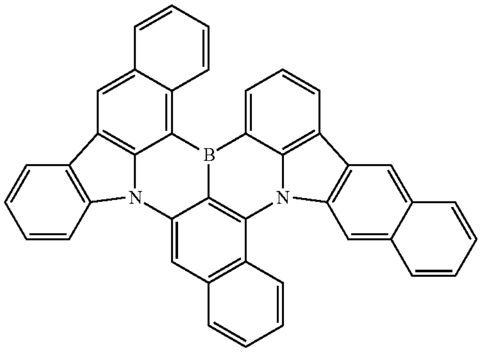
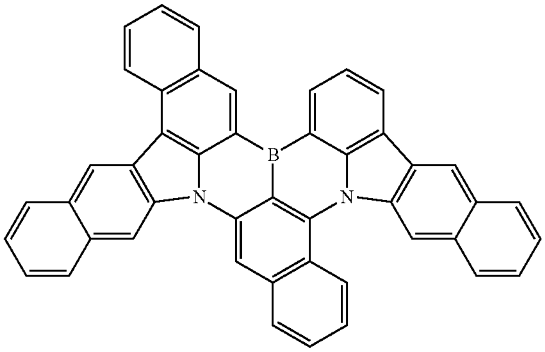
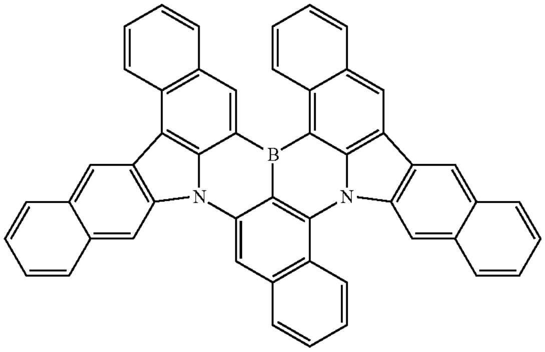
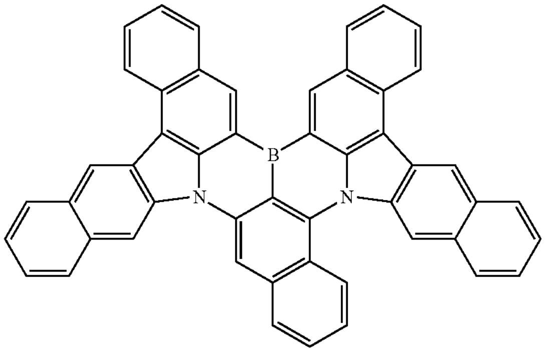
-continued
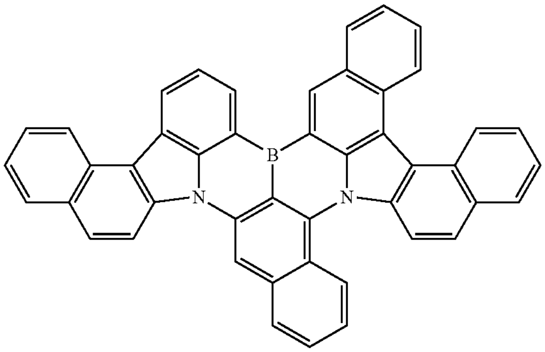
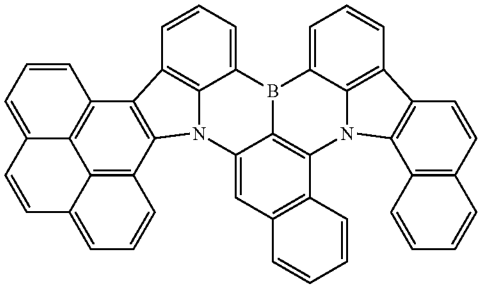
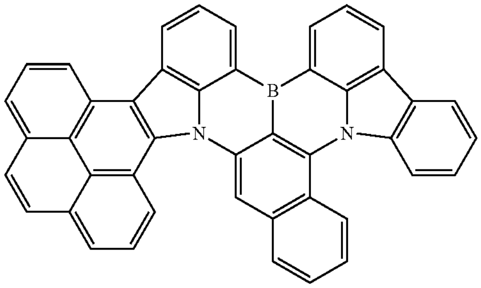
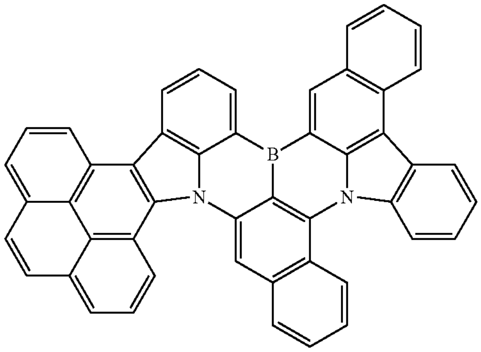
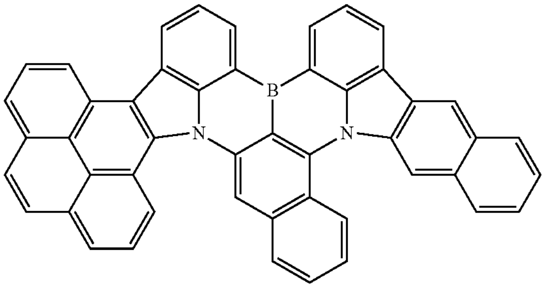

-continued
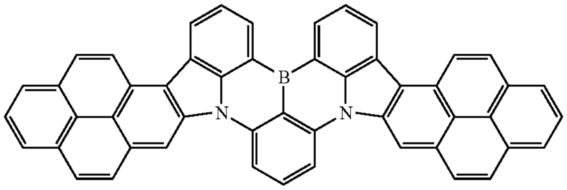
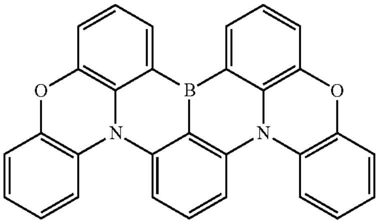
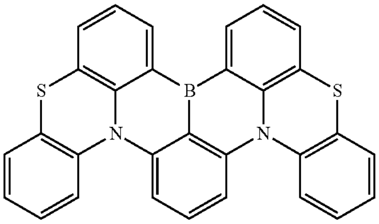
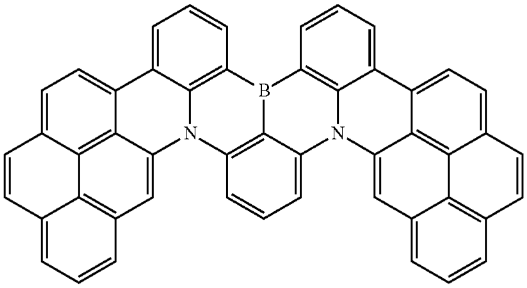
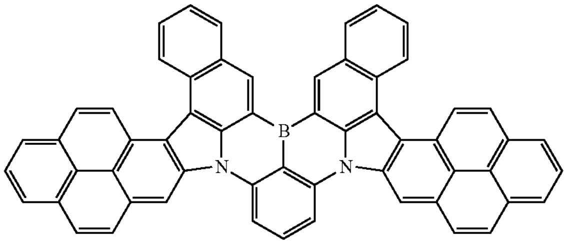
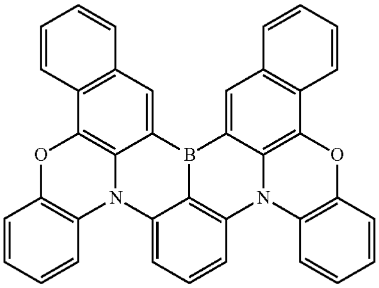
-continued
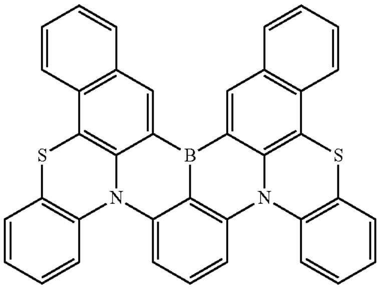
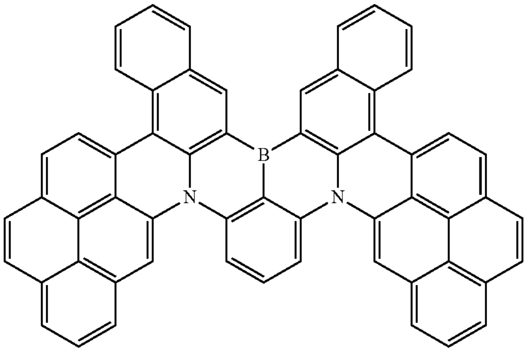
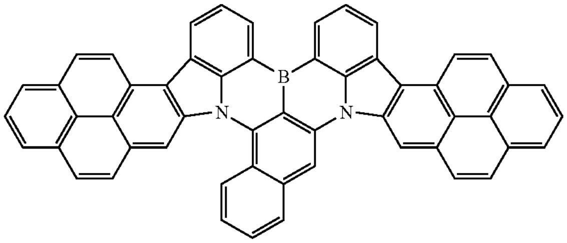
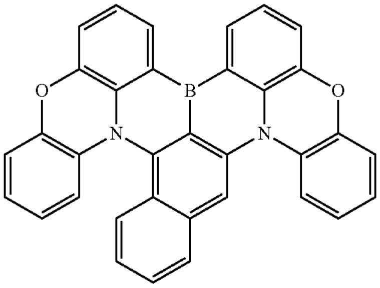
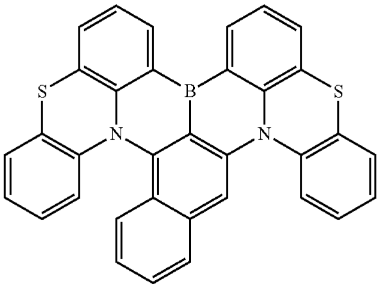

-continued
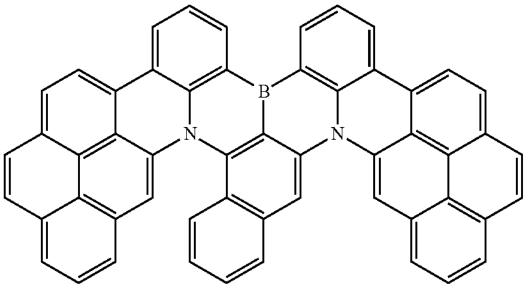
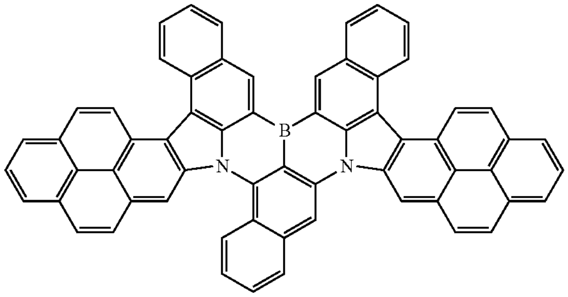
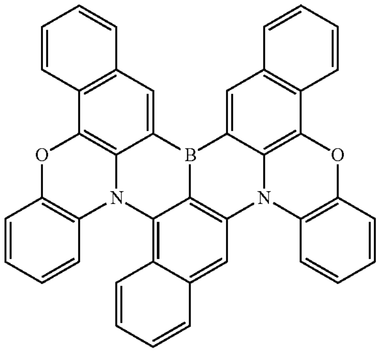
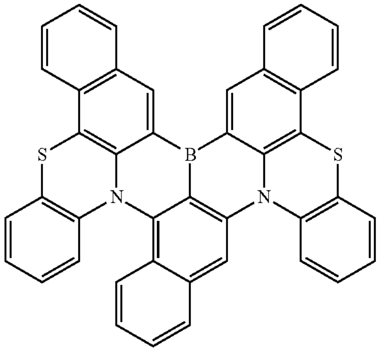
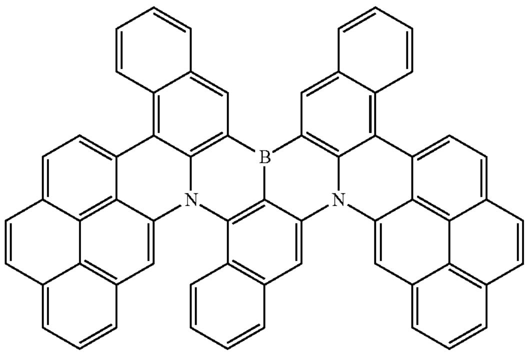
-continued
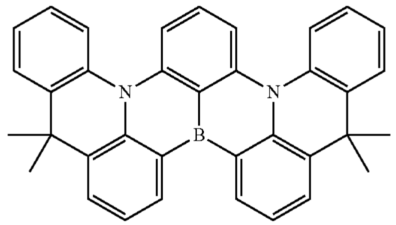
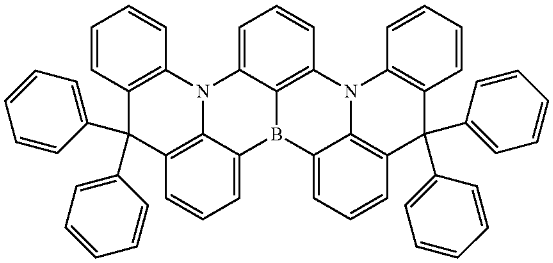
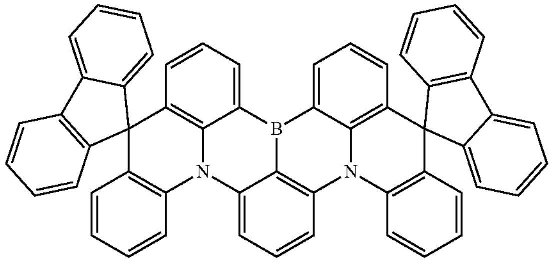
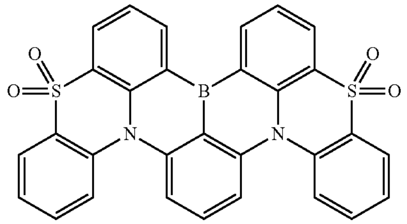
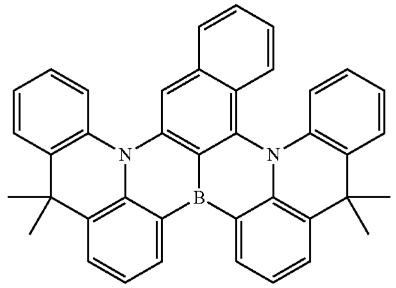
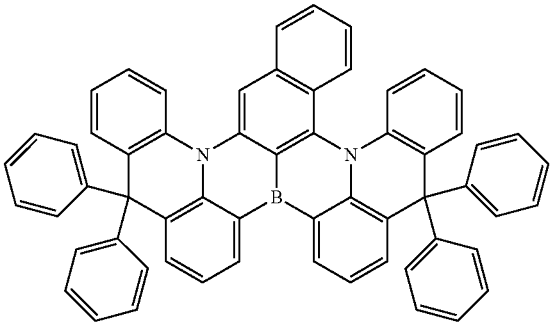

-continued
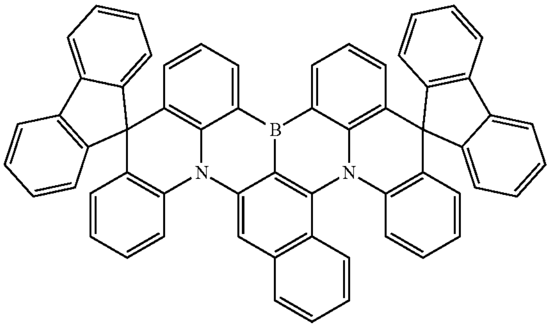
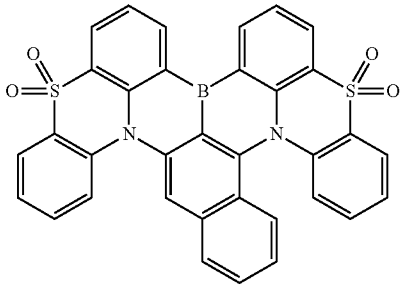
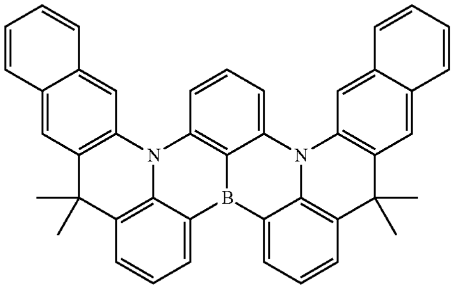
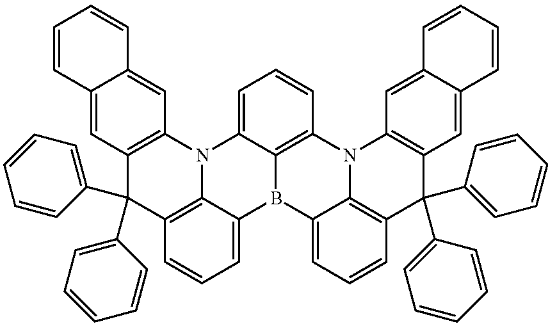
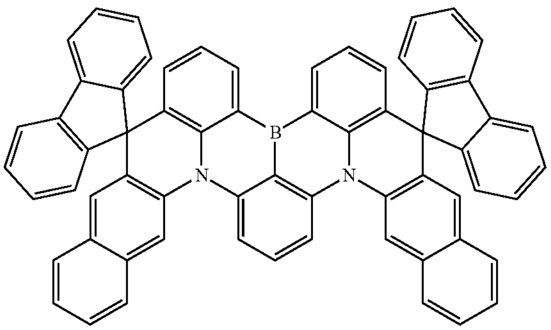
-continued
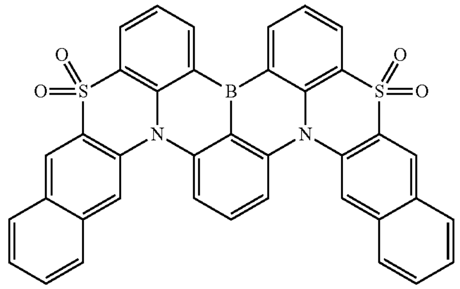
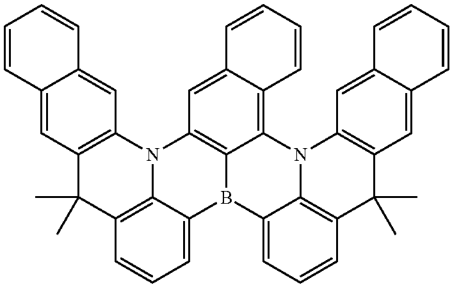
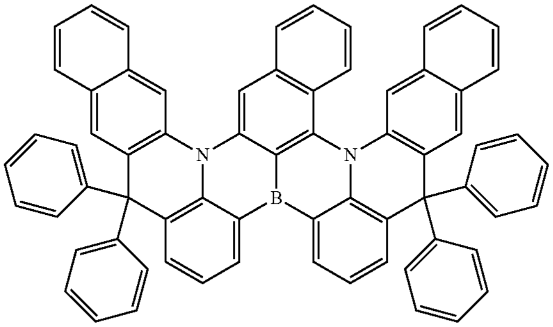
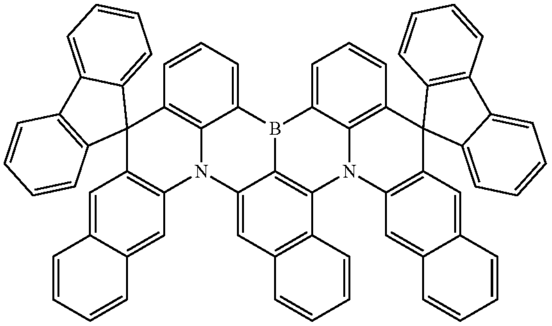
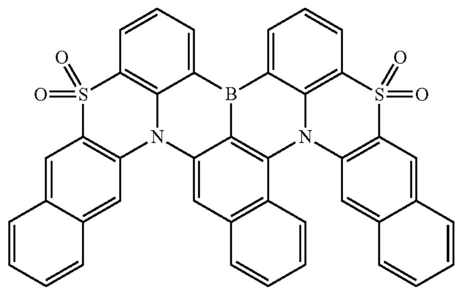

-continued
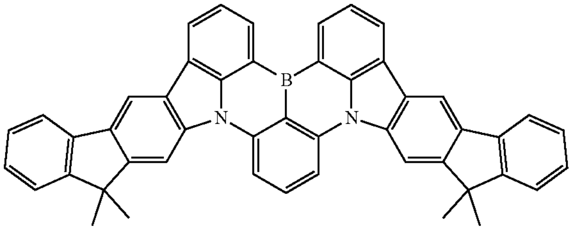
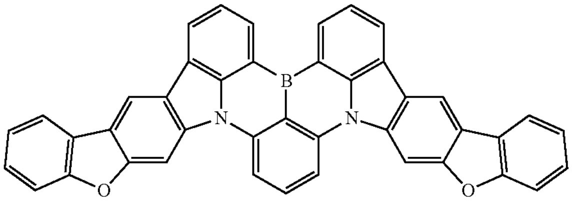
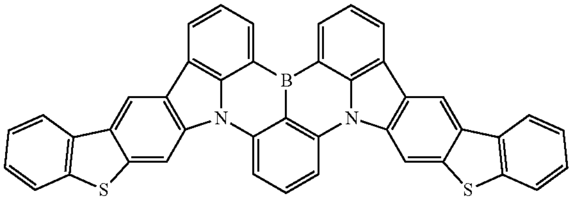
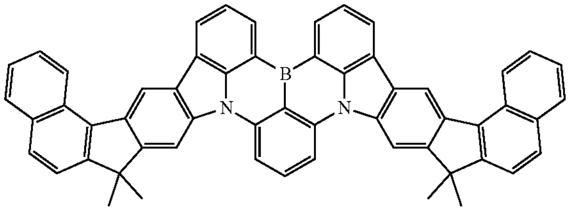
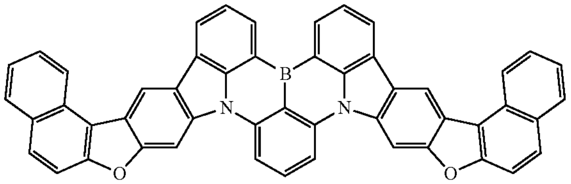
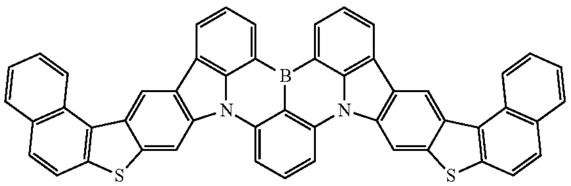
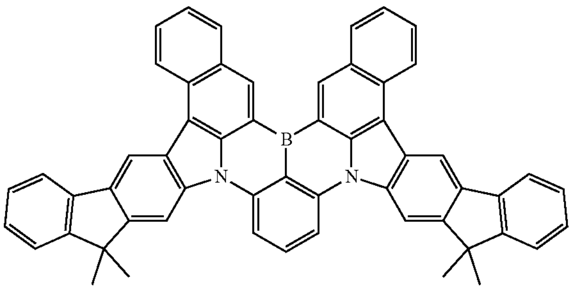
-continued
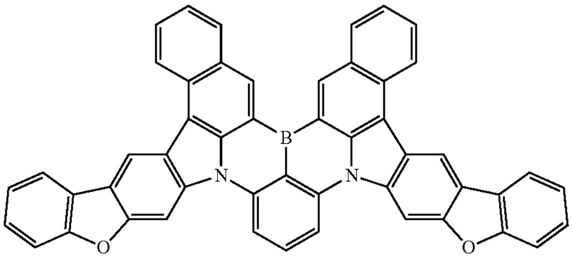
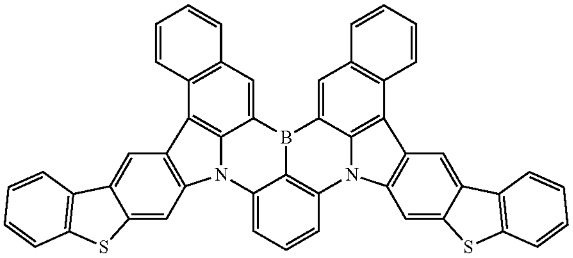
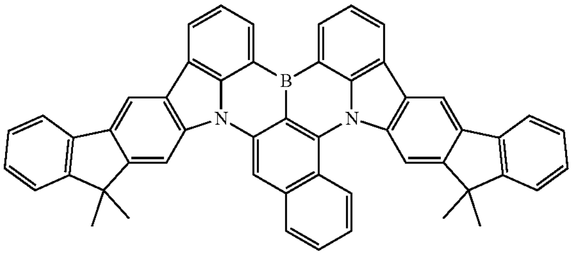
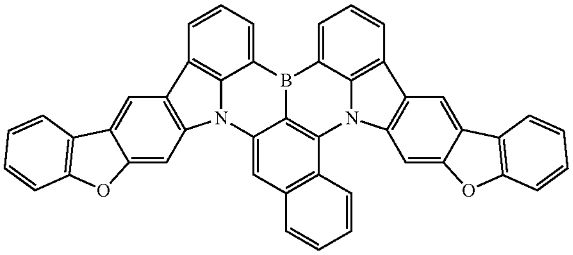
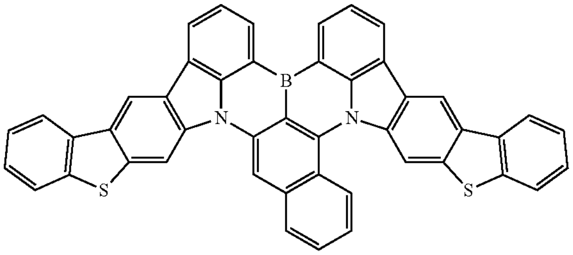
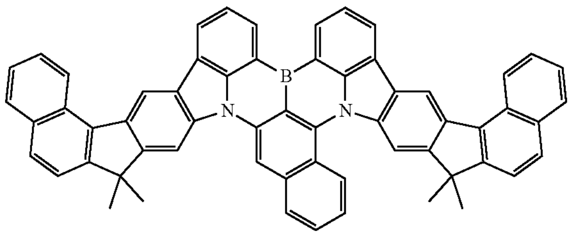

-continued
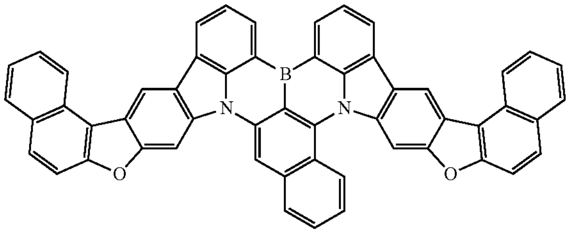
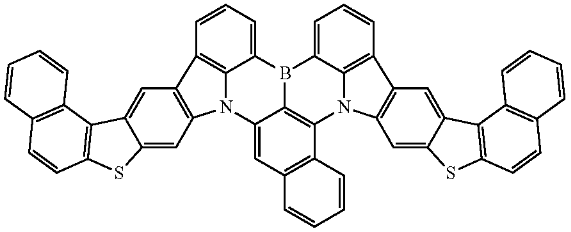
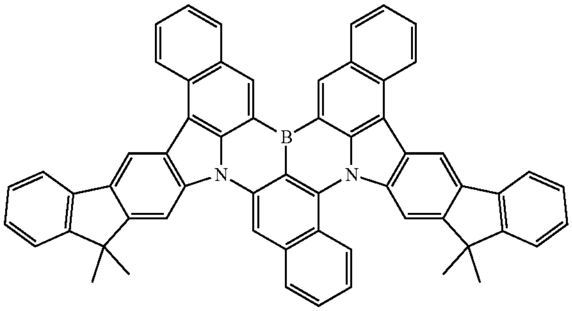
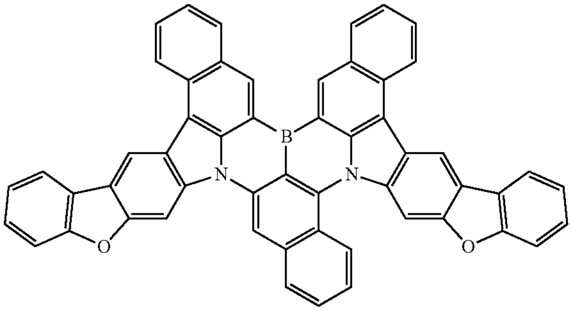
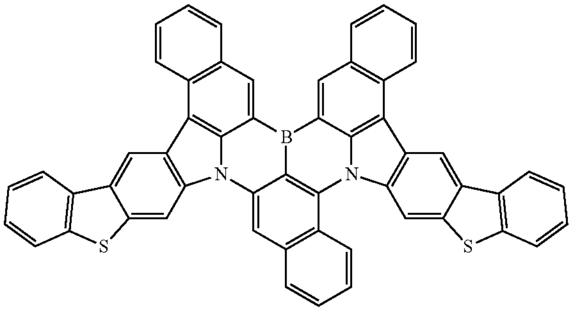
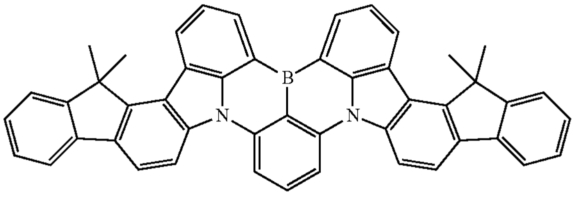
-continued
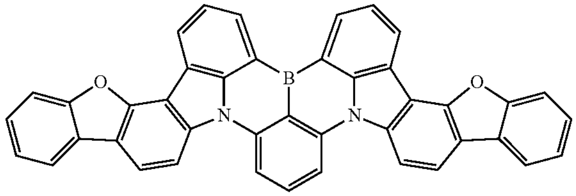
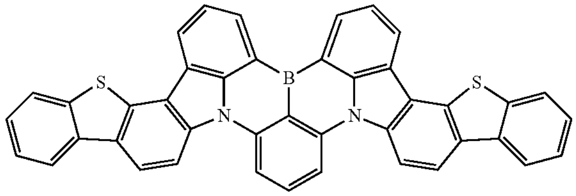
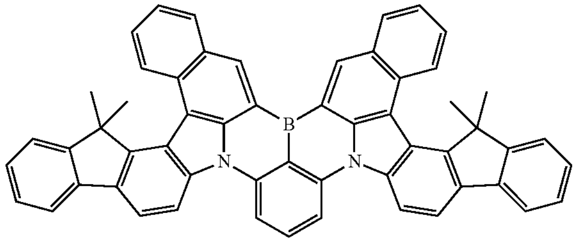
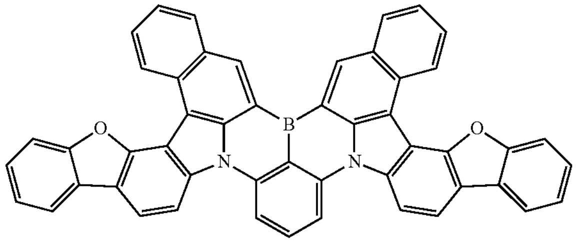
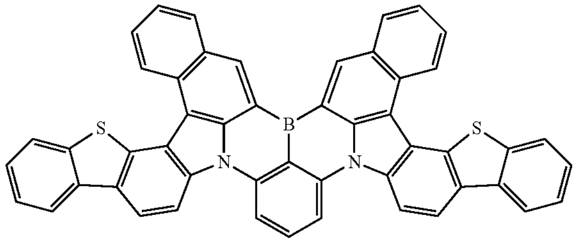
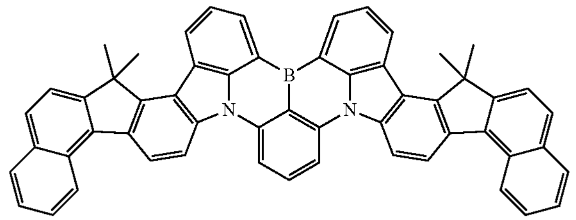
lp;3p
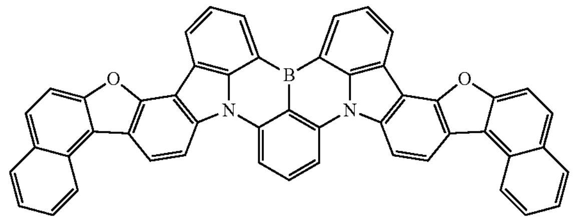

-continued
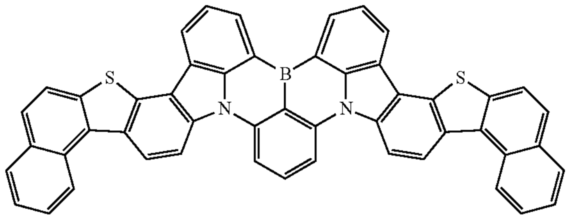
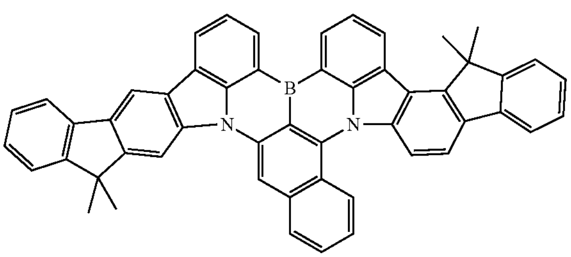
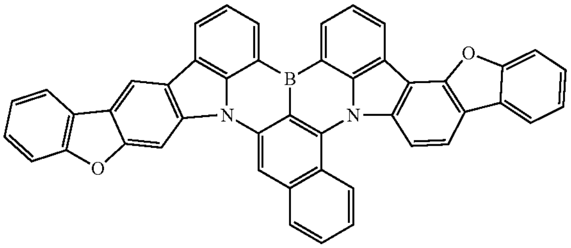
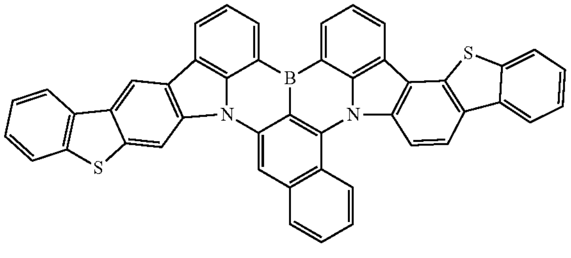
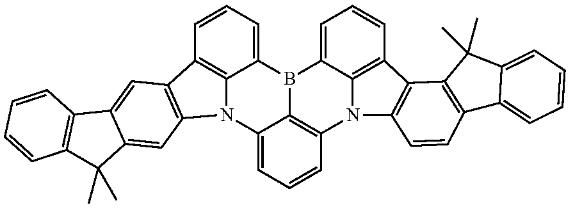
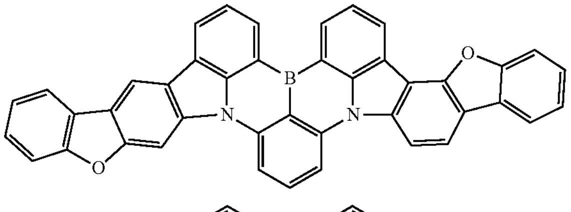
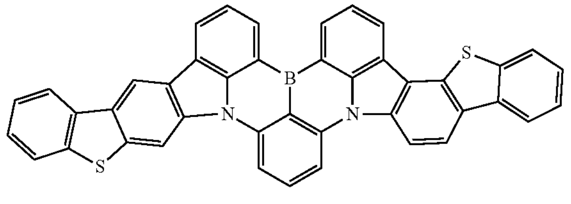
-continued
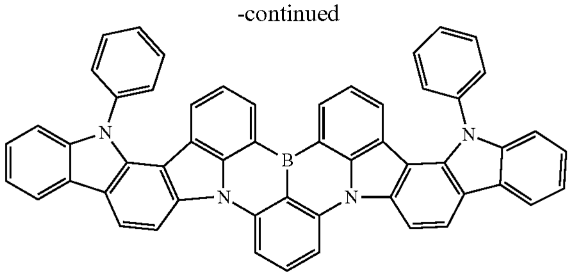
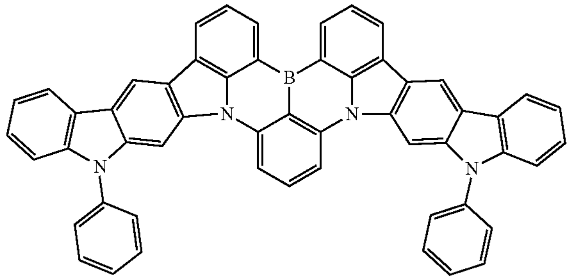
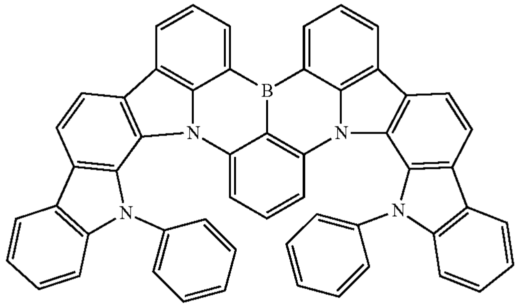
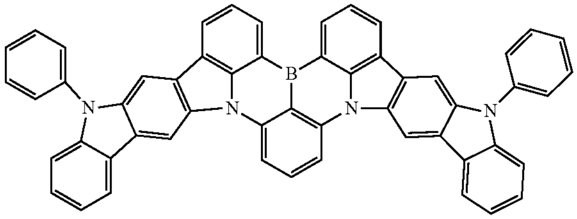
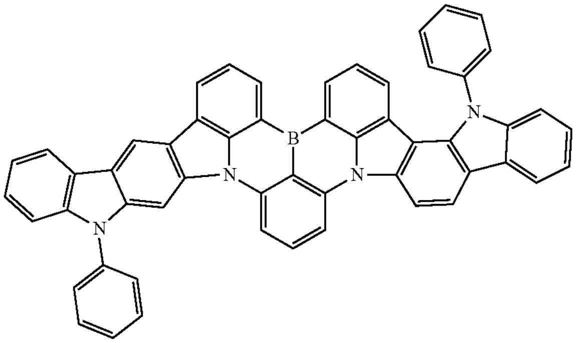
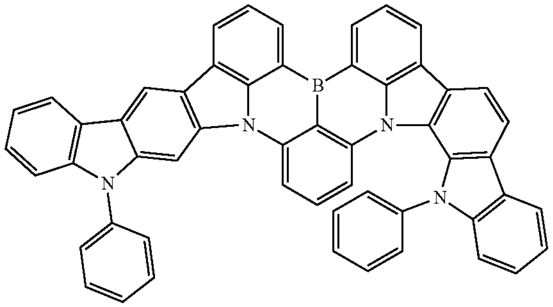

-continued
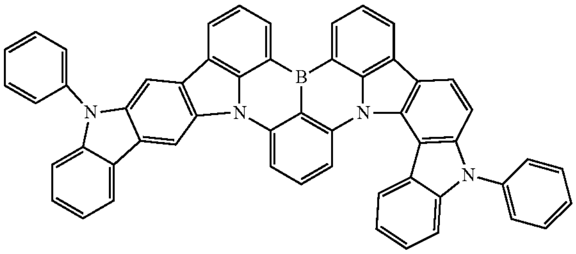
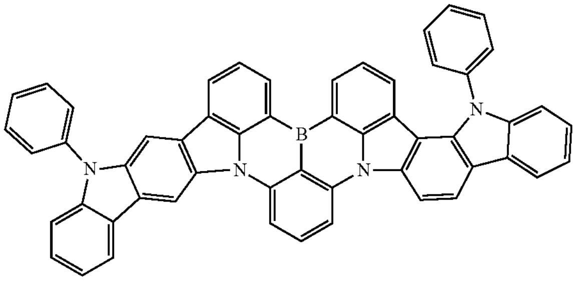
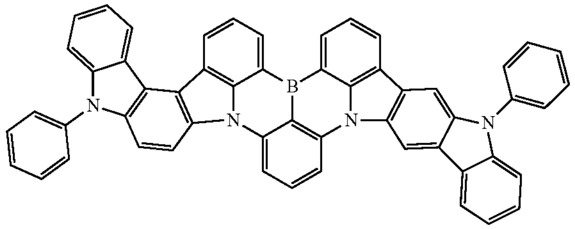
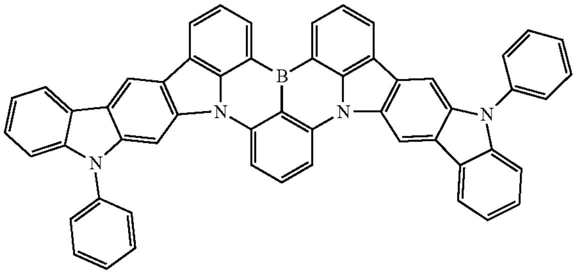
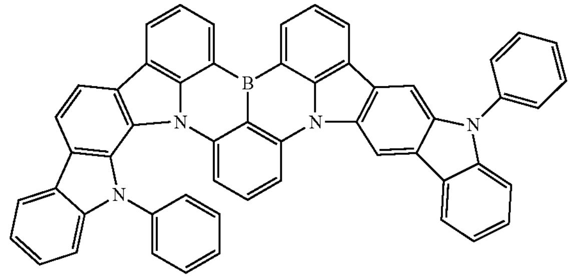
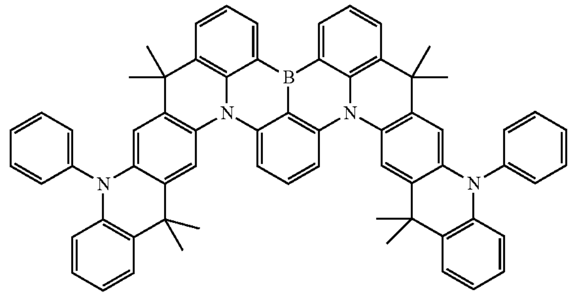
-continued
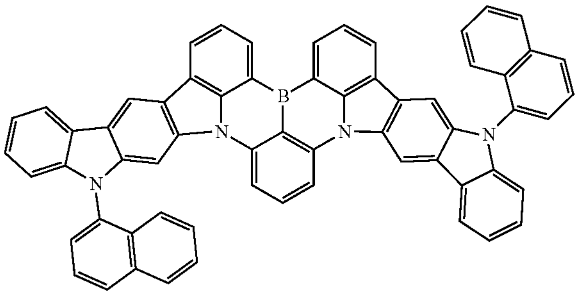
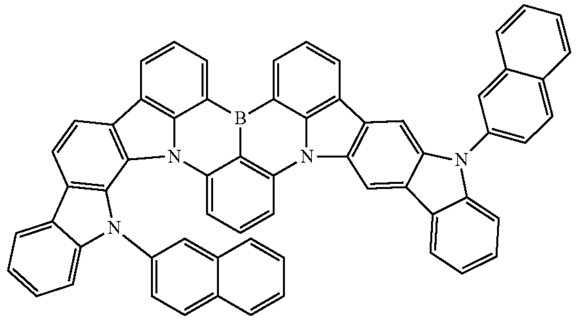
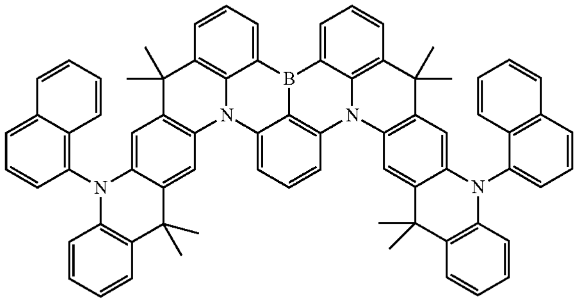
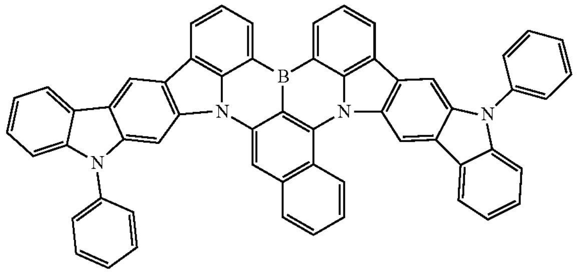
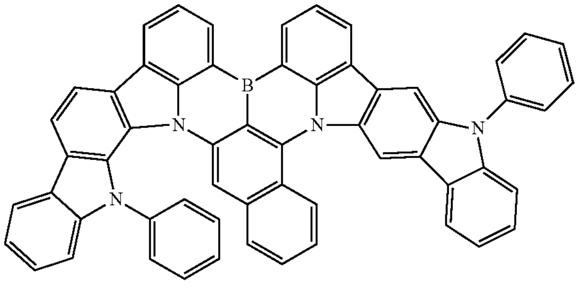

-continued
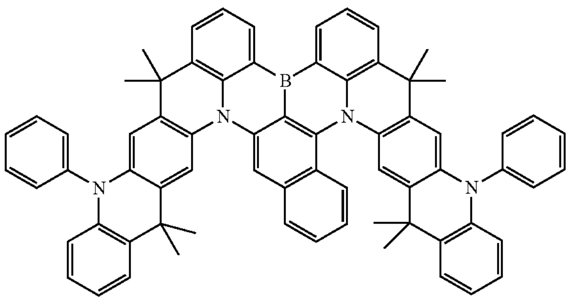
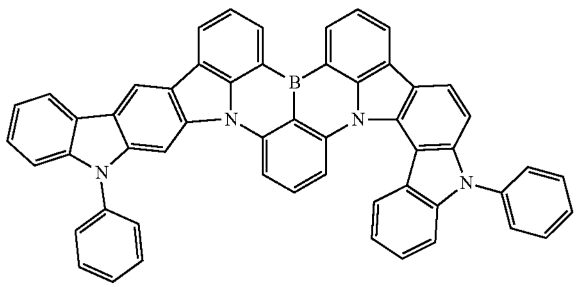
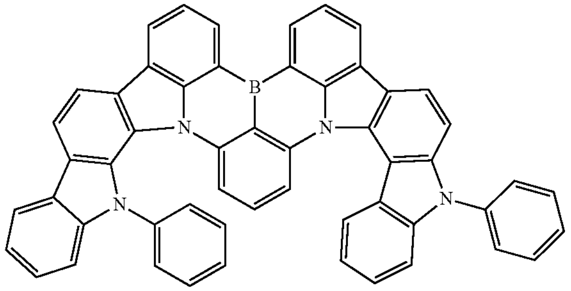
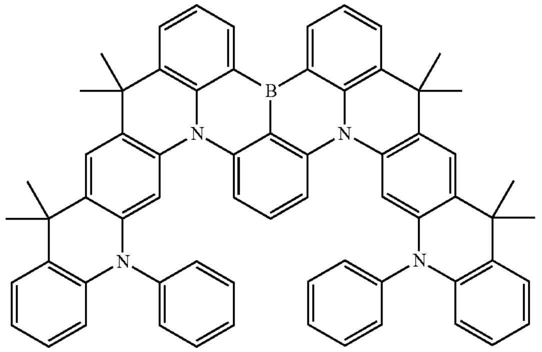
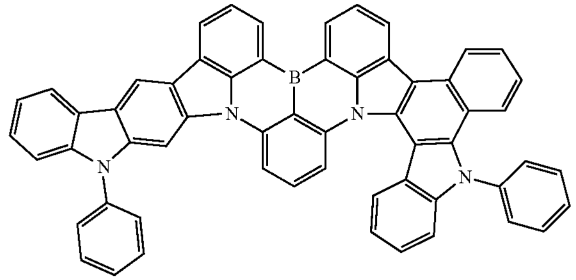
-continued
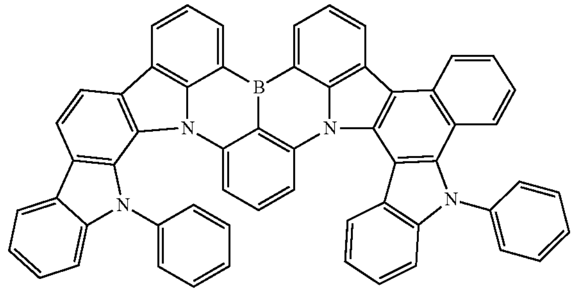
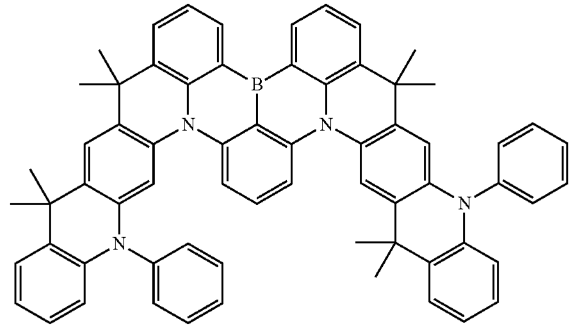
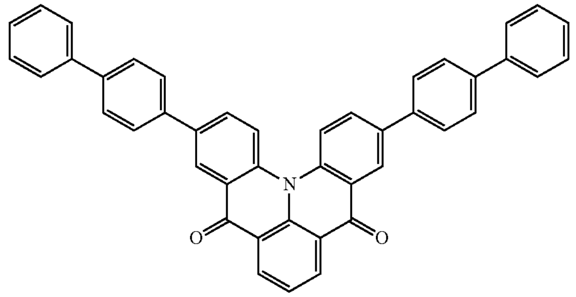
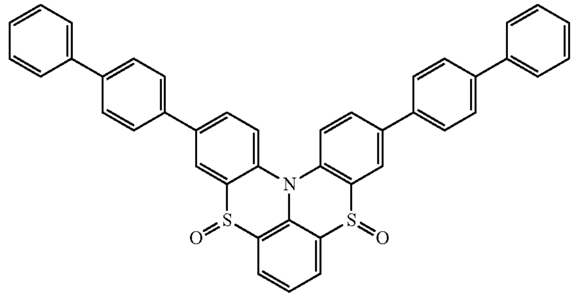
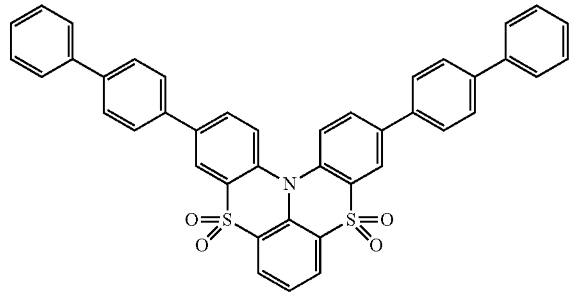
In some embodiments, the polymer as described herein further comprises another organic functional group.
In some embodiments, the polymer as described herein has the following general formula:

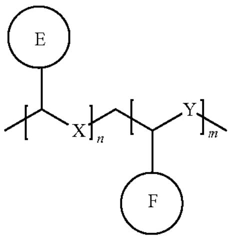

wherein Y have the same definition as the above-defined X, F is another organic functional group, n and m are integers greater than or equal to 1.

In some embodiments, the another organic functional group F in multiple occurrences, can be independently selected from a hole-injecting group, a hole-transporting group, a hole-blocking group, an electron-injecting group, an electron-transporting group, an electron-blocking group, an organic host group, a singlet emitting group (fluorescent emitting group), a triplet emitting group (phosphorescent emitting group). Each of these organic functional groups corresponds to a corresponding small-molecule organic functional material: a hole-injection (HIM), a hole-transport material (HTM), a hole-blocking material (HBM), an electron-injection (EIM), an electron-transport material (ETM), an electron-blocking material (EBM), an organic host material (Host), a singlet emitter (fluorescent emitter), a triplet emitter (phosphorescent emitter), a thermally activated delayed fluorescent material (TADF). These organic functional materials are described in details, for example, in WO2010135519A1, US20090134784A1, and WO201110277A1. The entire contents of these three documents are incorporated herein by reference in their entirety.

In some embodiments, the polymer as described herein comprises the repeating structural unit E, and the another organic functional group F, wherein F is selected from a triplet matrix group.

In some embodiments, the polymer as described herein comprises the repeating structural unit E, and another organic functional group F, wherein F is selected from a triplet emitting group.

In some embodiments, the polymer as described herein comprises the repeating structural unit E, and another organic functional group F, wherein F is selected from a TADF group.

In some embodiments, the polymer as described herein comprises the repeating structural unit E, and two additional organic functional groups F1 and F2, wherein F1 is selected from a triplet matrix group and F2 is selected from a triplet emitting group.

In some embodiments, the polymer as described herein comprises the repeating structural unit E, and two additional organic functional groups F1 and F2, wherein F1 is selected from a hole-transporting group and F2 is selected from an electron-transporting group.

In some embodiments, the polymer as described herein comprises the repeating structural unit E, and another organic functional group F, wherein F is selected from a singlet matrix group.

In some embodiments, the polymer as described herein comprises the repeating structural unit E, and two additional organic functional groups F1 and F2, wherein F1 is selected from a singlet matrix group and F2 is selected from a singlet emitting group.

The singlet matrix group and triplet matrix group are described in details below (but are not limited thereto).

1. Triplet Host

Examples of triplet host materials are not specially limited and any metal complex or organic compound may be used as the host material as long as its triplet energy is higher than that of the emitter, especially higher than that of the triplet emitter or a phosphorescent emitter.

Examples of metal complexes that may be used as a triplet host include (but are not limited to) the following general structures.

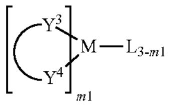

Wherein M is a metal; ($Y^3$-$Y^4$) is a bidentate ligand; $Y^3$ and $Y^4$ are each independently selected from C, N, O, P, or S; L is an auxiliary ligand; m1 is an integer with the value from 1 to the maximum coordination number of this metal; in some embodiments, the metal complexes that can be used as the triplet host have the following form:

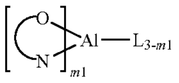 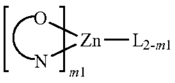

(O—N) is a bidentate ligand in which the metal is coordinated to the O atoms and the N atoms. m1 is an integer with a value from 1 to the maximum coordination number of this metal.

In some embodiments, M may be selected from Ir or Pt.

Examples of organic compounds that can be used as the triplet host are selected from: compounds containing cyclic aromatic hydrocarbon groups such as benzene, biphenyl, triphenylbenzene, benzofluorene; compounds containing aromatic heterocyclic groups such as dibenzothiophene, dibenzofuran, dibenzoselenophene, furan, thiophene, benzofuran, benzothiophene, benzoselenophene, carbazole, dibenzocarbazole, indole carbazole, pyridine indole, pyrrole dipyridine, pyrazole, imidazole, triazole, oxazole, thiazole, oxadiazole, oxatriazole, dioxazole, thiadiazole, pyridine, pyridazine, pyrimidine, pyrazine, triazines, oxazine, oxothiazine, oxadiazine, indole, benzimidazole, indazole, oxazole, dibenzoxazole, benzisoxazole, benzothiazole, quinoline, isoquinoline, cinnoline, quinazoline, quinoxaline, naphthalene, phthalide, pteridine, xanthene, acridine, phenazine, phenothiazine, Phenoxazine, benzofuranopyridine, furanopyridine, benzothienopyridine, thienopyridine, benzoselenophene pyridine and selenophene benzodipyridine; and groups containing 2 to 10 ring atoms, which may be the same or different types of cyclic aromatic hydrocarbon groups/aromatic heterocyclic groups, linked to each other directly or by at least one of the following groups, such as oxygen atoms, nitrogen atoms, sulfur atoms, silicon atoms, phosphorus atoms, boron atoms, chain structural units and aliphatic ring groups, wherein each Ar can be further substituted and the substituents may selected from hydrogen, deuterium, cyano, halogen, alkyl, alkoxy, amino, alkene, alkyne, aryl, heteroalkyl, aryl, or heteroaryl.

In some embodiments, the triplet host material may be selected from a compound comprising at least one of the following groups.

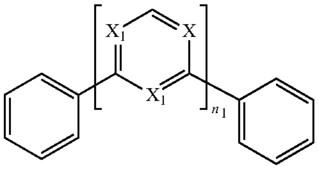 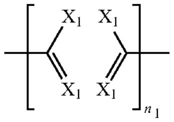
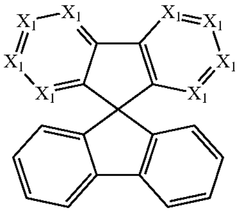 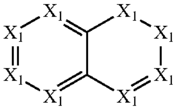
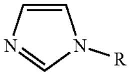 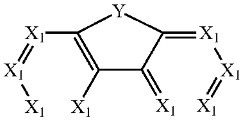
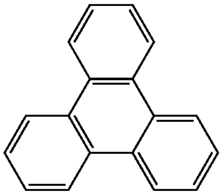 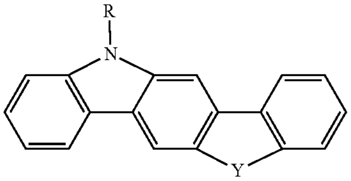
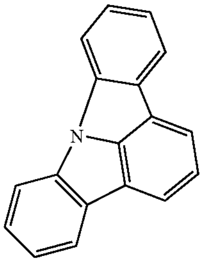 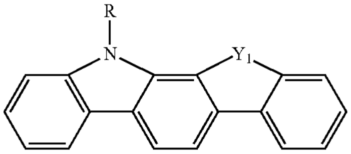
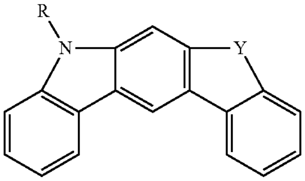 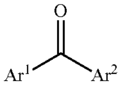 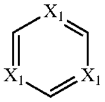
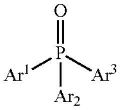 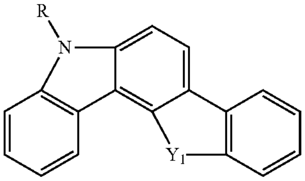
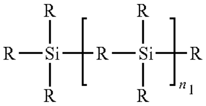 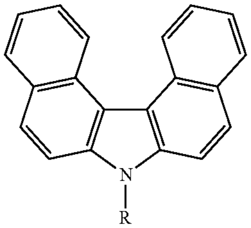
-continued
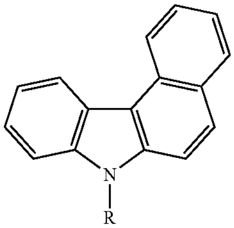 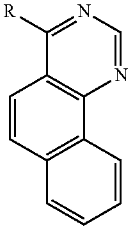
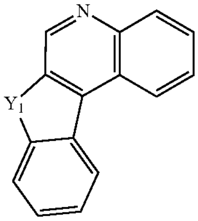 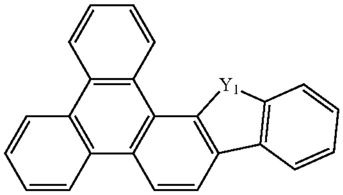
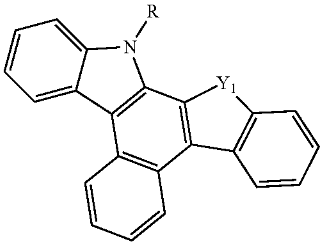
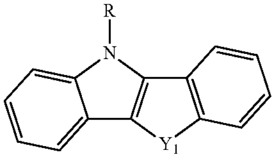
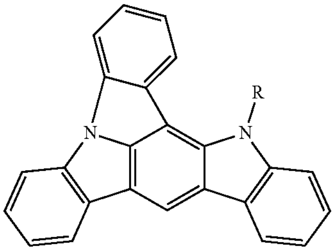 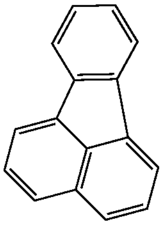
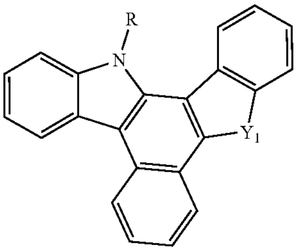
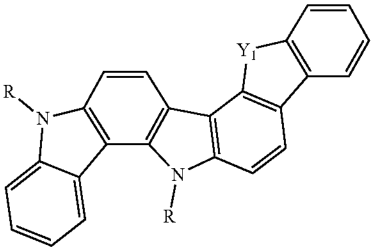

-continued

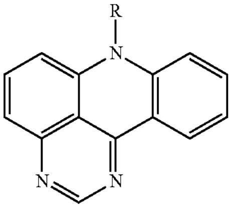

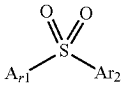

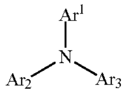

wherein: when $Y_1$ occurs multiple times, each $Y_1$ is independently selected from $C(R)_2$, NR, O, S; when $X^1$ occurs multiple times, each $X^1$ is independently selected from CR or N. $Ar_1$ to $Ar_3$ are independently selected from aromatic or heteroaromatic groups, and each R is independently selected from the following groups: H, deuterium, halogen atom (F, Cl, Br, I), cyano, alkyl, alkoxy, amino, alkenyl, alkynyl, aralkyl, heteroalkyl, aryl and heteroaryl, and each $n_1$ is independently selected from an integer of 1 to 20.

Examples of suitable triplet host materials are listed below, but are not limited to:

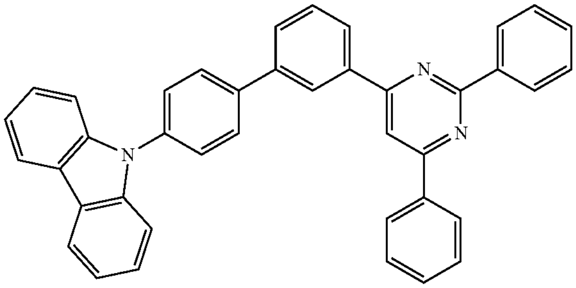

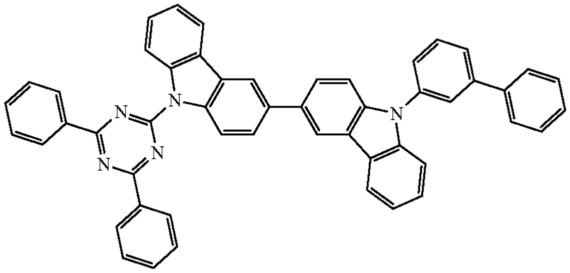

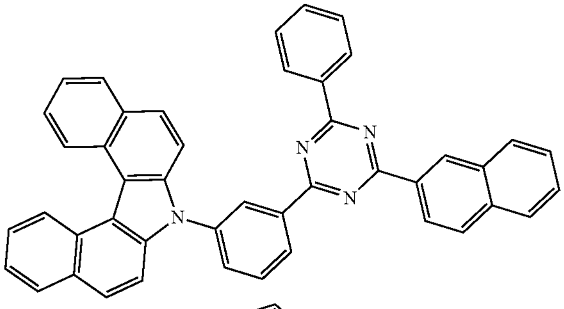

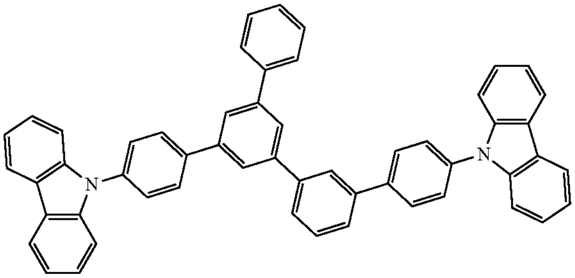

-continued

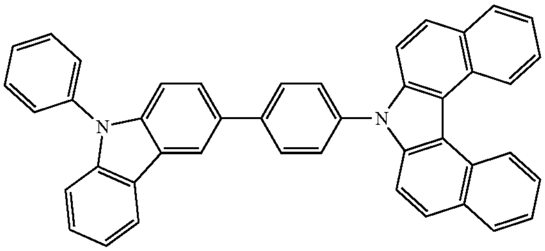

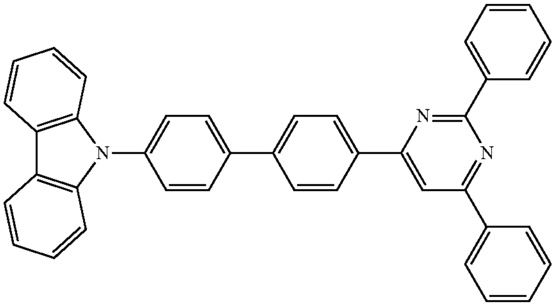

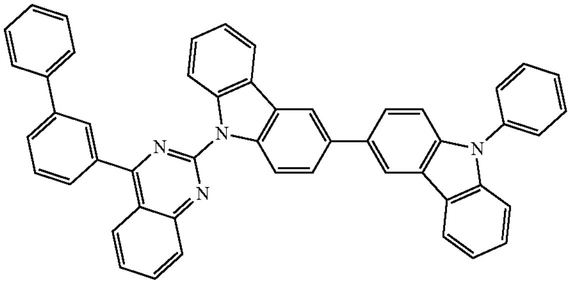

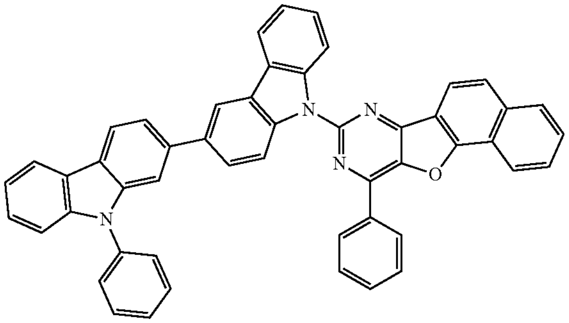

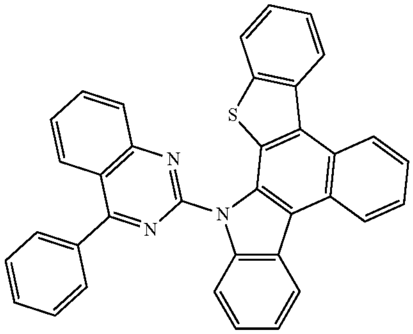

-continued
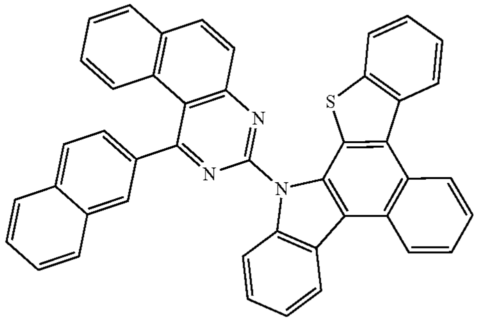
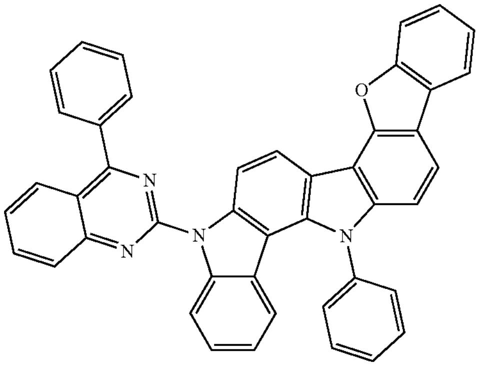
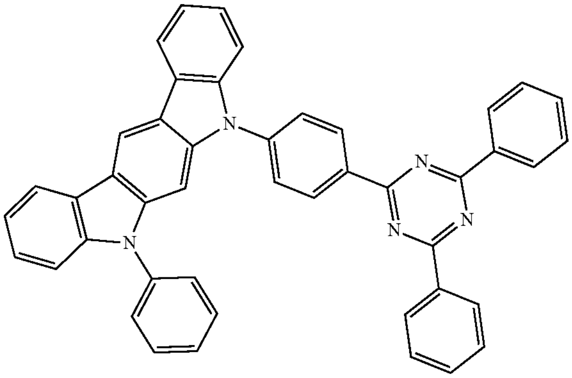
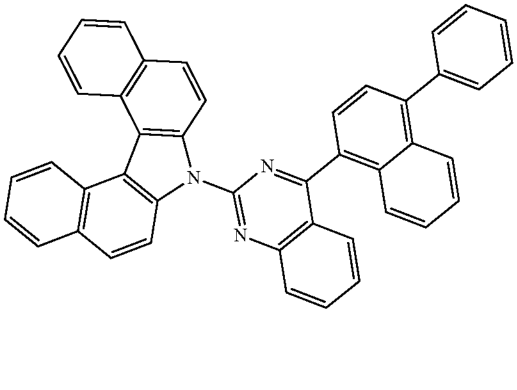
-continued
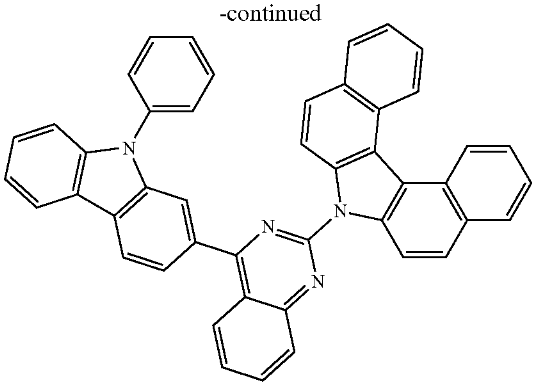
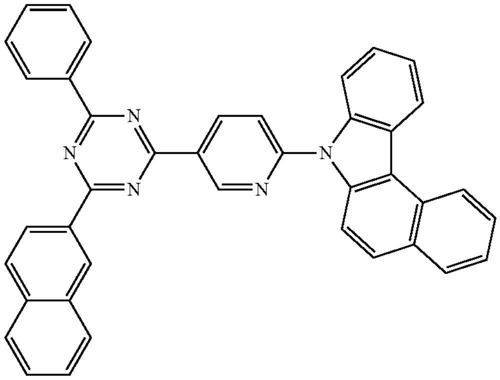
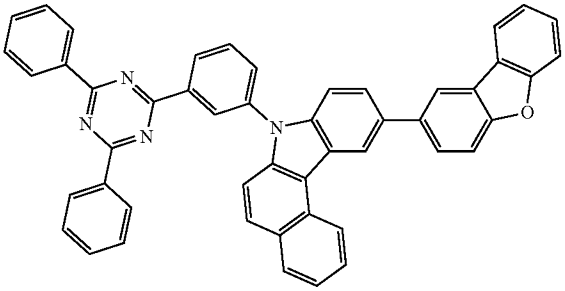
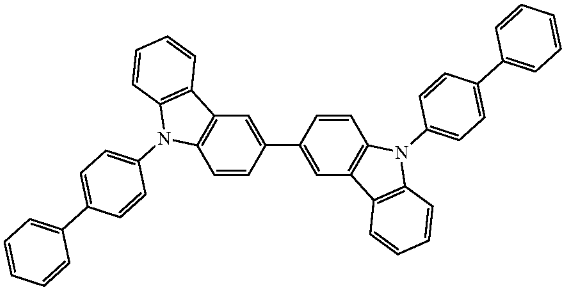
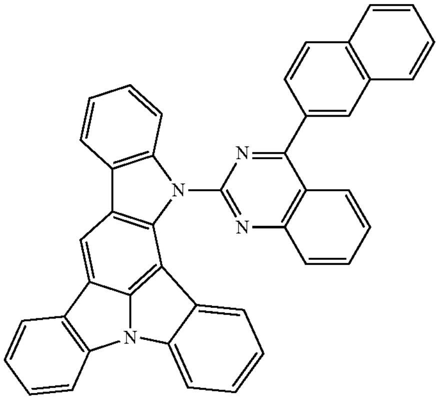

-continued
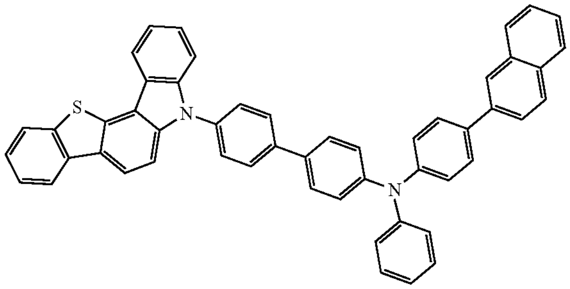
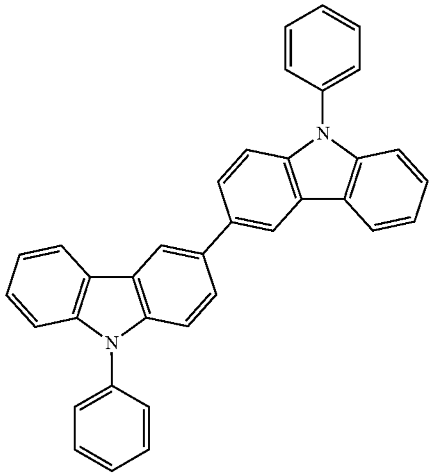
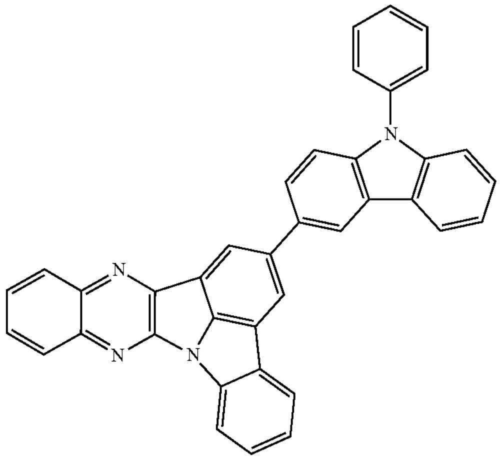
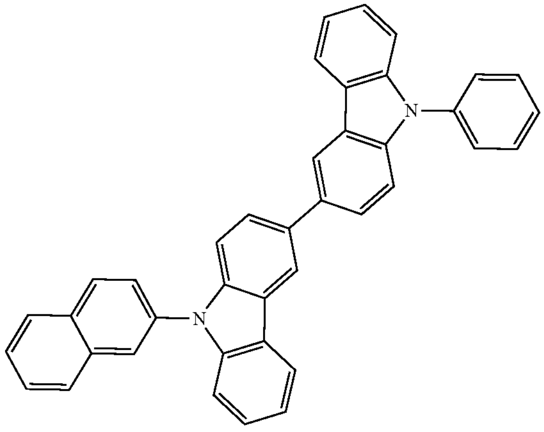
-continued
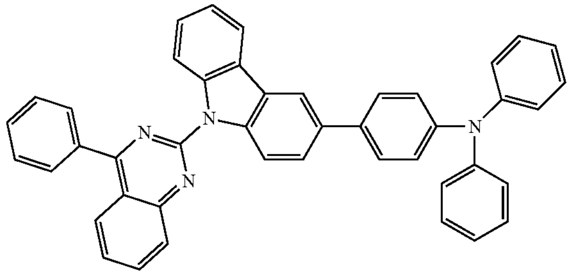
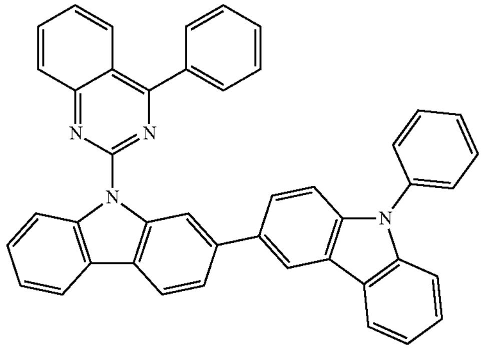
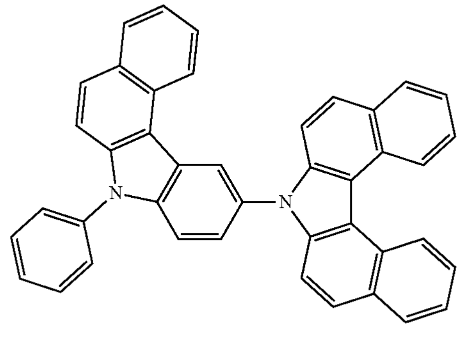
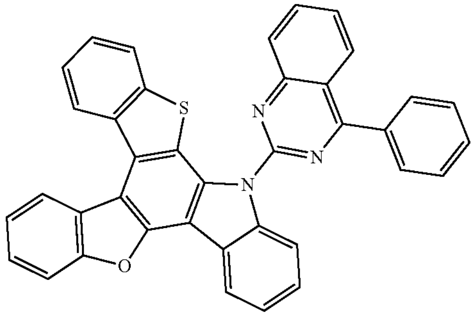

-continued

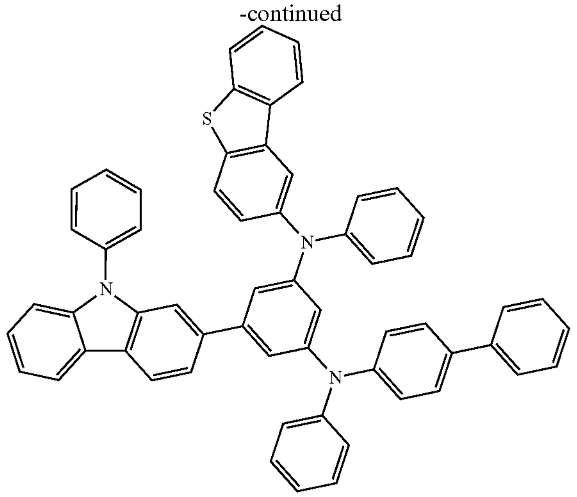

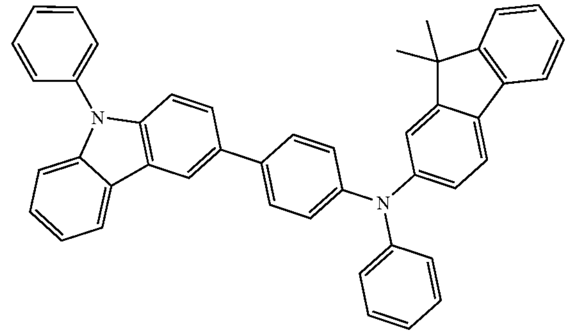

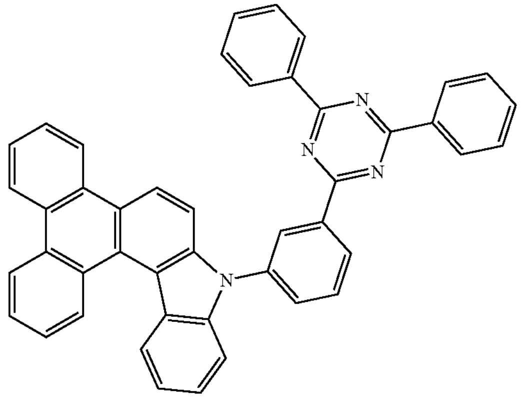

2. Singlet Host:

Examples of singlet host materials are not specially limited, any organic compound may be used as the host, as long as its singlet energy is higher than dopant material, especially higher than that of the singlet emitter or fluorescent emitter.

Examples of organic compounds that can be used as singlet host materials are selected from: cyclic aromatic hydrocarbon compounds such as benzene, biphenyl, triphenylbenzene, benzophenanthrene, triphenylene, naphthalene, anthracene, phenalene, phenanthrene, fluorene, pyrene, chrysene, perylene, azulene; aromatic heterocyclic compounds such as dibenzothiophene, dibenzofuran, dibenzoselenophene, furan, thiophene, benzofuran, benzothiophene, benzoselenophene, carbazole, indolecarbazole, pyridoindole, pyrrole dipyridine, pyrazole, imidazole, triazole, isoxazole, thiazole, oxadiazole, oxatriazole, dioxazole, thiadiazole, pyridine, pyridazine, pyrimidine, pyrazine, triazine, oxazine, oxithiazine, oxadiazine, indole, benzimidazole, indazole, indolizine, benzoxazole, benzisoxazole, benzothiazole, quinoline, isoquinoline, cinnoline, quinazoline, quinoxaline, naphthalene, phthalein, pteridine, xanthene, acridine, phenazine, phenothiazine, phenothiazine phenoxazine, benzofuranopyridine, furanodipyridine, benzothienopyridine, thiophenedipyridine, benzoselenophenopyridine, or selenophenedipyridine. The organic compound used as the singlet host material may be containing 2 to 10 ring atoms, which may be the same or different types of cyclic aromatic hydrocarbon groups or aromatic heterocyclic groups, and are linked to each other directly or by at least one of the following groups, such as oxygen atoms, nitrogen atoms, sulfur atoms, silicon atoms, phosphorus atoms, boron atoms, chain structural units, and aliphatic ring groups.

In some embodiments, the singlet host material is selected from compounds comprising at least one of the following groups.

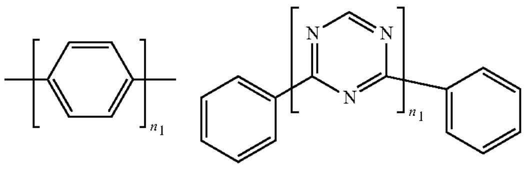

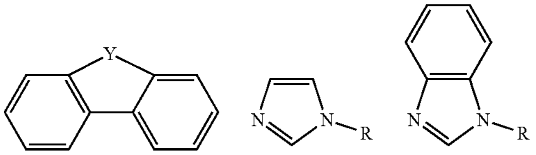

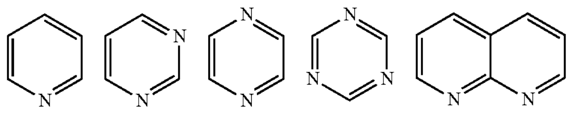

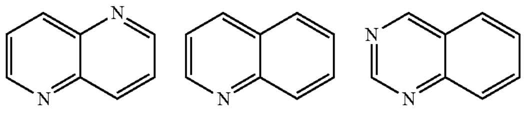

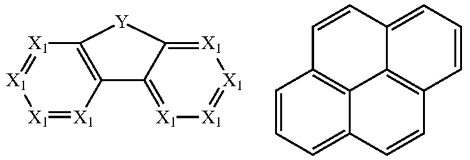

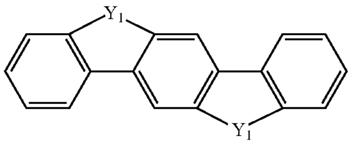

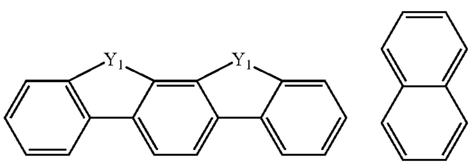

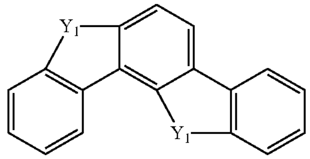

-continued

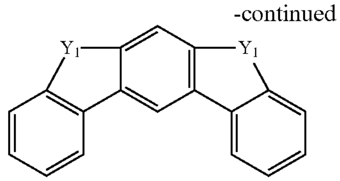
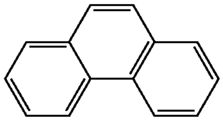
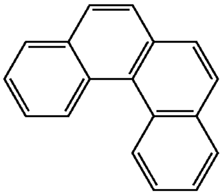
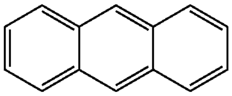
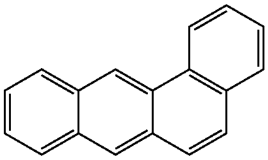
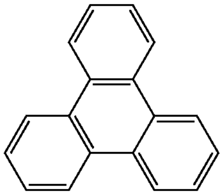

$X^1$ at each occurrence is independently selected from CR or N; $Y_1$ at each occurrence is independently selected from C(R) 2, NR, O, S; and R is at each occurrence independently selected from the following groups: H, deuterium, halogen atom (F, Cl, Br, I), cyano, alkyl, alkoxy, amino, alkenyl, alkynyl, aralkyl, heteroalkyl, aryl, and heteroaryl, and each $n_1$ is an integer from 1 to 20.

In some embodiments, the singlet host is selected from anthracene derivatives, such examples are disclosed in the patent literature such as CN102224614B, CN100471827C, CN1914293B, WO2015033559A1, US2014246657A1, WO2016117848A1, WO2016117861A1, WO2016171429A2, CN102369256B, CN102428158B, etc.

Examples of some anthracene-based singlet host materials are listed below:

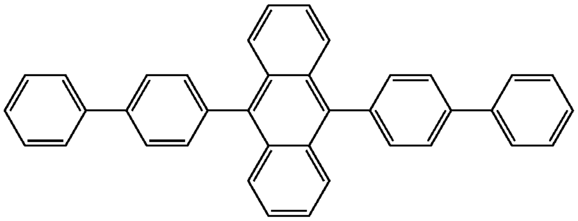
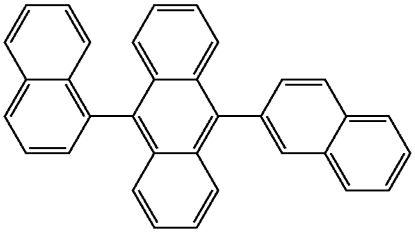
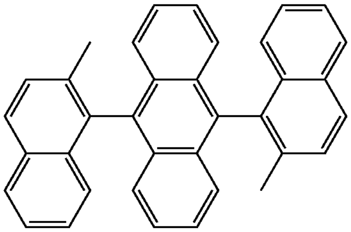

-continued

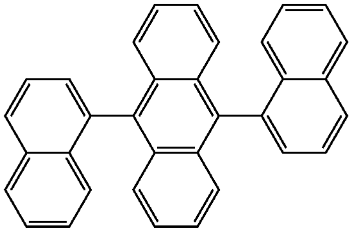
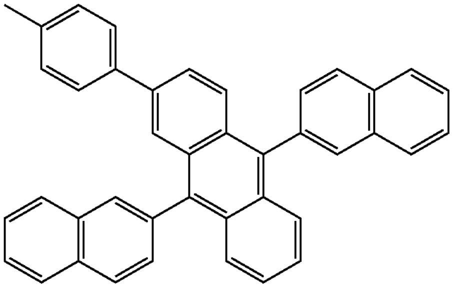
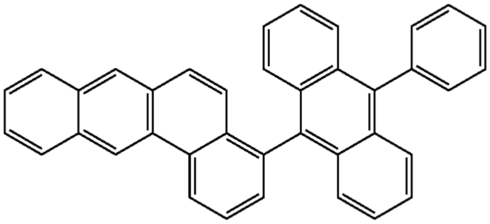
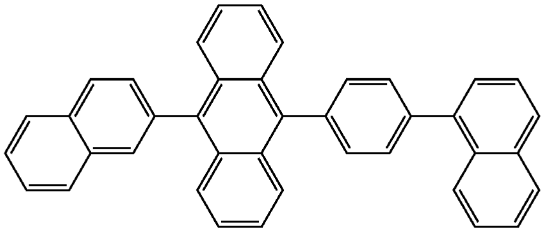
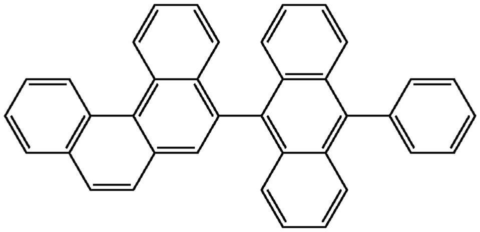
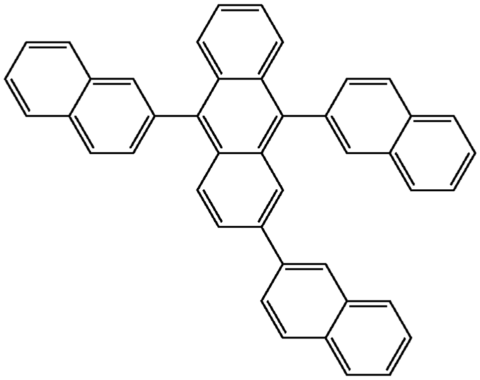

-continued

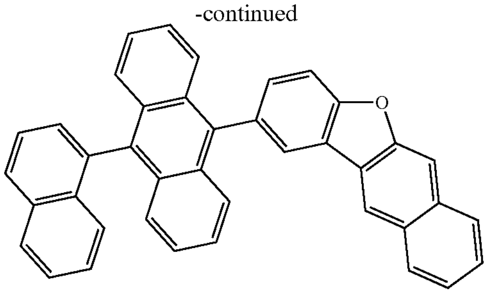

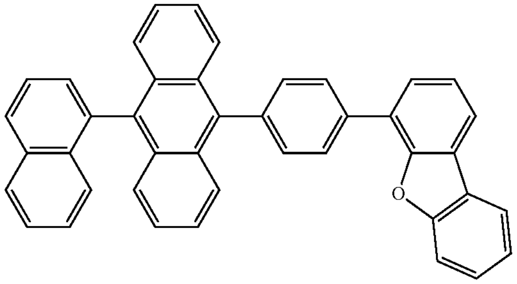

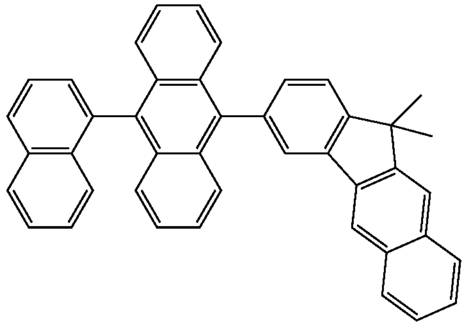

In some embodiments, the anthracene-based singlet host material is deuterated, i.e. the host material molecule contains at least one deuterium atom, such examples are disclosed in the patent literature such as CN102369256B, CN102428158B, CN102639671B, US2015021586A1, etc.

In another aspect, the present disclosure also provides a polymerizable monomer with the following general formula:

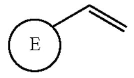

Wherein the structural unit E contains a structure as shown in one of the formulas (1)-(1e) or (2)-(2e).

In some embodiments, the polymerizable monomer as described herein has a (S1 (E)-T1(E))≤0.30 eV, preferably ≤0.25 eV, more preferably ≤0.20 eV, and most preferably ≤0.10 eV.

In yet another aspect, the present disclosure further provides a mixture, comprising at least one of the polymer as described above and at least one other organic functional material. The at least one other organic functional material is selected from a hole-injection material (HIM), a hole-transport material (HTM), a hole-blocking material (HBM), an electron-injection material (EIM), an electron-transport material (ETM), an electron-blocking material (EBM), an organic host material (Host), a singlet emitter (fluorescent emitter), a triplet emitter (phosphorescent emitter), a thermally activated delayed fluorescence material (TADF). These functional materials have been previously described.

In yet another aspect, the present disclosure further provides a formulation comprising the polymer or polymerizable monomer as described above, at least one organic solvent and/or an organic resin.

In some embodiments, the formulation comprises an organic solvent. Examples of the organic solvents, include, but are not limited to: methanol, ethanol, 2-methoxyethanol, dichloromethane, trichloromethane, chlorobenzene, o-dichlorobenzene, tetrahydrofuran, anisole, morpholine, toluene, o-xylene, m-xylene, p-xylene, 1,4 dioxane, acetone, methyl ethyl ketone, 1,2 dichloroethane, 3-phenoxytoluene, 1,1,1-trichloroethane, 1,1,2,2-tetrachloroethane, ethyl acetate, butyl acetate, dimethylformamide, dimethylacetamide, dimethylsulfoxide, tetrahydronaphthalene, decalin, indene, and/or mixtures thereof.

In some embodiments, the formulation as described herein is a solution.

In some embodiments, the formulation as described herein is a dispersion.

The formulation in embodiments of the present disclosure may comprise the polymer of 0.01 to 20 wt %, preferably 0.1 to 15 wt %, more preferably 0.2 to 10 wt %, and most preferably 0.25 to 5 wt %.

In some embodiments, the formulation comprises an organic resin. In some embodiments, the formulation comprises two and more organic resins. For the purposes of the present disclosure, the organic resin refers to a resin prepolymer, or a resin formed after the prepolymer is cross-linked or cured.

The organic resin suitable for the present disclosure include, but not limited to polystyrene, polyacrylate, polymethacrylate, polycarbonate, polyurethane, polyvinylpyrrolidone, polyvinyl acetate, polybutene, polyethylene glycol, polysiloxane, epoxy resin, polyvinyl alcohol, polyacrylonitrile, polyvinylidene chloride (PVDC), polystyrene-acrylonitrile (SAN), polybutylene terephthalate (PBT), polyethylene terephthalate (PET), polyvinyl butyrate (PVB), polyvinyl chloride (PVC), polyamide, polyoxymethylene, polyimide, polyetherimide, or mixtures thereof.

Further, the organic resins include, but are not limited to, those formed by homopolymerization or copolymerization of the following monomers (resin prepolymers): styrene derivatives, acrylate derivatives, acrylonitrile derivatives, acrylamide derivatives, vinyl ether derivatives, vinyl ether derivatives, maleimide derivatives, conjugated diene derivatives.

Examples of styrene derivatives include, but are not limited to alkylstyrenes, such as α-methylstyrene, o-, m-, p-methylstyrene, p-butylstyrene; especially p-tert-butylstyrene and alkoxystyrene, such as p-methoxystyrene, p-butoxystyrene, p-tert-butoxystyrene.

Examples of acrylate derivatives include, but are not limited to methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, sec-butyl acrylate, sec-butyl methacrylate, tert-butyl acrylate, tert-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, cyclohexyl acrylate, cyclohexyl methacrylate, phenyl acrylate, phenyl methacrylate, 2-methoxyethyl acrylate, 2-methoxyethyl methacrylate, 2-phenoxyethyl acrylate, 2-phenoxyethyl methacrylate, methoxydiethylene glycol acrylate, methoxydiethylene glycol methacrylate, methoxytriethylene glycol acrylate, methoxytricthylene glycol methacrylate, methoxypropylene glycol acrylate, methoxypropylene glycol methacrylate, methoxy dipropylene glycol acrylate, methoxydipropylene glycol methacrylate, isobornyl acrylate, isobornyl methacrylate, dicyclopentadiene acrylate, dicyclopentadiene methacrylate, adamantane (meth) acrylate, norbornene (meth) acrylate, 2-hydroxy-3-phenoxypropyl acrylate, 2-hydroxy-3-phenoxypropyl methacrylate, glyceryl monoacrylate, glyceryl monostearate; 2-aminoethyl acrylate, 2-aminoethyl methacrylate, 2-dimethylaminoethyl acrylate, 2-dimethylaminoethyl methacrylate, N,N-dimethylaminoethyl (meth) acrylic acid, N,N-diethylaminoethyl (meth)acrylate, 2-aminopropyl acrylate, 2-aminopropyl methacrylate, 2-dimethylaminopropyl acrylate, 2-dimethylaminopropyl methacrylate, 3-aminopropyl acrylate, 3-aminopropyl methacrylate, N, N-dimethyl-1,3-propane diamine (meth) acrylate, 3-dimethylaminopropyl acrylate, 3-dimethylaminopropyl methacrylate, glycidyl acrylate, and glycidyl methacrylate.

Examples of acrylonitrile derivatives include, but are not limited to: acrylonitrile, methacrylonitrile, α-chloroacrylonitrile, and vinylidene cyanide.

Examples of acrylamide derivatives include, but are not limited to acrylamide, methacrylamide, α-chloroacrylamide, N-2-hydroxyethyl acrylamide, and N-2-hydroxyethyl methacrylamide.

Examples of vinyl ester derivatives include, but are not limited to vinyl acetate, vinyl propionate, vinyl butyrate, and vinyl benzoate.

Examples of vinyl ether derivatives include, but are not limited to vinyl methyl ether, vinyl ethyl ether, and allyl glycidyl ether.

Examples of maleimide derivatives include, but are not limited to maleimide, benzylmaleimide, N-phenylmaleimide, and N-cyclohexylmaleimide.

Examples of conjugated diene derivatives include, but are not limited to 1,3-butadiene, isoprene, and chloroprene.

The homopolymers or copolymers can be prepared by free radical polymerization, cationic polymerization, anionic polymerization, or organometallic catalytic polymerization (for example Ziegler-Natta catalysis). The process of polymerization can be suspension polymerization, emulsion polymerization, solution polymerization, or bulk polymerization.

The average molar mass Mn (as determined by GPC) of the organic resins is generally in the range from 10 000 to 1 000 000 g/mol, preferably in the range from 20 000 to 750 000 g/mol, more preferably in the range from 30 000 to 500 000 g/mol.

In some embodiments, the organic resin is a thermosetting resin or an UV curable resin. In some embodiments, the organic resin is cured by a method that will enable roll-to-roll processing.

Thermoset resins require curing in which they undergo an irreversible process of molecular cross-linking, which makes the resin non-fusible. In some embodiments, the thermosetting resin is an epoxy resin, a phenolic resin, a vinyl resin, a melamine resin, an urea-formaldehyde resin, an unsaturated polyester resin, a polyurethane resin, an allyl resin, an acrylic resin, a polyamide resin, a polyamide-imide resin, a phenol-amide polycondensation resin, an urea-melamine polycondensation resin, or combinations thereof.

In some embodiments, the thermosetting resin is an epoxy resin. The epoxy resins are easy to cure and do not give off volatiles or generate by-products from a wide range of chemicals. Epoxy resins can also be compatible with most substrates and tend to readily wet surfaces. See also Boyle, M. A. et al., "Epoxy Resins", Composites, Vol. 21, ASM Handbook, pages 78-89 (2001).

In some embodiments, the organic resin is a silicone thermosetting resin. In some embodiments, the silicone thermosetting resin is OE6630A or OE6630B (Dow Corning Corporation (Auburn, Michigan)).

In some embodiments, a thermal initiator is used. In some embodiments, the thermal initiator is AIBN [2,2'-azobis(2-methylpropionitrile)] or benzoyl peroxide.

The UV curable resin is a polymer that will cure and rapidly harden upon exposure to light of a specific wavelength. In some embodiments, the UV curable resin is a resin having a free radical polymerization group, and a cationic polymerizable group as functional groups; the radical polymerizable group is such as (meth) acryloyloxy group, vinyloxy group, styryl group, or vinyl group. The cationically polymerizable group is, for example, epoxy group, thioepoxy group, vinyloxy group, or oxctanyl group. In some embodiments, the UV curable resin is a polyester resin, a polyether resin, a (meth)acrylic resin, an epoxy resin, a polyurethane resin, an alkyd resin, a spiroacetal resin, a polybutadiene resin, or a thiolene resin.

In some embodiments, the UV curable resin is selected from the group consisting of: polyurethane acrylate, allyloxy diacrylate, bis (acryloyloxyethyl) hydroxyisocyanurate, bis (acryloyloxyncopentyl glycol) adipate, bisphenol A diacrylate, bisphenol A dimethacrylate, 1,4-butanediol diacrylate, 1,4-butanediol dimethacrylate, 1,3-butanediol diacrylate, 1,3-butanediol dimethacrylate, diethylene glycol diacrylate, diethylene glycol dimethacrylate, dipentaerythritol hexaacrylate, dipentaerythritol monohydroxy pentacrylate, bis (trimethylolpropane) tetraacrylate, tricthylene glycol dimethacrylate, glyceryl methacrylate, 1,6-hexanediol diacrylate, neopentyl glycol dimethacrylate, neopentyl glycol hydroxypivalonate, pentaerythritol triacrylate, pentaerythritol tetraacrylate, polyethylene glycol diacrylate, polypropylene glycol diacrylate, tetraethylene glycol diacrylate, tetrabromobisphenol A diacrylate, tricthylene glycol divinyl ether, glycerol diacrylate, trimethylolpropane triacrylate, tripropylene glycol diacrylate, tris (acryloyloxyethyl) isocyanurate, triacrylate, diacrylate, propyl acrylate, and vinyl-terminated polydimethylsiloxane, vinyl-terminated diphenyl siloxane-dimethyl siloxane copolymer, vinyl-terminated polyphenyl methyl siloxane, vinyl-terminated difluoromethyl siloxane-dimethyl siloxane copolymer, vinyl-terminated diethyl siloxane-dimethyl siloxane copolymer, vinyl methyl siloxane, monomethacryloxypropyl-terminated polydimethylsiloxane, monovinyl-terminated polydimethylsiloxane, monoallyl-mono-trimethylsilyloxy-terminated polyethylene oxide, and combinations thereof.

In some embodiments, the UV curable resin is a mercapto functional compound that can be cross-linked under UV curing conditions with an isocyanate, an epoxy resin, or an unsaturated compound. In some embodiments, the mercapto functional compound is a polythiol, in some embodiments, the polythiol is selected from: pentaerythritol tetrakis(3-mercaptopropionate) (PETMP), trimethylolpropane tris(3-mercaptopropionate) (TMPMP), ethylene glycol bis(3-mercaptopropionate) (GDMP), tris [25-(3-mercapto-propionyloxy)ethyl]isocyanurate (TEMPIC), dipentaerythritol hexa (3-mercaptopropionate) (Di-PETMP), ethoxylated trimethylolpropane tri (3-mercapto-propionate) (ETM1300 and ETTMP700), polycaprolactone tetra(3-mercaptopropionate) (PCL4MP1350), pentaerythritol tetramercaptoacetate (PETMA), trimethylolpropane trimercaptoacetate (TMPMA), or ethylene glycol dimercaptoacetate (GDMA). These compounds are sold under the trade name THIOCURE® by Bruno Bock (Malsacht, Germany).

In some embodiments, the UV curable resin further comprises photoinitiators. The photoinitiator will initiate crosslinking and/or curing reactions of the photosensitive material during exposure to light. In some embodiments, the photoinitiator is a compound such as acetophenone-based, benzoin-based or thidiazolide-based that initiate the polymerisation, crosslinking and curing of monomers.

In some embodiments, the UV curable resin comprises mercapto-functional compounds and methacrylate, acrylate, isocyanate, or combinations thereof. In some embodiments, the UV curable resin comprises polythiols, methacrylates, acrylates, isocyanates, or combinations thereof.

In some embodiments, the photoinitiator is MINS-311RM (Minuta Technology Co., Ltd (Korea)).

In some embodiments, the photoinitiator is IRGACURE®127, IRGACURE®184, IRGACURE® 184D, IRGACURE®2022, IRGACURE® 2100, IRGACURE®250, IRGACURE®270, IRGACURE®2959, IRGACURE®369, IRGACURE®369EG, IRGACURE®379, IRGACURE®500, IRGACURE®651, IRGACURE® 754, IRGACURE®784, IRGACURE® 819, IRGACURE® 819DW, IRGACURE® 907, IRGACURE® 907FF. IRGACURE® OxcOl, IRGACURE® TPO-L. IRGACURE®1173, IRGACURE® 1173D, IRGACURE® 4265, IRGACURE® BP or IRGACURE® MBF (BASF Corporation (Wyandotte, Michigan)). In some embodiments, the photoinitiator is TPO (2,4,6-trimethylbenzoyl-diphenyl-oxide) or MBF (methyl benzoyl formate).

In some embodiments, the weight percentage of organic resin in the formulation is about 50% to about 99%, about 50% to about 95%, about 50% to about 90%, about 50% to about 85%, about 50% to about 80%, about 50% to about 70%, about 50% to about 60%, about 60% to about 99%, about 60% to about 95%, about 60% to about 90%, about 60% to about 85%, about 60% to about 80%, about 60% to about 70%, about 70% to about 99%, about 70% to about 95%, about 70% to about 90%, about 70% to about 85%, about 70% to about 80%, about 80% to about 99%, about 80% to about 90%, about 80% to about 85%, about 85% to about 99%, about 85% to about 95%, about 85% to about 90%, about 90% to about 99%, about 90% to about 95%, or about 95% to about 99%.

In yet another aspect, the present disclosure further provides the use of the formulation as coatings or printing inks in the preparation of organic optoelectronic devices, particularly preferably by printing or coating processing methods.

Suitable printing or coating techniques include, but are not limited to, ink-jet printing, typographic printing, screen printing, dip coating, spin coating, blade coating, roller printing, torsional roll printing, planographic printing, flexographic printing, rotary printing, spray coating, brush or pad printing, slit die coating, and so on. Preferred techniques are gravure printing, screen printing and ink-jet printing. The solution or dispersion may additionally comprise one or more components, such as surface active compounds, lubricants, wetting agents, dispersing agents, hydrophobic agents, binders, etc., which are used to adjust the viscosity and film forming properties, or to improve adhesion, etc. For more information on printing technologies and their requirements for solutions, such as solvent, concentration, and viscosity, and the like, please refer to Handbook of Print Media: Technologies and Production Methods, edited by Helmut Kipphan, ISBN 3-540-67326-1.

In yet another aspect, based on the above polymers, the present disclosure further provides the application of the polymer as described herein, i.e., application of the polymer to organic optoelectronic devices. The organic optoelectronic devices may be selected from, but not limited to, the organic light emitting diodes (OLEDs), organic photovoltaic cells (OPVs), organic light electrochemical emitting cells (OLEECs), organic field effect transistors (OFETs), organic light emitting field effect transistors, organic lasers, organic spintronic devices, organic sensors, and organic plasmon emitting diodes, preferably OLEDs. In embodiments of the present disclosure, the organic compound is preferably used in the light-emitting layer of the OLED device.

In some embodiments, the polymer is used in the light emitting layer of the OLED device. In yet another aspect, the present disclosure further provides an organic optoelectronic device, comprising at least one polymer as described above. Generally, such organic optoelectronic devices comprise at least a cathode, an anode and a functional layer disposed between the cathode and the anode, wherein the functional layer comprises at least one polymer as described above. The organic optoelectronic device may be selected from, but not limited to, organic light emitting diodes (OLEDs), organic photovoltaic cells (OPVs), organic light emitting cells (OLEECs), organic field effect transistors (OFETs), organic light emitting field effect transistors, organic lasers, organic spintronic devices, organic sensors, organic plasmon emitting diodes, or color conversion devices.

The color conversion device may be a down-conversion color converter for preparing color displays in which blue light is converted into green and red light.

In some embodiments, the organic optoelectronic device is an OLED, which comprises a substrate, an anode, at least one light emitting layer, and a cathode.

The substrate should be opaque or transparent. A transparent substrate could be used to produce a transparent light emitting device (for example: Bulovic et al., Nature 1996, 380, p 29, and Gu et al., Appl. Phys. Lett. 1996, 68, p 2606). Substrates may be either rigid or elastic. Preferably, the substrates should have a smooth surface. A substrate free of surface defects is particularly desirable. In some embodiments, the substrates are flexible and can be selected from a polymer film or plastic with a glass transition temperature Tg over 150° C., preferably over 200° C., more preferably over 250° C., and most preferably over 300° C. Examples of the suitable flexible substrates include poly(ethylene terephthalate) (PET) and polyethylene glycol (2,6-naphthalene) (PEN).

The choice of anodes may include a conductive metal, a metal oxide, or a conductive polymer. The anode should be able to easily inject holes into a hole-injection layer (HIL), a hole-transport layer (HTL), or a light emitting layer. In some embodiments, the absolute value of the difference between the work function of the anode and the HOMO energy level of the emitter of the emitting layer, or the HOMO energy level/valence band energy level of the p-type semiconductor material for the hole injection layer (HIL)/hole transport layer (HTL)/electron blocking layer (EBL) is less than 0.5 eV, preferably less than 0.3 eV, more preferably less than 0.2 eV. Examples of anode materials may include, but not limited to: Al, Cu, Au, Ag, Mg, Fe, Co, Ni, Mn, Pd, Pt, ITO, aluminum-doped zinc oxide (AZO), and the like. Other suitable anode materials are known and can be readily selected for use by one of ordinary skill in the art. The anode material can be deposited using any suitable technique, such as a suitable physical vapor deposition method, including RF magnetron sputtering, vacuum thermal evaporation, e-beam, etc. In some embodiments, the anode is patterned. Patterned conductive ITO substrates are commercially available and can be used to produce the devices as described herein.

The choice of cathode may include a conductive metal and a metal oxide. The cathode should be able to easily inject electrons into the EIL, the ETL, or the directly into the emitting layer. In some embodiments, the absolute value of the difference between the work function of the cathode and the LUMO energy level of the emitter of the emitting layer, or the LUMO energy level/conduction band energy level of the n-type semiconductor material for electron injection layer (EIL)/electron transport layer (ETL)/hole blocking layer (HBL) is less than 0.5 eV, preferably less than 0.3 cV, most preferably less than 0.2 eV. In principle, all materials that may be used as cathodes for OLEDs are possible to apply as cathode materials for the present disclosure. Examples of cathode materials include, but not limited to: Al, Au, Ag, Ca, Ba, Mg. LiF/Al, MgAg alloys, $BaF_2$/Al, Cu, Fe, Co, Ni, Mn, Pd, Pt, ITO, and the like. The cathode material can be deposited using any suitable technique, such as the suitable physical vapor deposition method, including RF magnetron sputtering, vacuum thermal evaporation, e-beam, and the like.

The OLED device may also comprises other functional layers, such as a hole injection layer (HIL), a hole transport layer (HTL), an electron blocking layer (EBL), an electron injection layer (EIL), an electron transport layer (ETL), and a hole blocking layer (HBL). Materials suitable for use in these functional layers are described in details above and in WO2010135519 A1, US20090134784 A1 and WO201110277A1, the entire contents of the these three documents are hereby incorporated herein for reference.

In some embodiments, the light emitting device as described herein has a light-emitting layer prepared by printing the formulation of the present disclosure.

The light-emitting device as described herein has a light-emitting wavelength between 300 and 1000 nm, preferably between 350 and 900 nm, more preferably between 400 and 800 nm.

In yet another aspect, the present disclosure further provides the application of organic optoelectronic devices as described herein in various electronic devices, including but not limited to, display devices, lighting devices, light sources, sensors, and the like.

In yet another aspect, the present disclosure further provides electronic devices comprising organic optoelectronic devices as described herein, including, but not limited to, display devices, lighting devices, light sources, sensors, and the like.

The present disclosure will be described below in conjunction with the preferred embodiments, but the present disclosure is not limited to the following embodiments. It should be understood that the scope of the present disclosure is covered by the scope of the claims of the present disclosure, and those skilled in the art should understand that certain changes may be made to the embodiments of the present disclosure.

Specific Embodiment

1. Synthesis of Monomers

E1

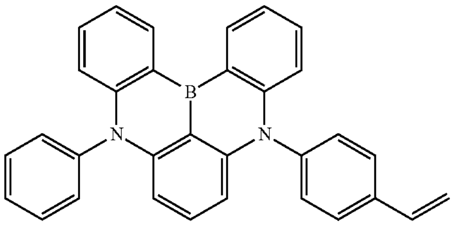

E2

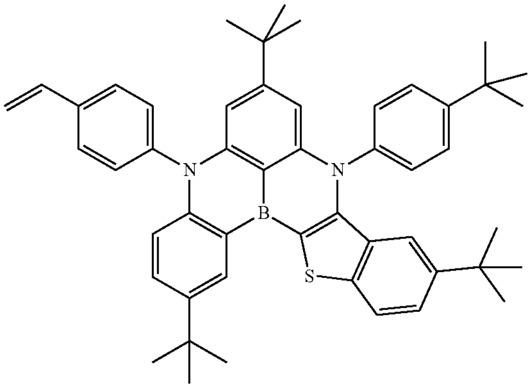

E3

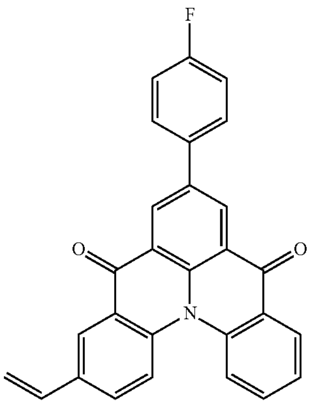

E4

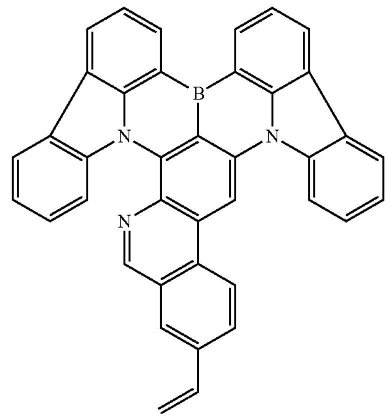

-continued

E5

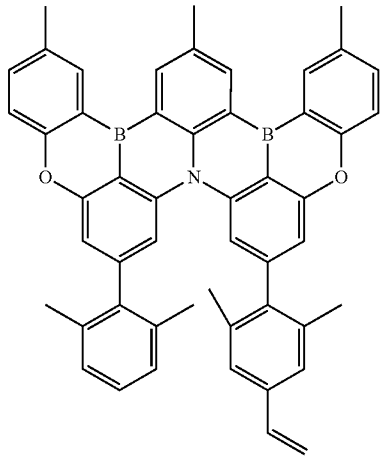

F1

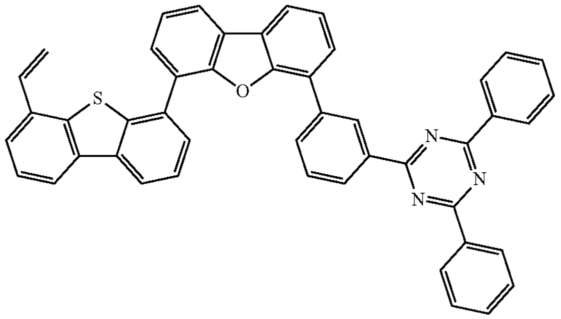

F2

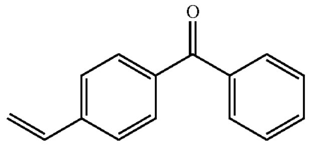

F3

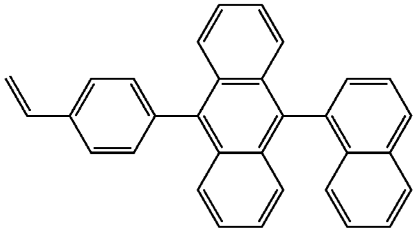

F4

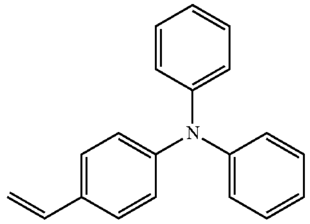

F5

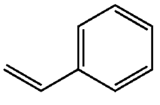

(1) Synthesis of Monomer E1

The synthetic route is shown as follows:

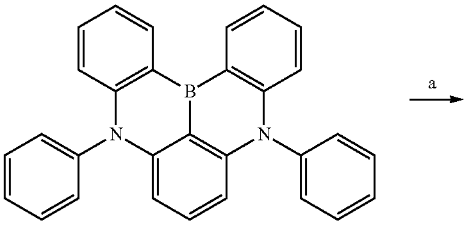

1-a

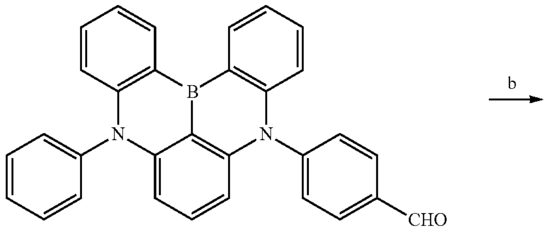

2-a

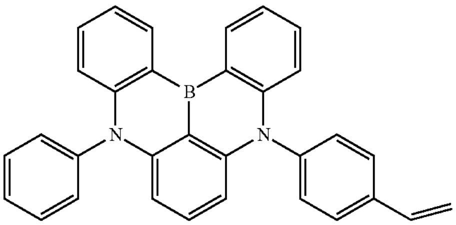

E1

The synthesis steps are as follows:

a. 10 mmol of compound 1-a was dissolved in 250 ml of dry DMF solution under nitrogen atmosphere protection. The resulting reaction solution was placed in an ice bath to be stirred. 11.0 mmol of phosphorus trichlorooxide (POCI3) solution was added dropwise. After the drop addition was completed, the mixture was left to react for 30 mins, then gradually heated to room temperature and continue reacting for 2 h. The reaction was then quenched by adding water, extracted with dichloromethane, and washed with water. The organic phase was then collected, dried with anhydrous sodium sulfate, filtered, and evaporated to get rid of solvent and obtain the crude product of compound 2-a. The crude product was then recrystallized with dichloromethane and n-hexane (7.5 mmol, yield: 75.0%) and further vacuum-dried for use. MS (ASAP)=448.2.

b. The above obtained 5.0 mmol compound 2-a was dissolve in 200 ml of dry tetrahydrofuran (THF) solution under nitrogen atmosphere protection. The reaction solution was stirred at −78° C., before 8.0 mmol of methylene triphenylphosphine (Wittig's reagent) was added dropwise. After the addition was completed, the reaction mixture was gradually heated to room temperature and continued to be stirred overnight at room temperature. The reaction was quenched by adding water, and the reaction solution was extracted with dichloromethane, the organic phase was washed with water before combined and dried with anhydrous sodium sulfate, filtered, evaporated to get rid of the solvent. The resulting product was purified via slica column chromatography, with a eluent of trichloromethane:petroleum ether=1:2. Finally, 3.85 mmol of monomer E1 was obtained (yield: 75.0%) and further vacuum-dried for use. MS (ASAP)=446.2.

(2) Synthesis of Monomer E2

The synthetic route is shown as follows:

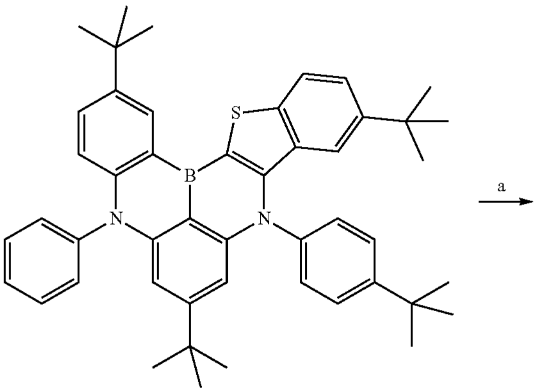

1-b

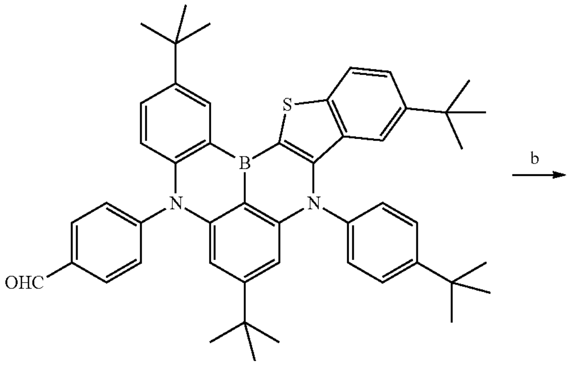

2-b

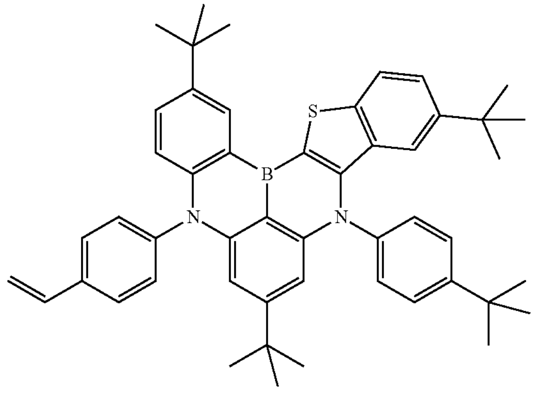

E2

The synthesis steps are as follows:

a. The synthetic method was similar to that of monomer E1. yield: 74.8%. Vacuum-dried for use. MS (ASAP)=728.4.

b. The synthetic method was similar to that of monomer E1, yield: 78.9%. Vacuum-dried for use. MS (ASAP)=726.4.

(3) Synthesis of Monomer E3.

The synthetic route is shown as follows:

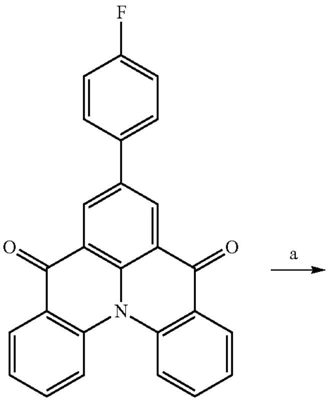

1-c

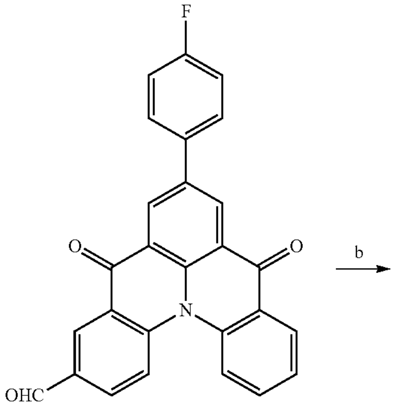

2-c

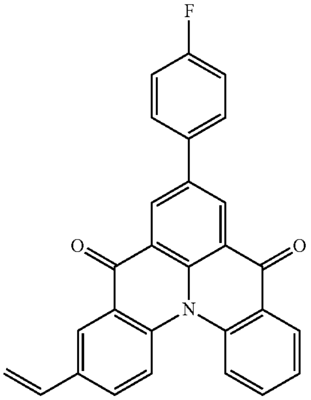

E3

The synthesis steps are as follows:

a. The synthetic method was similar to that of monomer E1. yield: 76.7%. Vacuum-dried for use. MS (ASAP)=417.1.

b. The synthetic method was similar to that of monomer E1, yield: 79.5%. Vacuum-dried for use. MS (ASAP)=417.1.

(4) Synthesis of Monomer E4.

The synthetic route is shown as follows:

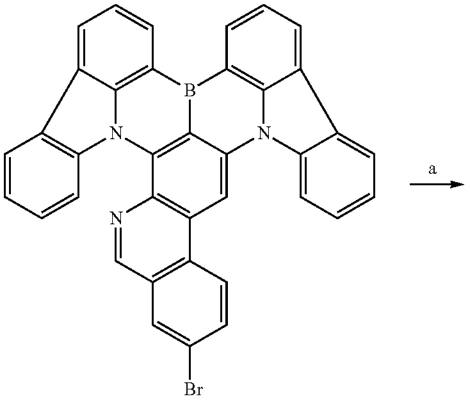

1-d

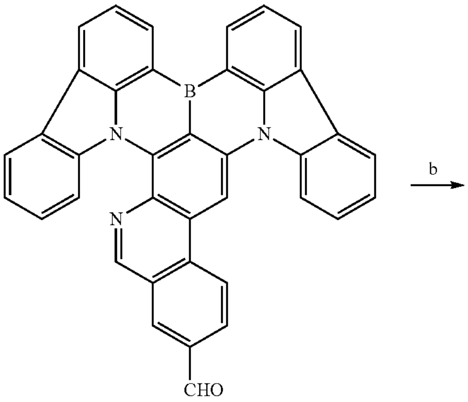

2-d

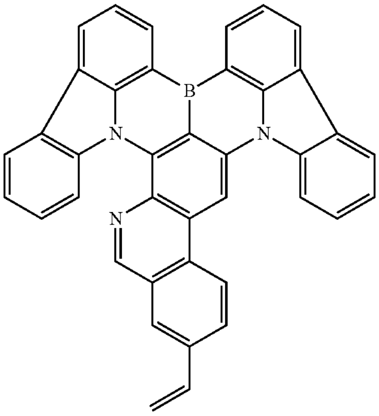

E4

The synthesis steps are as follows:

a. 10 mmol of compound 1-d was dissolved in 250 ml of dry THE solution under nitrogen atmosphere protection. The resulting reaction solution was placed in an ice bath to be stirred. 11.0 mmol of n-butyllithium (n-BuLi) solution was added dropwise, after the dropwise addition was completed, the mixture was left to react for 30 mins before 11.0 mmol of DMF solvent was added dropwise. After that, the reaction mixture was gradually heated to room temperature and continued to react for another 2 h. The reaction was quenched by adding water, extracted with dichloromethane, and washed with water. The organic phases were collected and combined, dried with anhydrous sodium sulfate, filtered, and evaporated to obtain the crude product of compound 2-d. The crude product was recrystallized with dichloromethane and n-hexane (7.55 mmol, yield: 75.5%) before vacuum-dried for use. MS (ASAP)=545.2.

b. The synthetic method was similar to that of monomer E1, yield: 88.4%. Vacuum-dried for use. MS (ASAP)=543.2.

(5) Synthesis of Monomer E5.

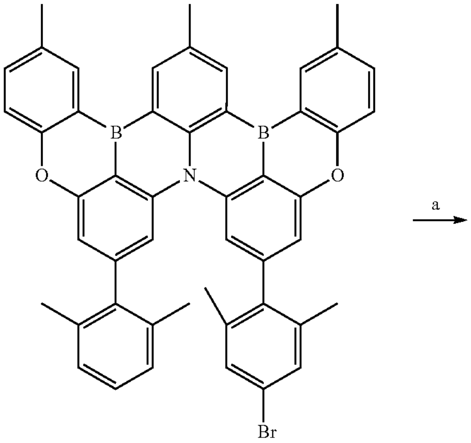

1-e

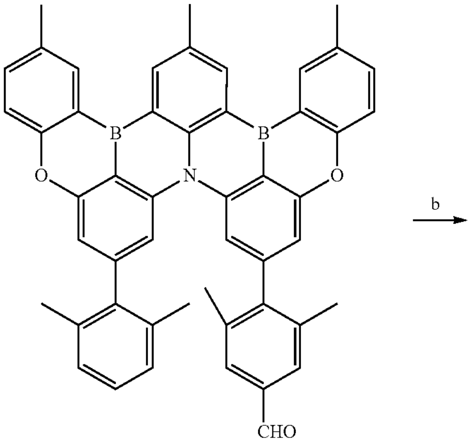

2-e

-continued

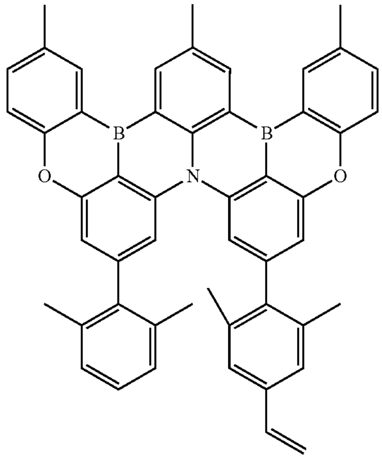

E5

The synthesis steps are as follows.

a. The synthetic method was similar to that of monomer E4, yield: 74.7%. Vacuum-dried for use. MS (ASAP)=723.3.

b. The synthetic method was similar to that of monomer E1, yield: 81.4%. Vacuum-dried for use. MS (ASAP)=721.3.

(6) Synthesis of Monomer F1.

The synthetic route is shown as follows:

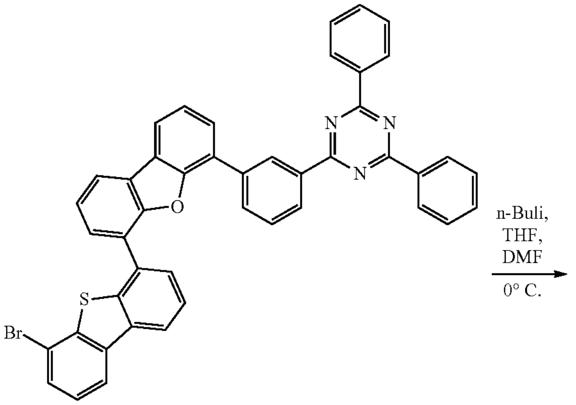

1-f

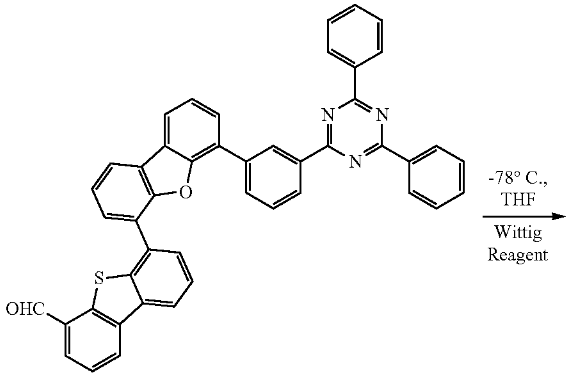

2-f

-continued

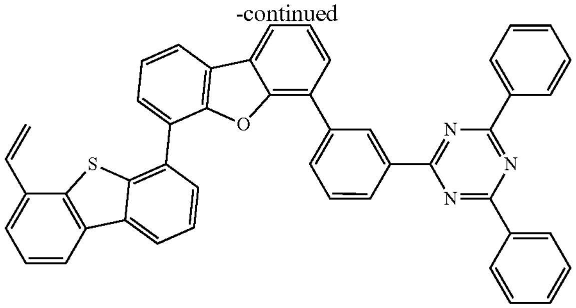

F1

The synthesis steps are as follows:

a. 10 mmol of compound 1-f was dissolved in 250 ml of dry THE solution under nitrogen atmosphere protection. The resulting reaction solution was placed in an ice bath to be stirred. 11.0 mmol of n-butyllithium (n-BuLi) solution was added dropwise. After the drop addition was completed, the mixture was left to react for 30 mins before 11.0 mmol of DMF solvent was added dropwise. After that, the reaction mixture was gradually heated to room temperature and reacted for 2 h. The reaction was quenched by adding water, and extracted with dichloromethane. The organic phase was washed with water, collected and combined, dried with anhydrous sodium sulfate, filtered, and evaporated to obtain the crude product of compound 2-f. The crude product was recrystallized with dichloromethane and n-hexane to obtain 7.8 mmol of product (yield: 78.0%) and further vacuum-dried for use. MS (ASAP)=685.2.

b. The above obtained 5.0 mmol of compound 2-f was dissolved in 200 ml of dry tetrahydrofuran (THF) solution under nitrogen atmosphere protection. The reaction solution was stirred at −78° C. 8.0 mmol of methylenetriphenylphosphine (Wittig's reagent) was added dropwise, then gradually heated to room temperature and continued to be stirred overnight at room temperature. The reaction was quenched by adding water, and the reaction solution was extracted with dichloromethane, the organic phase was washed with water, collected and combined, and dried with anhydrous sodium sulfate, filtered, and evaporated to get rid of the solvent. The resulting product was purified via slica column chromatography with a eluent of dichloromethane:petroleum ether=1:4. Finally, 4.4 mmol of monomer E1 was obtained (yield: 88.0%) and dried in a vacuum environment for use. MS (ASAP)=683.2.

(7) Synthesis of Monomer F2.

The synthetic route is shown as follows:

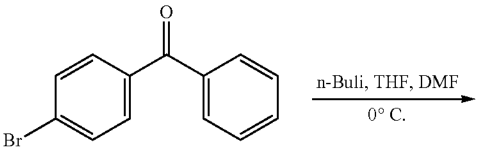

1-g

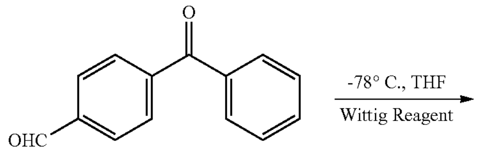

2-g

-continued

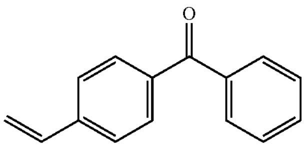

F2

The synthetic steps are as follows:

a. The synthetic method was similar to that of monomer F1, yield: 61.4%. Vacuum-dried for use. MS (ASAP)=210.1.

b. The synthetic method was similar to that of monomer F1, yield: 45.8%. Vacuum-dried for use. MS (ASAP)=208.1.

(8) Synthesis of Monomer F3.

The synthetic route is shown as follows:

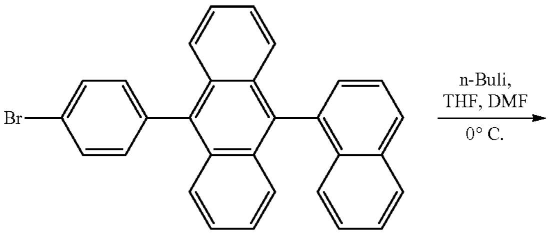

1-h

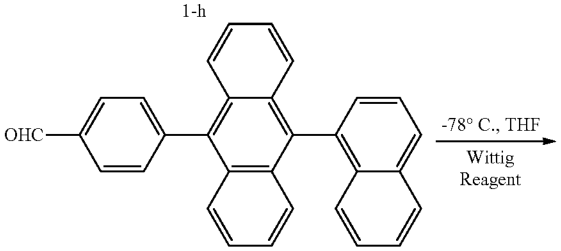

2-h

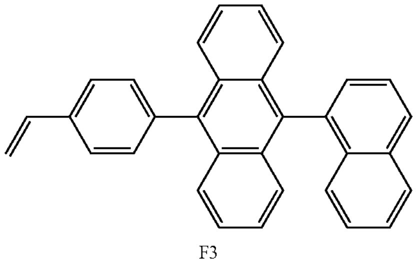

F3

The synthesis steps are as follows:

a. The synthetic method was similar to that of monomer F1, yield: 60.5%. Vacuum-dried for use. MS (ASAP)=408.1.

b. The synthetic method was similar to that of monomer F1, yield: 67.4%. Vacuum-dried for use. MS (ASAP)=406.2.

(9) Synthesis of Monomer F4.

The synthetic experimental route is shown as follows:

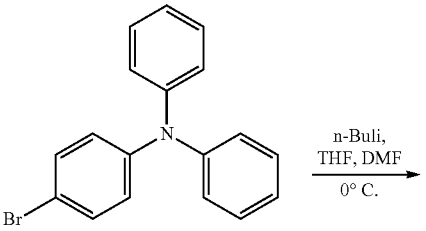

1-i

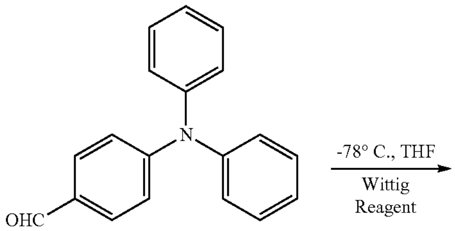

2-i

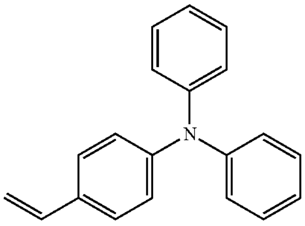

F4

The synthesis steps are as follows:

a. The synthetic method was similar to that of monomer F1, yield: 68.1%. Vacuum-dried for use. MS (ASAP)=273.1.

b. The synthetic method was similar to that of monomer F1, yield: 78.4%. Vacuum-dried for use. MS (ASAP)=271.2.

2. Synthesis of Polymer

For the synthesis of polymers, the main synthesis steps are as follows: Taking the synthesis of P1 polymer as an example, 0.10 mmol E1, 0.40 mmol F1 and 0.5 mol of F5 monomer were dissolved in benzene solvent under nitrogen protection, while 0.01 mmol 2,2-azobisisobutyronitrile (AIBN initiator) was added by syringe, sealed, and left to react at 60° C. for 4 h. When the reaction was completed, the mixture was cooled to room temperature and the polymer is precipitated with methanol. The precipitate was dissolved with tetrahydrofuran (THF) and then re-precipitated with methanol. The above procedure was repeated for 3 to 5 times and the final precipitate was dried under vacuum to obtain the solid of polymer P1.

The synthesis of P2 to P13 are similar to P1, except that they contains different proportions of vinyl monomers. The monomers included and the proportions in P2 to P13 are shown as follows:

| polymer | E1 | E2 | E3 | E4 | E5 | F1 | F2 | F3 | F4 | F5 |
|---|---|---|---|---|---|---|---|---|---|---|
| P1 | 10 | | | | | | | 40 | | 50 |
| P2 | | 10 | | | | | | 40 | | 50 |
| P3 | | | 10 | | | | | 40 | | 50 |
| P4 | | | | 10 | | | | 40 | | 50 |

-continued

| polymer | E1 | E2 | E3 | E4 | E5 | F1 | F2 | F3 | F4 | F5 |
|---|---|---|---|---|---|---|---|---|---|---|
| P5 | | | | | 10 | | | 40 | | 50 |
| P6 | | | | 10 | | 40 | | | | 50 |
| P7 | | | | | 10 | 40 | | | | 50 |
| P8 | 10 | | | | | | | 40 | 15 | 35 |
| P9 | | | | 10 | | 40 | | | 15 | 35 |
| P10 | | | | 10 | | 40 | 15 | | 10 | 35 |
| P11 | | | | | 10 | 40 | 10 | | 10 | 30 |
| P10 | 15 | | | | | | | | | 30 |
| P11 | | 15 | | | | | | | | 85 |
| P12 | | | | 15 | | | | | | 85 |
| P13 | | | | | 15 | | | | | 85 |

3. OLED Device Preparation and Measurement

The preparation process of an OLED device using the above-mentioned polymers is described in details in the following specific examples, which have the following structure: ITO/HIL/HTL/EML/ETL/cathode, and the preparation steps are as follows.

a. Cleaning of the ITO (indium tin oxide)-coated conductive glass substrate: ITO (indium tin oxide) conductive glass substrate was cleaned by using various solvents (e.g. one or more of chloroform, acetone or isopropanol), followed by UV-ozone treatment.

b. HIL (hole injection layer, 60 nm): 60 nm of PEDOT (Poly (3,4-ethylenedioxythiophene), Clevios™ AI4083) as HIL was prepared by spin coating in a clean room and heated on a heating plate at 180° C. for 10 mins.

c. HTL (hole transport layer, 20 nm): 20 nm of TFB was prepared by spin coating in the nitrogen glove box, and the solution used was a toluene solvent solution of TFB with a concentration of 5 mg/ml, followed by thermal treatment on a heating plate at 180° C. for 60 mins.

Among them, TFB (H.W. SandsCorp.) is a hole transport material was used for HTL with the following structural formula:

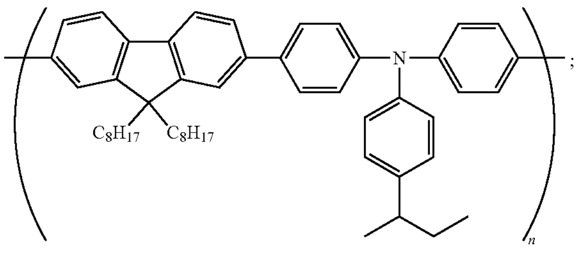

"TFB"

d. EML (organic light-emitting layer): EML was prepared by spin coating in the nitrogen glove box, the solution used was a toluene solution of polymers (P1-P9) of 10 mg/ml. Then, the device was placed on a heating plate and heated at 180° C. for 10 mins. Table II lists the components and thickness of the EML of the device.

TABLE II

| Device | HTL | EML | color | V @1 knits [V] | efficiency@ 1 knits [Cd/A] |
|---|---|---|---|---|---|
| OLED1 | TFB | P1(65 nm) | blue | 6.5 | 5.5 |
| OLED2 | TFB | P2(65 nm) | blue | 6.3 | 6.1 |
| OLED3 | TFB | P3(80 nm) | blue | 7.1 | 6.2 |
| OLED4 | TFB | P4(80 nm) | green | 4.5 | 62 |
| OLED5 | TFB | P5(80 nm) | green | 4.8 | 58 |
| OLED6 | TFB | P6(65 nm) | green | 7.0 | 41 |
| OLED7 | TFB | P7(65 nm) | green | 6.6 | 45 |
| OLED8 | TFB | P8(65 nm) | blue | 6.7 | 6.7 |
| OLED9 | TFB | P9(80 nm) | green | 6.4 | 56 |

e. Cathode: Ba/Al (2 nm/100 nm) was prepared by thermal vaporation deposition in high vacuum ($1\times10^{-6}$ mbar).

f. Encapsulation: The devices were encapsulated with UV-curable resin in a nitrogen glove box.

The current, voltage and luminescence (IVL) features of each OLED device were characterized by equipment, and important parameters such as efficiency, lifetime and drive voltage were recorded. The performance of OLED devices is summarized in Table II, and the FWHMs of the emission spectras of all OLEDs are all less than 40 nm.

4. Preparation of Color Conversion Films

The polymers (P10-P13) were dissolved in toluene solvent to form a solution of 20 mg/ml, and a film of 100-300 nm was prepared by spin coating on the substrate in a nitrogen glove box, followed by thermal treatment on a heating plate at 180° C. for 10 mins. The resulting films can be used as color conversion medium, wherein P10, P11 are blue light, P12 and P13 are green light, and the FWHMs of the emission spectrums are all less than 40 nm.

The technical features of the above-described embodiments can be combined in any ways. For the sake of brevity, not all possible combinations of the technical features of the above-described embodiments have been described. However, as long as there are no contradictions in the combination of these technical features, they should be considered to be within the scope of this specification.

What described above are several embodiments of the present disclosure, and they are specific and in details, but not intended to limit the scope of the present disclosure. It will be understood and improvements can be made without departing from the concept of the present disclosure, and all these modifications and improvements are within the scope of the present disclosure. The scope of the present disclosure shall be subject to the appended claims.

What is claimed is:

1. A polymer, comprising a repeating unit of formula I:

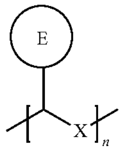

I wherein n is an integer greater than or equal to 1, X is selected from O, S, $CR^1R^2$, $SiR^1R^2$, or $NR^3$, and a repeating structural unit E is selected from a structural unit of formula (1) or (2):

(1)

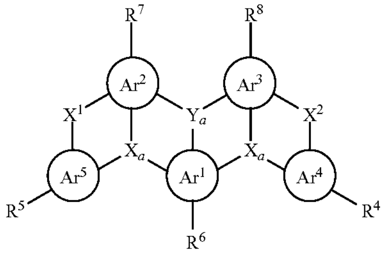

(2)

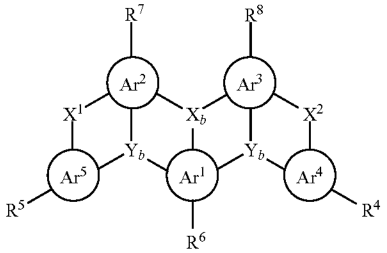

wherein:

each of $Ar^1$, $Ar^2$, and $Ar^3$ is independently an aromatic group containing 5 to 24 ring atoms, or a heteroaromatic group containing 5 to 24 ring atoms;

each of $Ar^4$ and $Ar^5$ is independently null, an aromatic group containing 5 to 24 ring atoms, or a heteroaromatic group containing 5 to 24 ring atoms;

each of $Y_a$ and $Y_b$ is independently B, P═O, C($R^9$), or Si($R^9$);

when neither $Ar^4$ nor $Ar^5$ is null, each of $X_a$ and $X_b$ is independently selected from the group consisting of N, C($R^9$), and Si($R^9$);

when $Ar^4$ and/or $Ar^5$ is null, each of the corresponding $X_a$ and $Y_b$ is independently selected from the group consisting of N($R^9$), C($R^9R^{10}$), Si($R^9R^{10}$), C═O, O, C═N($R^9$), C═C($R^9R^{10}$), P($R^9$), P(═O)$R^9$, S, S═O, and $SO_2$;

each of $X^1$ and $X^2$ is independently null or a bridging group;

$R^1$ to $R^{10}$ are independently selected from the group consisting of —H, -D, —F, —$C_1$, —Br, —I, —CN, —$NO_2$, —$CF_3$, a $C_1$-$C_{20}$ linear alkyl group, a $C_1$-$C_{20}$ linear haloalkyl group, a $C_1$-$C_{20}$ linear alkoxy group, a $C_1$-$C_{20}$ linear thioalkoxy group, a $C_3$-$C_{20}$ branched/cyclic alkyl group, a $C_3$-$C_{20}$ branched/cyclic haloalkyl group, a $C_3$-$C_{20}$ branched/cyclic alkoxy group, a $C_3$-$C_{20}$ branched/cyclic thioalkoxy group, a $C_3$-$C_{20}$ branched/cyclic silyl group, a $C_1$-$C_{20}$ ketone group, a $C_2$-$C_{20}$ alkoxycarbonyl group, a $C_7$-$C_{20}$ aryloxycarbonyl group, a cyano group, a carbamoyl group, a haloformyl group, a formyl group, an isocyano group, an isocyanate group, a thiocyanate group, an isothiocyanate group, a hydroxyl group, a nitro group, a $CF_3$ group, Cl, Br, F, a crosslinkable group, a substituted/unsubstituted aromatic/heteroaromatic group containing 5 to 40 ring atoms, an aryloxy/heteroaryloxy group containing 5 to 40 ring atoms, an arylamine/heteroarylamine group containing 5 to 40 ring atoms, and a disubstituted unit in any position of the above substituents or any combination thereof, wherein one or more of the substituent groups can form a monocyclic or polycyclic aliphatic or aromatic ring system with each other and/or with the ring bonded to the groups.

2. The polymer of claim 1, wherein the repeating structural unit E comprises a structural unit of formula (1a) or (2a):

(1a)

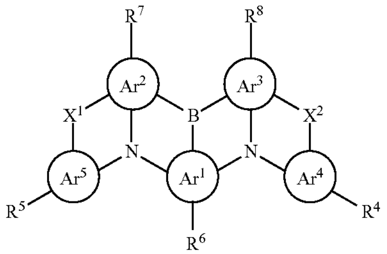

(2a)

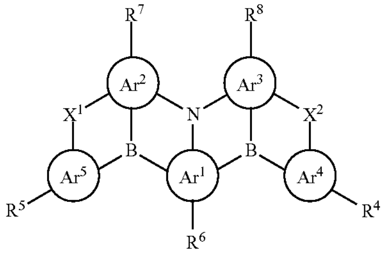

3. The polymer of claim 1, wherein the repeating structural unit E comprises a structural unit represented by one of the formulas (1b)-(1e), (2b)-(2e):

(1b)

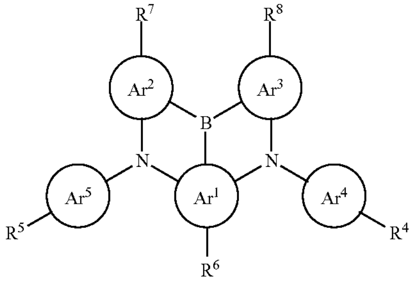

(2b)

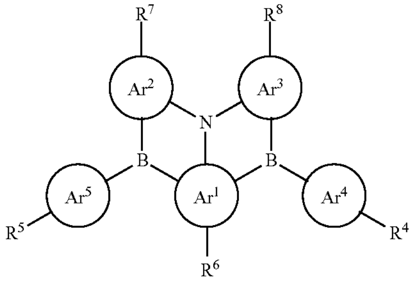

(1c)

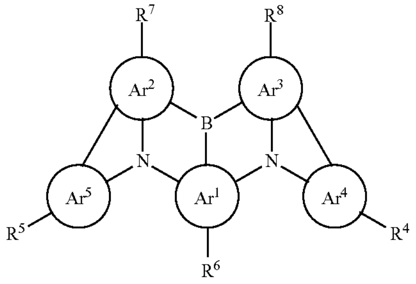

-continued
(2c)
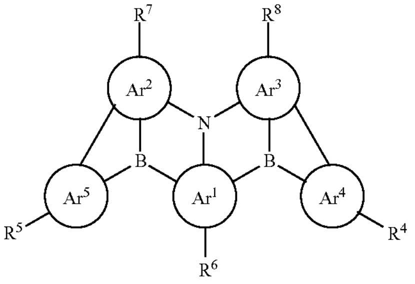
(1d)
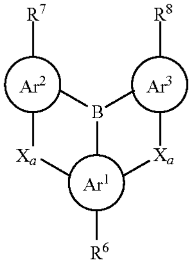
(2d)
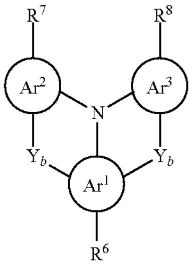
(1e)
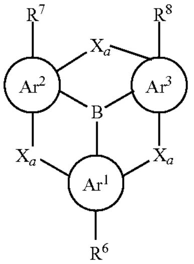
(2e)
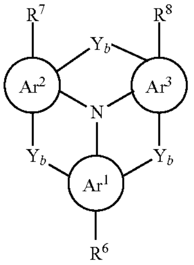
4. The polymer of claim 1, wherein each of $Ar^1$, $Ar^2$, $Ar^3$, $Ar^4$, and $Ar^5$ in the formula (1) or (2) is independently selected from one of the following structural formulas or any combination thereof:
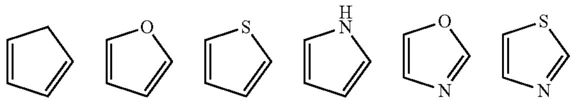
-continued
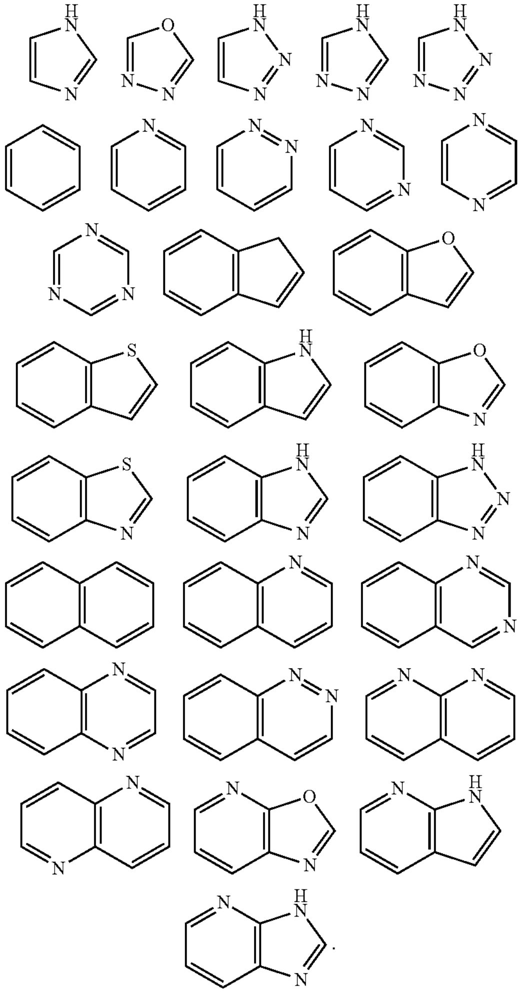
5. The polymer of claim 1, wherein the repeating structural unit E is selected from the following structural units
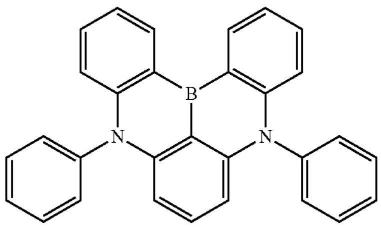
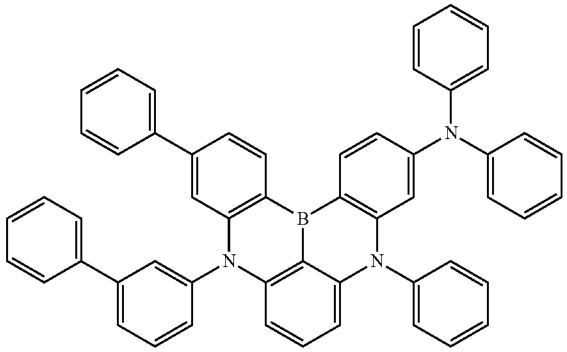

-continued
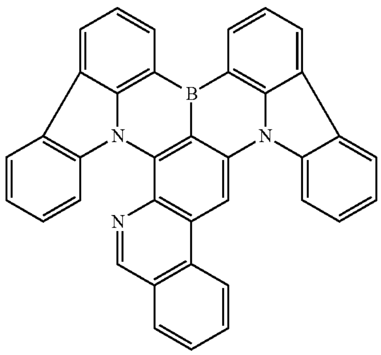
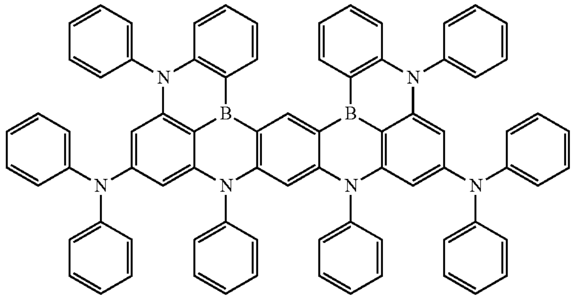
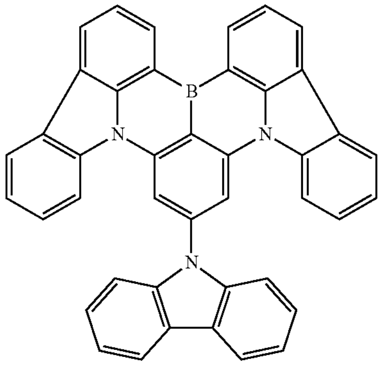
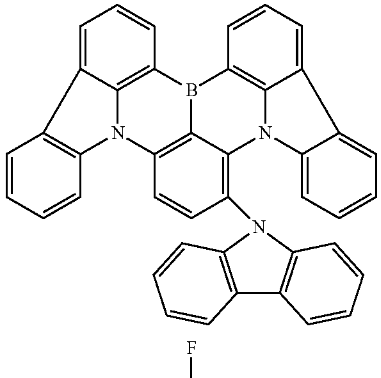
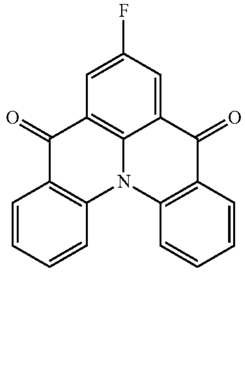
-continued
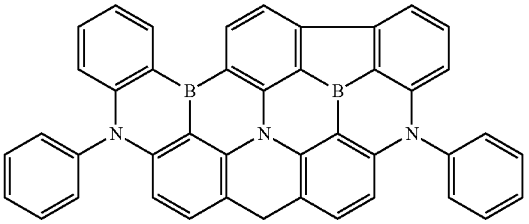
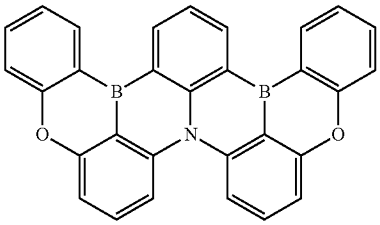
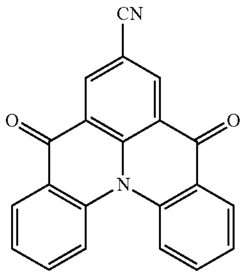
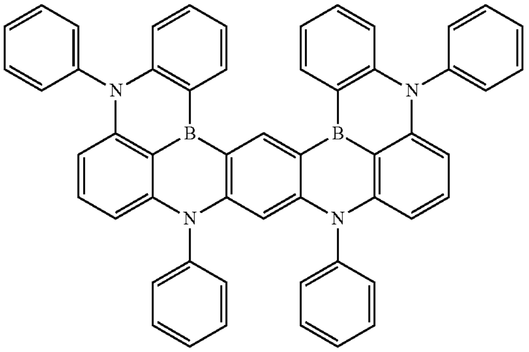
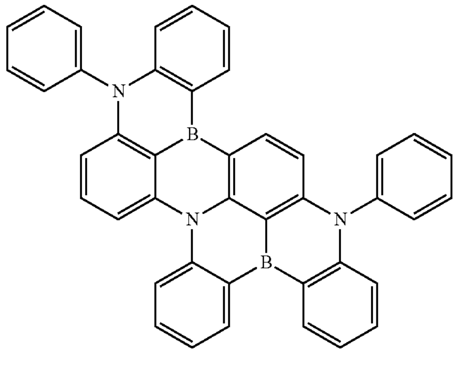
6. The polymer of claim 1, wherein the polymer has the following formula (II):

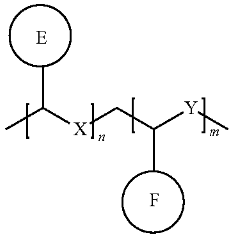

(II)

wherein F is another organic functional group, n and m are integers greater than or equal to 1, the another organic functional group is selected from the group comprising the following functions: hole injection, hole transporting, hole blocking, electron injection, electron transsporting, electron blocking, organic host, singlet luminescence, triplet luminescence.

7. The polymer of claim 1, wherein the FWHM of the emission spectrum of the polymer is ≤45 nm.

8. A mixture, comprising a polymer according to claim 1, and at least one other organic functional material, wherein the at least one other organic functional material is selected from a hole-injection material, a hole-transport material, a hole-blocking material, an electron-injection material, an electron-transport material, an electron-blocking material, an organic host material, a singlet emitter, or a triplet emitter.

9. A formulation, comprising a polymer according to claim 1, at least one organic solvent and/or an organic resin.

* * * * *